United States Patent [19]
Nakagawa et al.

[11] Patent Number: 5,294,825
[45] Date of Patent: * Mar. 15, 1994

[54] HIGH BREAKDOWN VOLTAGE SEMICONDUCTOR DEVICE

[75] Inventors: Akio Nakagawa, Hiratsuka; Norio Yasuhara, Yokohama, both of Japan

[73] Assignee: Kabushiki Kaisha Toshiba, Kawasaki, Japan

[*] Notice: The portion of the term of this patent subsequent to Dec. 10, 1991 has been disclaimed.

[21] Appl. No.: 753,433

[22] Filed: Aug. 30, 1991

Related U.S. Application Data

[63] Continuation-in-part of Ser. No. 397,874, Aug. 24, 1989, abandoned, which is a continuation-in-part of Ser. No. 236,746, Aug. 26, 1988, abandoned, which is a continuation-in-part of Ser. No. 161,102, Feb. 26, 1988, abandoned.

[30] Foreign Application Priority Data

| | | | |
|---|---|---|---|
| Feb. 26, 1987 | [JP] | Japan | 62-43564 |
| Jul. 29, 1987 | [JP] | Japan | 62-189420 |
| Jul. 4, 1988 | [JP] | Japan | 63-166403 |
| Jan. 31, 1991 | [JP] | Japan | 3-31720 |
| Mar. 28, 1991 | [JP] | Japan | 3-90068 |

[51] Int. Cl.$^5$ .................................. H01L 29/74
[52] U.S. Cl. .................................. 257/487; 257/492; 257/493; 257/500
[58] Field of Search ............... 357/38, 20, 49; 257/500, 487, 492, 493, 500; 437/247, 62

[56] References Cited
U.S. PATENT DOCUMENTS

| | | | |
|---|---|---|---|
| 4,371,886 | 2/1983 | Hartman | 357/38 |
| 4,807,012 | 2/1989 | Beasom | 357/49 |
| 5,072,287 | 12/1991 | Nakagawa et al. | 257/700 |

*Primary Examiner*—William Mintel
*Assistant Examiner*—Roy Potter
*Attorney, Agent, or Firm*—Oblon, Spivak, McClelland, Maier & Neustadt

[57] ABSTRACT

A high breakdown voltage semiconductor device is disclosed which comprises a semiconductor substrate, an insulating layer formed on the semiconductor substrate, a first semiconductor region formed on the first insulating layer and isolated at its side by an isolating region, a second semiconductor region of a first conductivity type formed in a surface portion of the first semiconductor region and having a higher impurity concentration than that of the first semiconductor region, a third semiconductor region of a second conductivity type formed in the surface region of the first semiconductor region such that it is located between the second semiconductor region and the isolating region in a manner to be spaced apart from the second semiconductor region, the third semiconductor region having a higher impurity concentration than that of the first semiconductor region.

35 Claims, 50 Drawing Sheets

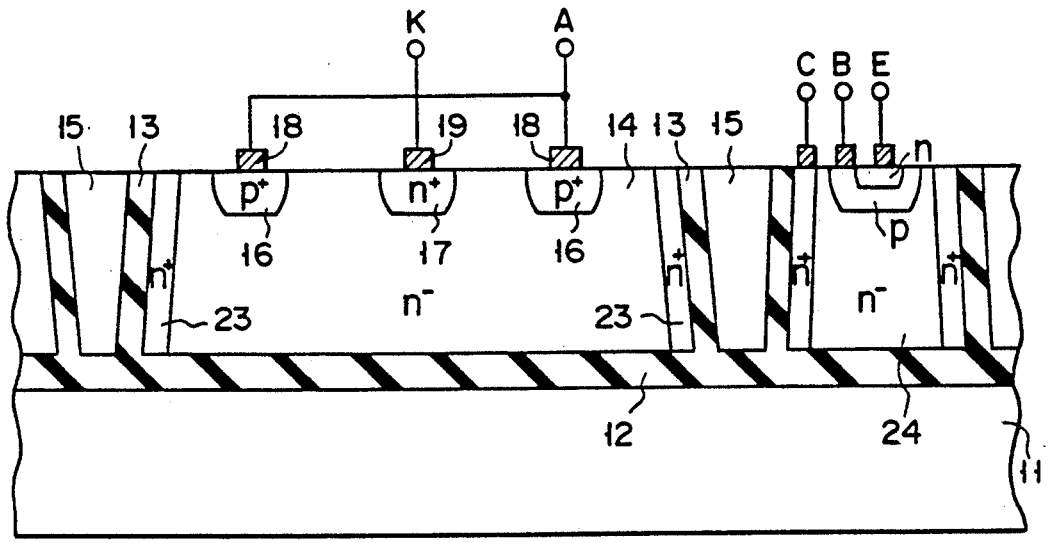
F I G. 9
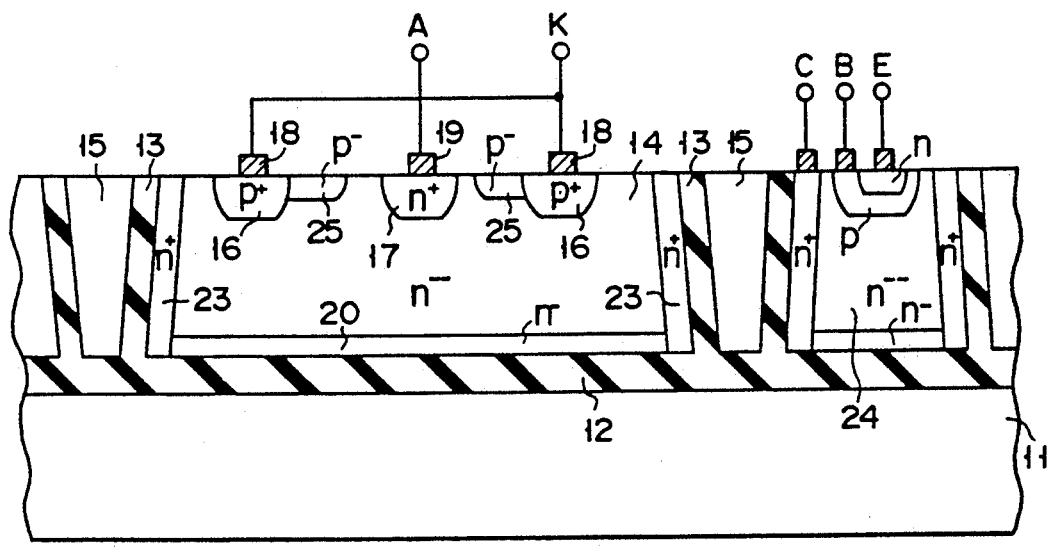
F I G. 10

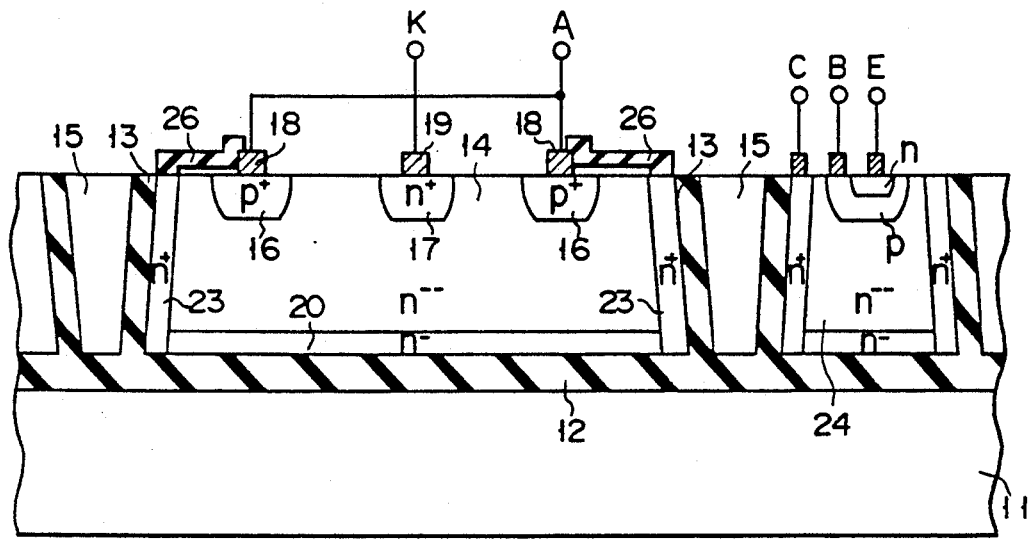
F I G. 13
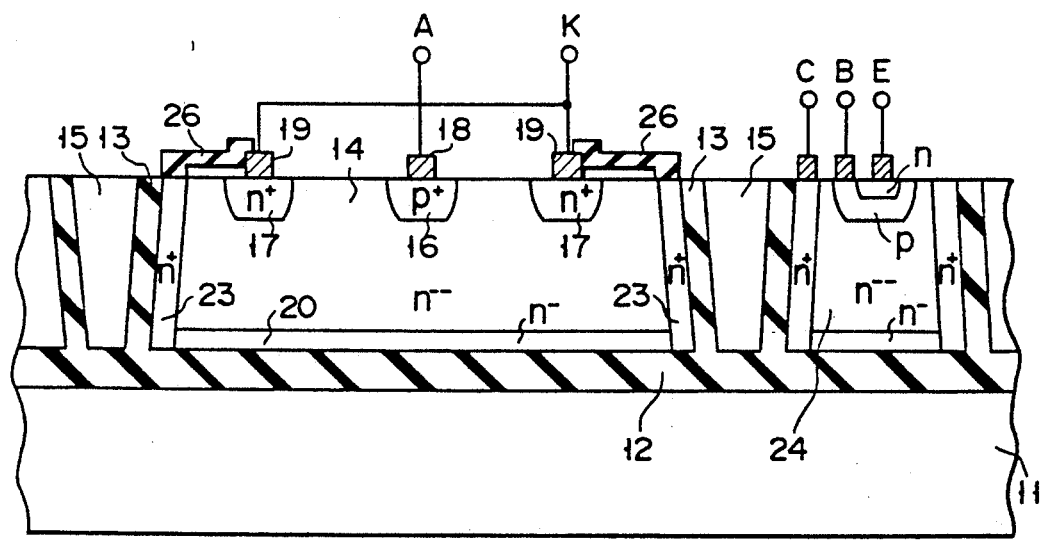
F I G. 14

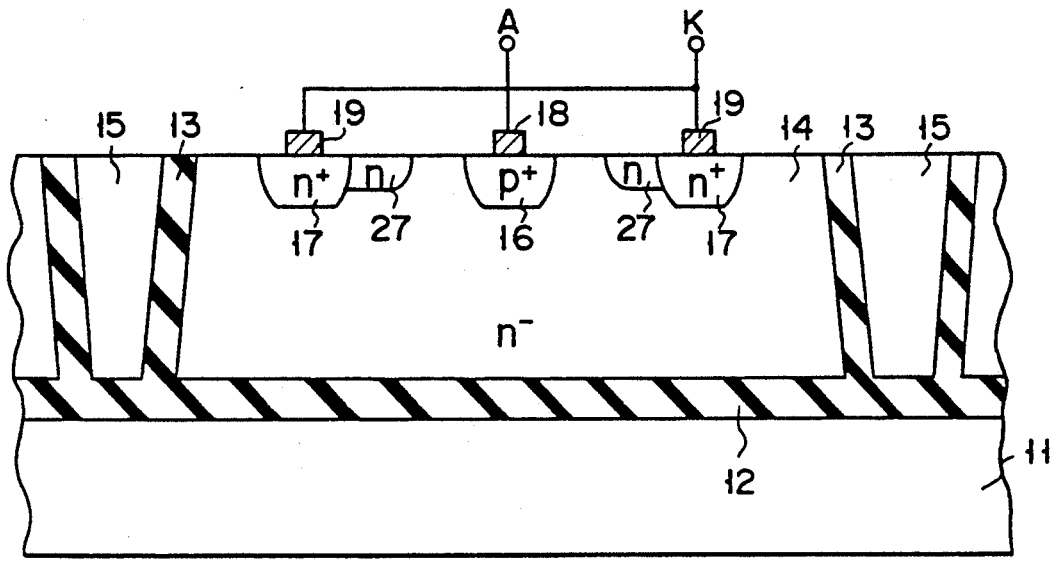
F I G. 15
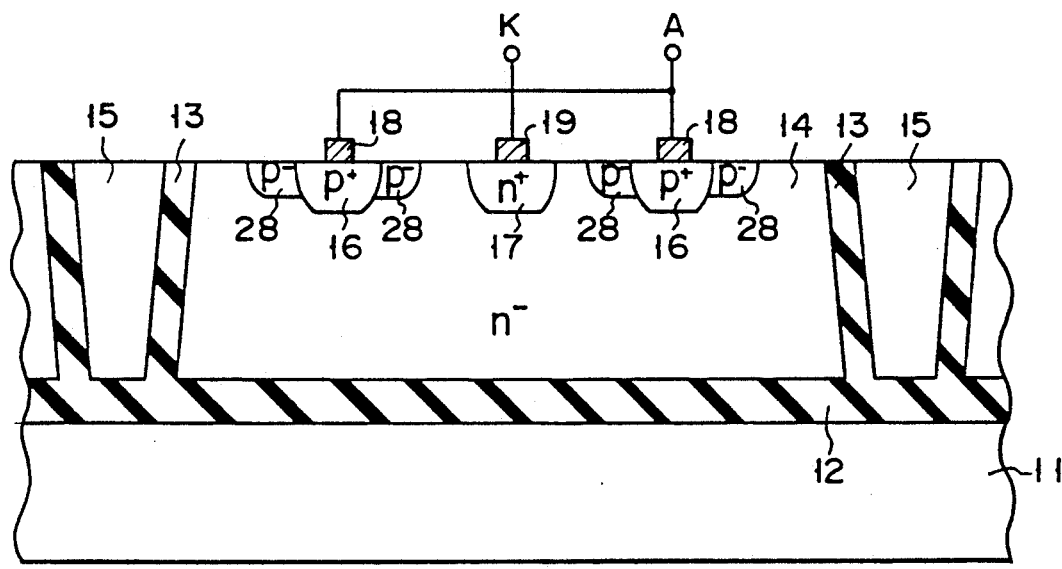
F I G. 16

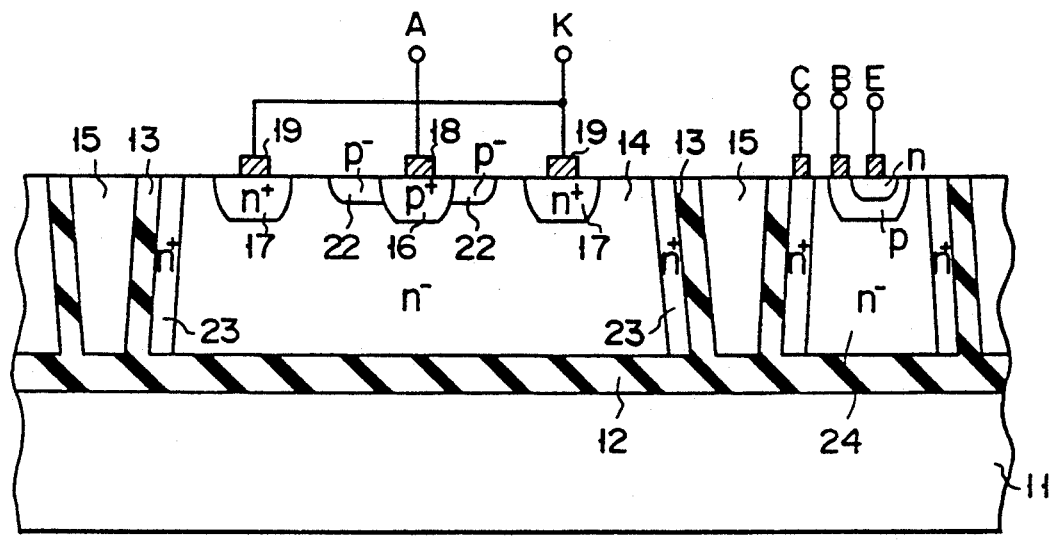
F I G. 19
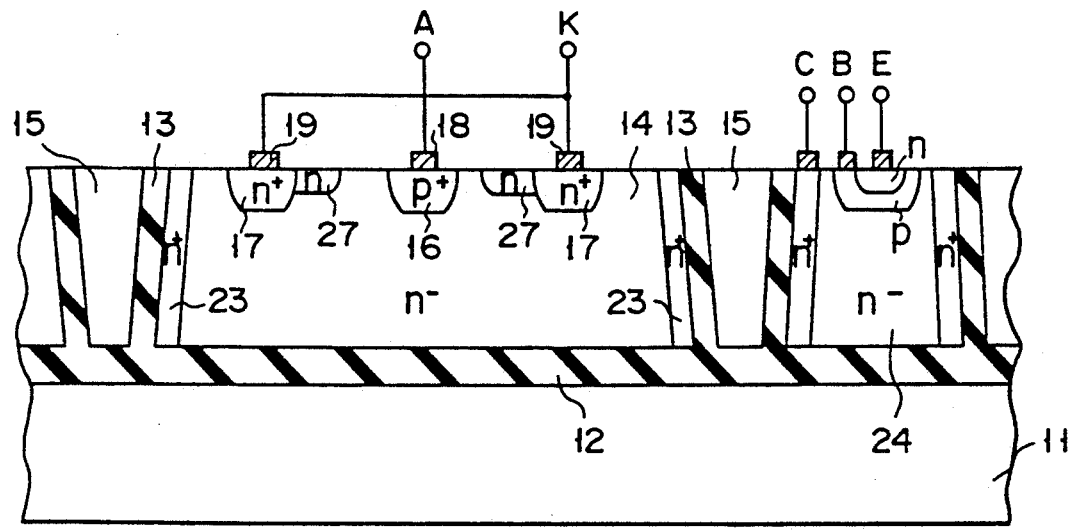
F I G. 20

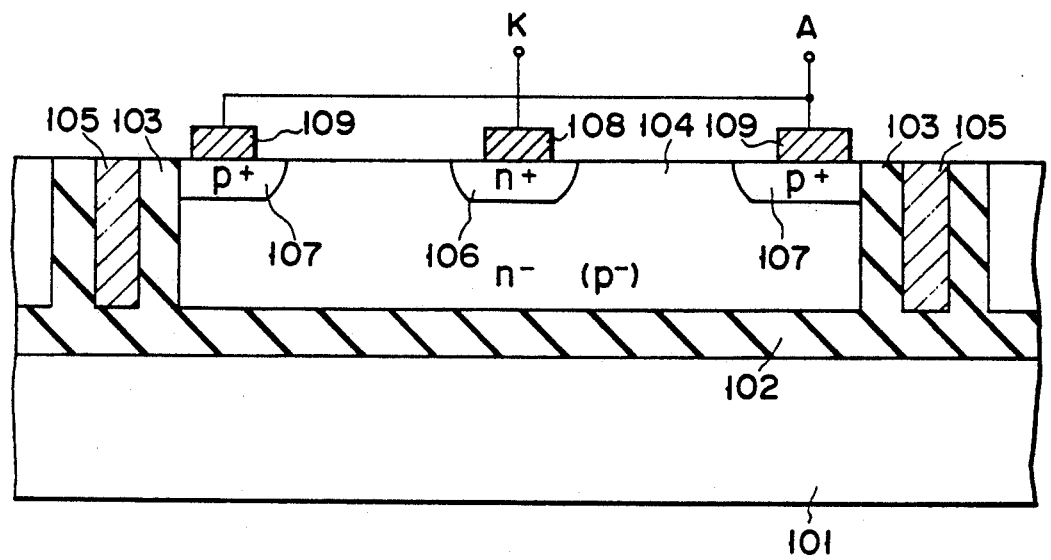
F I G. 21

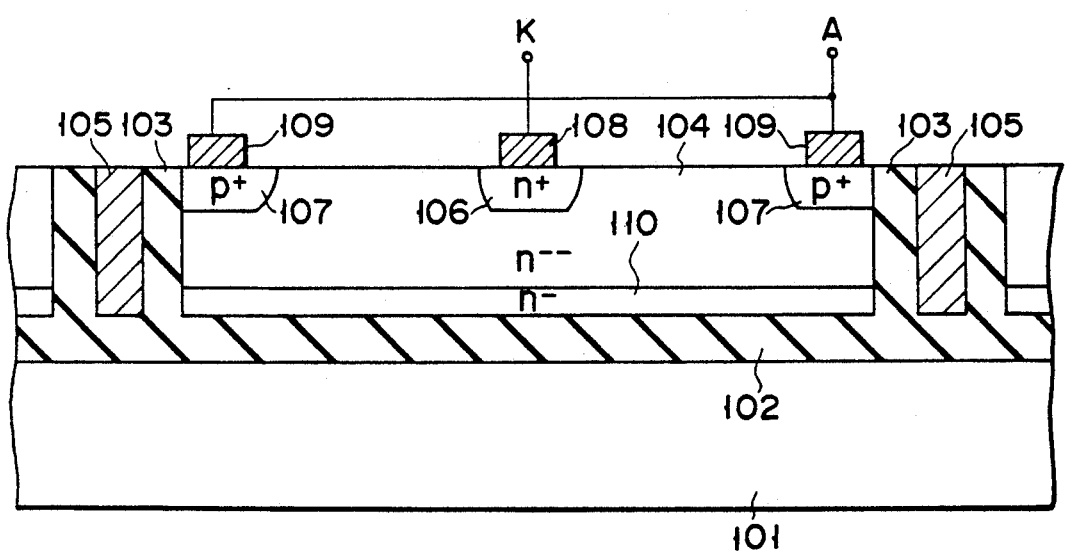
F I G. 22

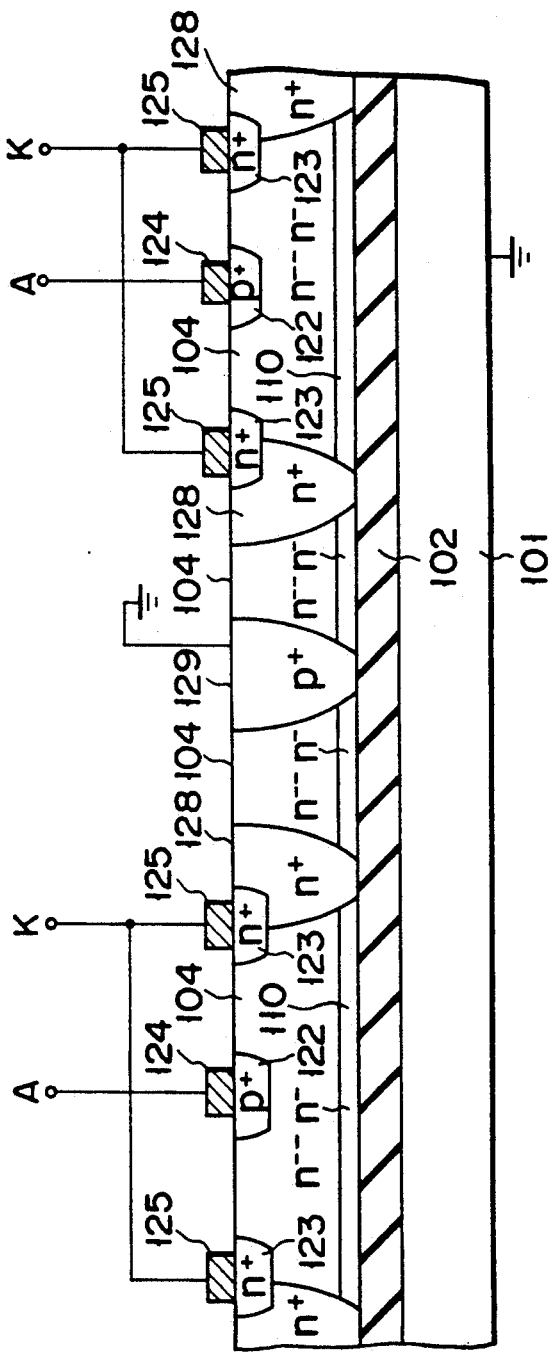
F I G. 31

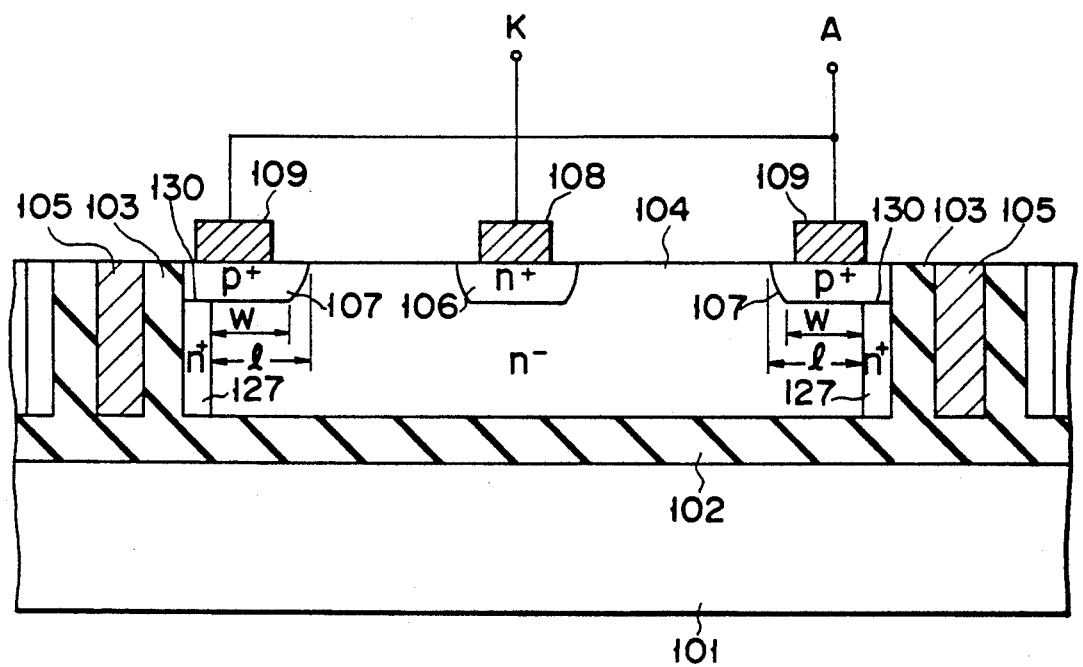
F I G. 32

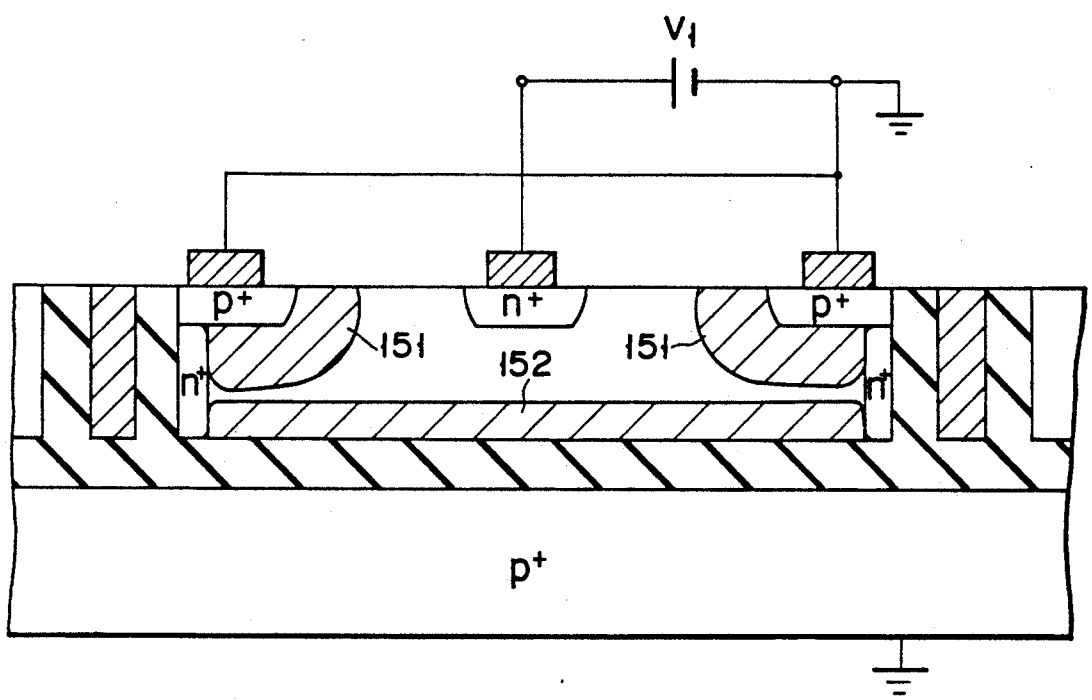
F I G. 33

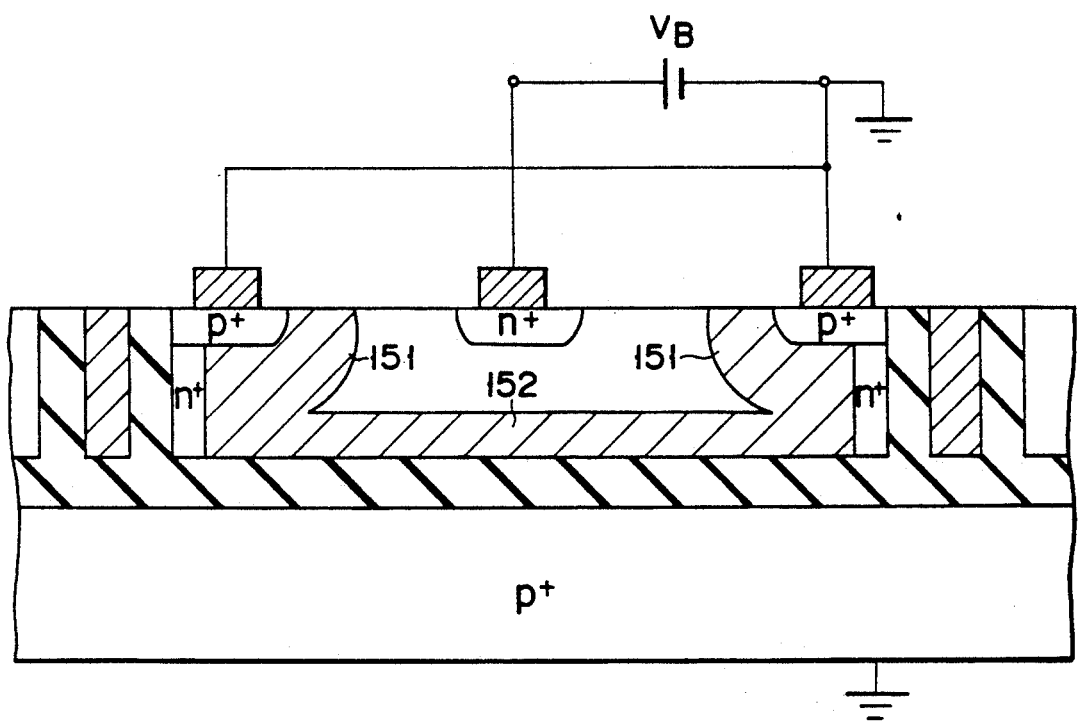
F I G. 34

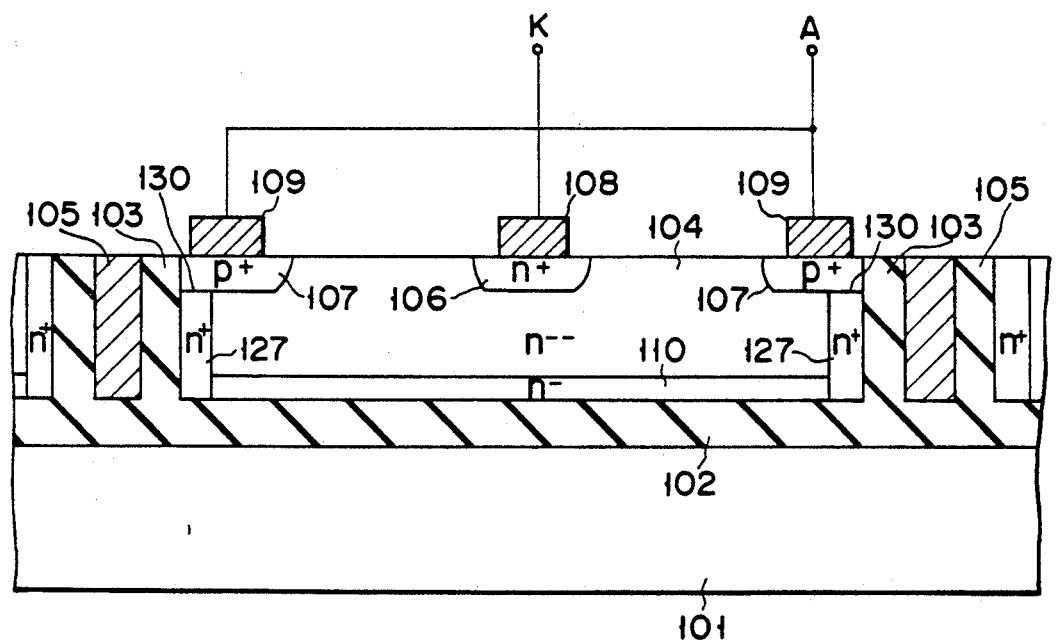
F I G. 35

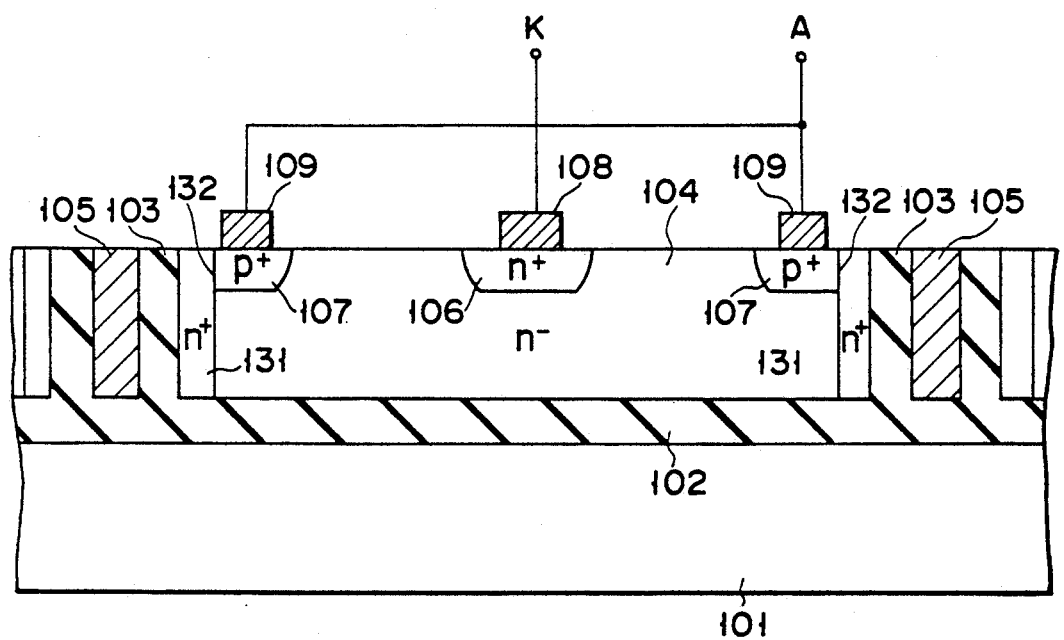
F I G. 36

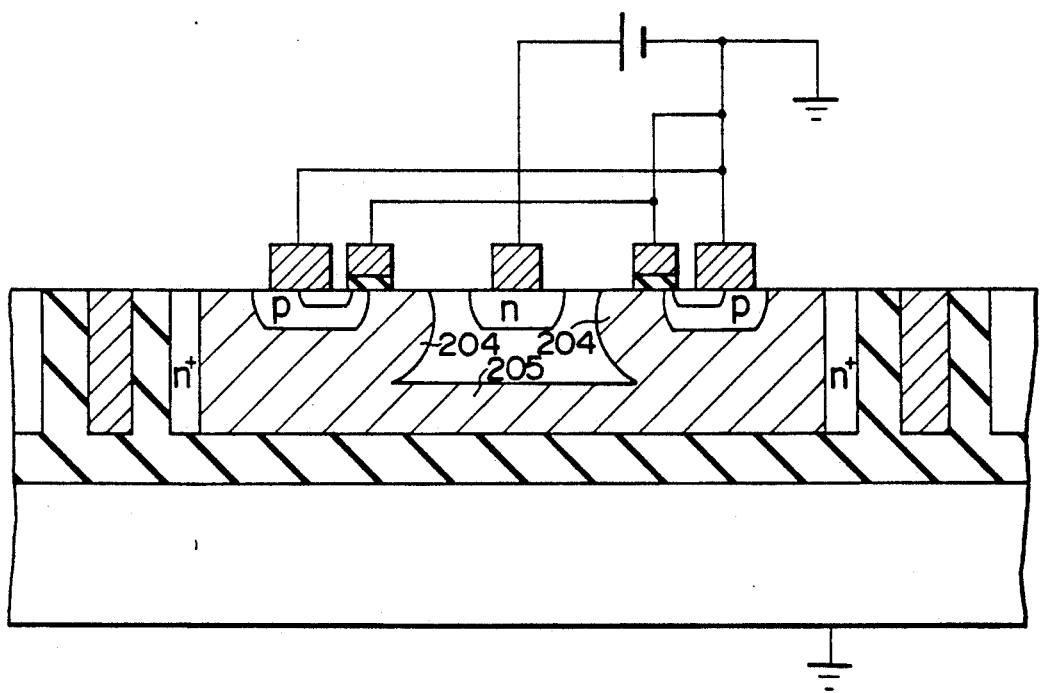
F I G. 41

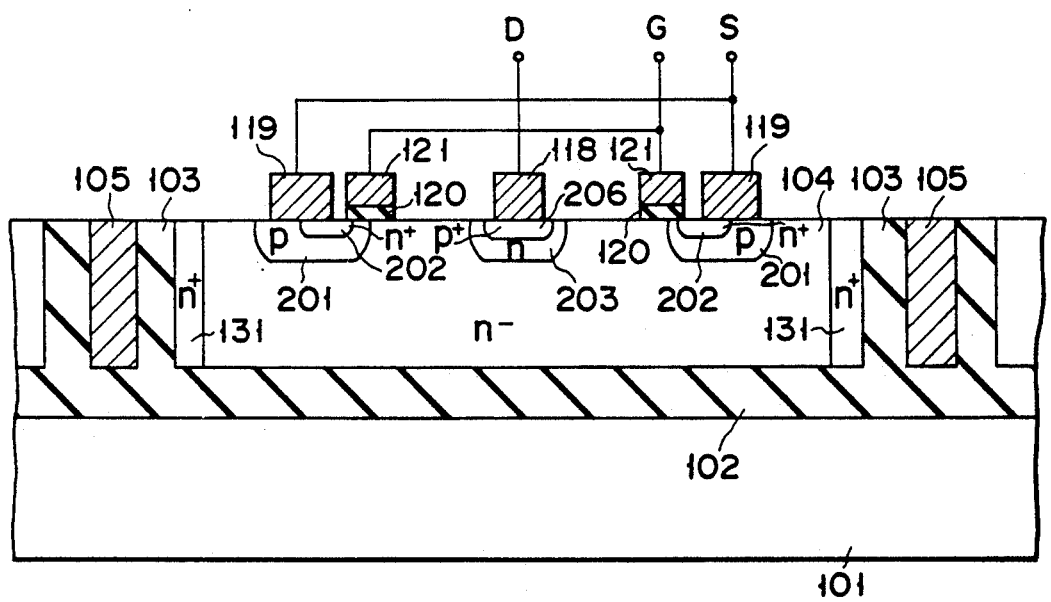
F I G. 43

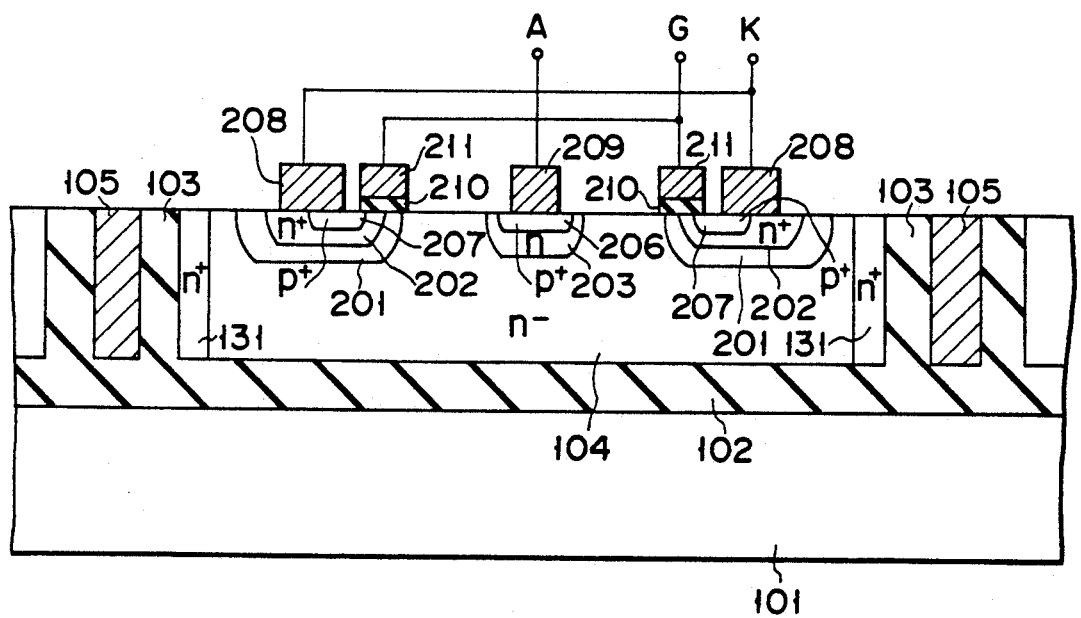
F I G. 44

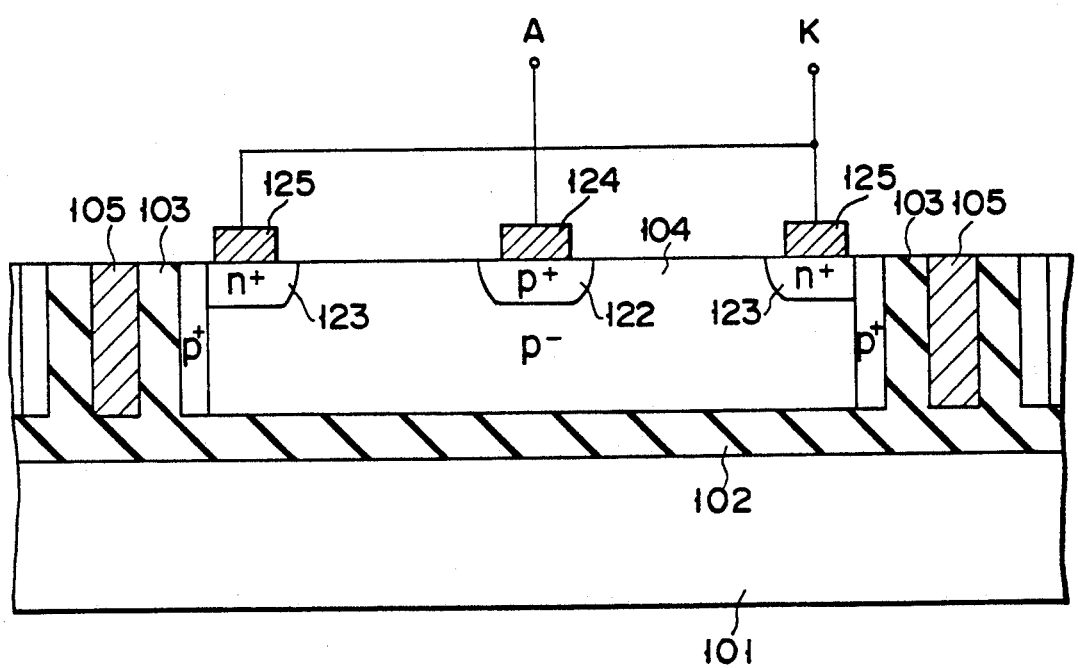
F I G. 48

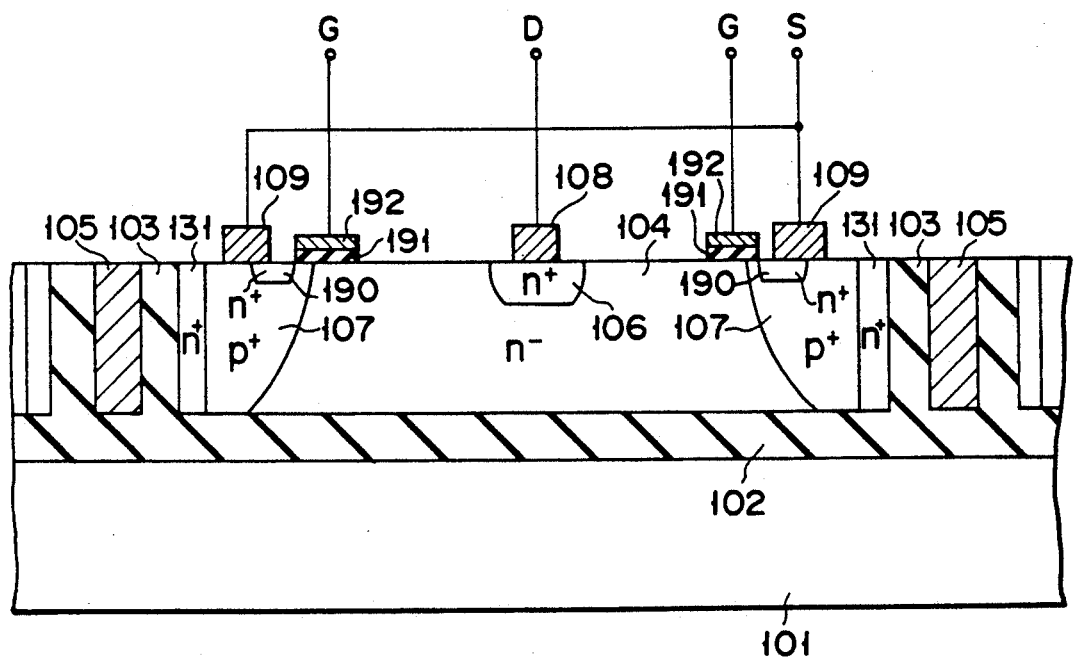
F I G. 50

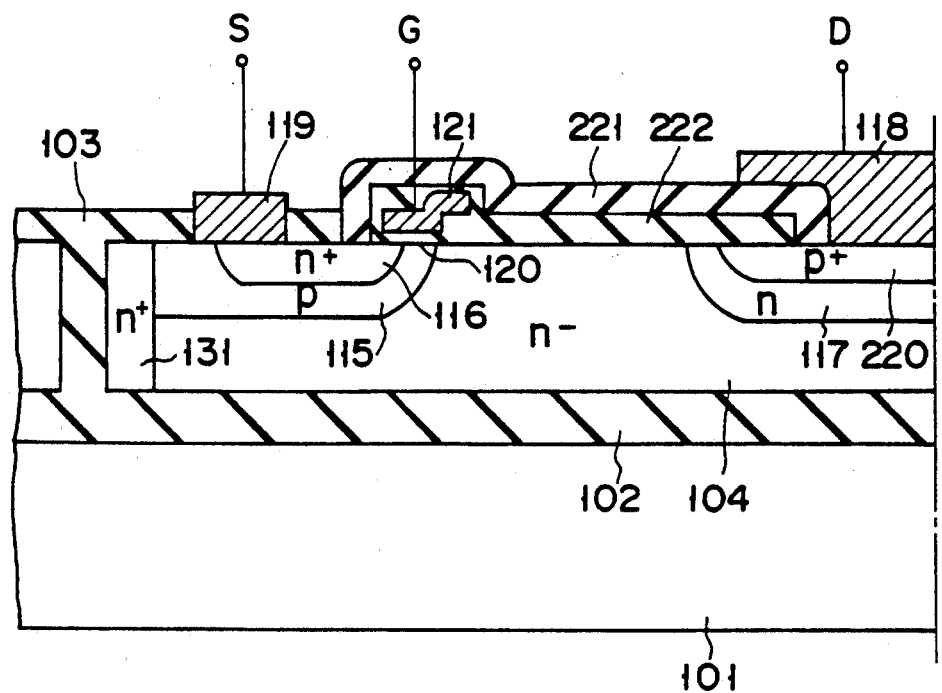
F I G. 56
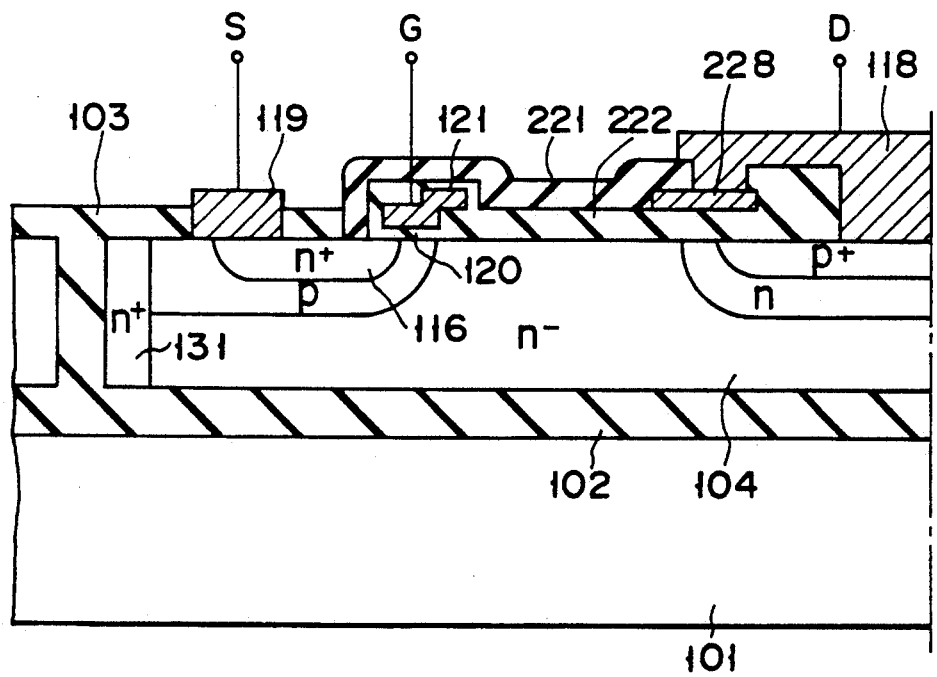
F I G. 57

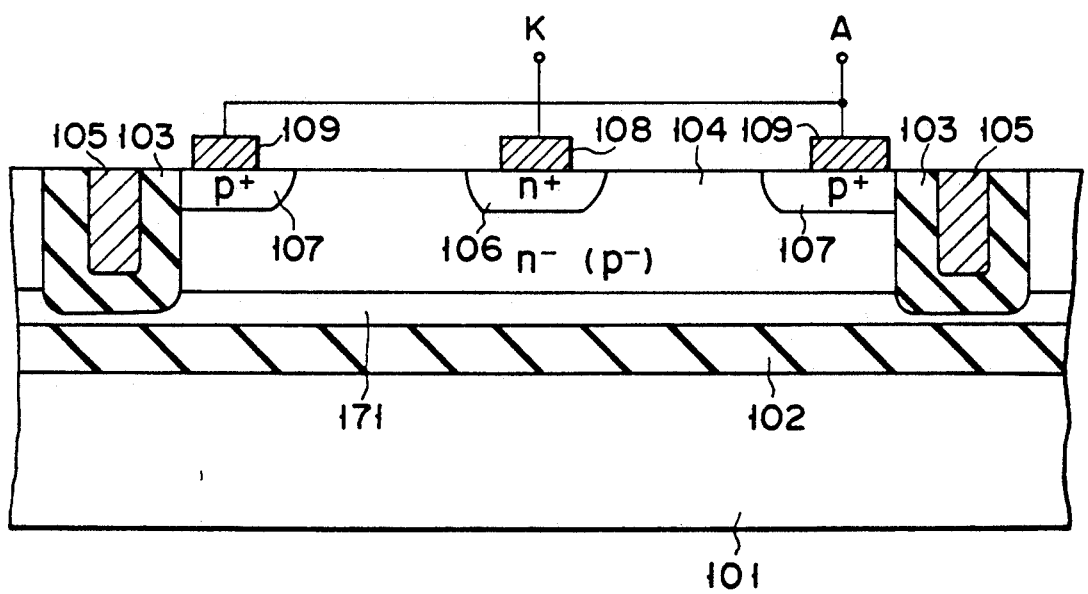
F I G. 60

HIGH BREAKDOWN VOLTAGE SEMICONDUCTOR DEVICE

CROSS-REFERENCE TO THE RELATED APPLICATIONS

This application is a continuation-in-part of application Ser. No. 397,874, filed on Aug. 24, 1989, abandoned, which in turn is a continuation-in-part of application Ser. No. 236,746, filed on Aug. 26, 1988, abandoned, which in turn is a continuation-in-part of application Ser. No. 161,102 filed on Feb. 26, 1988, abandoned.

BACKGROUND OF THE INVENTION

The present invention relates to a high breakdown voltage semiconductor device using dielectric isolation.

DESCRIPTION OF THE RELATED ART

In high breakdown voltage semiconductor devices, a dielectric isolation method is known as an effective method of isolating each element.

FIG. 1 shows a conventional high voltage diode obtained by using such a dielectric isolation method.

Referring to FIG. 1, reference numerals 1a, 1b denote an Si wafer obtained by bonding $p^+$ or $n^+$-Si substrate 1a and $n^-$-Si substrate 1b by a direct bonding technique; 3, a bonding interface, and 2, an oxide film formed on bonding interface 3. Part of the $n^-$-Si substrate 1b is etched to a depth reaching bonding interface 3 to form a groove, thereby forming island-like $n^-$ layer 4. Oxide film 5 is formed on an inner surface of the groove, and polycrystalline Si film 6 is buried therein. $P^+$ layer 8 is formed in a central surface portion of $n^-$ layer 4, which has been isolated from other regions by oxide films 2 and 5, and $p^-$ layer 9 is formed around $p^+$ layer 8, thereby constituting a diode. Furthermore, $n^+$ layer 10 is formed in a peripheral surface portion of $n^-$ layer 4 so as to form an anode electrode.

In the diode described above, when a reverse bias is applied between the anode and cathode, a depletion layer extends from $p^+$ layer 8 into $n^-$ layer 4. If the reverse bias is increased, through a depletion layer extends from $p^+$ layer, cannot reach oxide film 2 formed on the bottom of $n^-$ layer 4. The voltage between the anode and cathode is applied to the depletion layer generated in $n^-$ layer 4. Therefore, in order to sufficiently increase the breakdown voltage of the diode, the thickness of $n^-$ layer 4 must be sufficiently increased. However, if the thickness of $n^-$ layer 4 is increased, the depth of the groove for element isolation must be increased accordingly. This makes it difficult to perform dielectric isolation, especially, in a lateral direction. In addition, if $p^-$ layer 9 formed on the surface is not depleted at the same time when $n^-$ layer 4 is completely depleted, punch-through can be easily caused between $p^-$ and $n^+$ layers 9 and 10.

In addition, a large amount of crystal defects appear around the grooves. Thus, when transistors are formed in the isolated layer 4, many recombinations are caused and life times of carriers are shortened, and therefore, current gain is lowered.

As described above, in a semiconductor element having the conventional dielectric isolation structure, the thickness of a high-resistance semiconductor layer must be sufficiently increased to obtain a sufficiently high breakdown voltage. However, such an arrangement makes it difficult to perform element isolation from the technical viewpoint.

SUMMARY OF THE INVENTION

It is accordingly the object of the present invention to provide a high breakdown voltage semiconductor device which reveals an adequately high breakdown voltage and allows ready formation of an isolating region.

According to one embodiment of the present invention, there is provided a high breakdown voltage semiconductor device comprising a semiconductor substrate; an insulating layer formed on the semiconductor substrate; a first semiconductor region formed on the first insulating layer and isolated at its side by an isolating region; a second semiconductor region of a first conductivity type formed in a surface portion of the first semiconductor region and having a higher impurity concentration than that of the first semiconductor region: a third semiconductor region of a second conductivity type formed in the surface region of the first semiconductor region such that it is located between the second semiconductor region and the isolating region in a manner to be spaced apart from the second semiconductor region and isolating region, the third semiconductor region having a higher impurity concentration than that of the first semiconductor region; a first electrode formed on the second semiconductor region; and a second electrode formed on the third semiconductor region.

According to another embodiment of the present invention, a high breakdown voltage semiconductor device comprises a semiconductor substrate; an insulating layer formed on the semiconductor substrate; a first semiconductor region formed on the first insulating layer and isolated at its side by an isolating region which is fixed at a predetermined potential level; a second semiconductor region of a first conductivity type formed in a surface portion of the first semiconductor region and having a higher impurity concentration than that of the first semiconductor region; a third semiconductor region of a second conductivity type formed in a surface portion of the first semiconductor region such that it is located between the second semiconductor region and the isolating region in a manner to be spaced apart from the second semiconductor region and isolating region, the third semiconductor region having a higher impurity concentration than that of the first semiconductor region; a first electrode formed on the second semiconductor region; and a second electrode formed on the third semiconductor region.

BRIEF DESCRIPTION OF THE DRAWINGS

FIGS. 9 and 10 are sectional views showing a modified form of the device shown in FIG. 8;

FIG. 13 is a sectional view showing a modified form of the device of FIG. 8;

FIG. 14 is a sectional view showing a modified form of the device of FIG. 14;

FIG. 15 is a sectional view showing a modified form of the device of FIG. 2;

FIG. 16 is a sectional view showing a modified form of the device of FIG. 7;

FIG. 19 is a sectional view showing a modified form of the device of FIG. 11;

FIG. 20 is a sectional view showing a modified form of the device of FIG. 11;

FIG. 21 is a sectional view showing a diode according to another embodiment of the present invention;

FIG. 22 is a sectional view showing a modified form of the diode shown in FIG. 21;

FIG. 31 is a sectional view showing a modified form of the diode shown in FIG. 30;

FIG. 32 is a sectional view showing a modified form of the diode shown in FIG. 28;

FIGS. 33 and 34 are sectional views for explaining conditions in which high breakdown voltage is achieved in the diode shown in FIG. 32;

FIG. 35 is a sectional view showing a modified form of the diode shown in FIG. 32;

FIG. 36 is a sectional view showing a modified form of the diode shown in FIG. 32;

FIG. 39 to 41 are sectional views for explaining conditions in which high breakdown voltages is achieved in the diode shown in FIG. 38;

FIG. 43 is a sectional view showing a modified form of the diode shown in FIG. 38;

FIG. 44 is a sectional view showing a modified form of the diode shown in FIG. 43;

FIG. 48 is a sectional view showing a modified form of the diode shown in FIG. 36;

FIG. 50 is a sectional view showing a modified form of the diode shown in FIG. 36;

FIG. 56 is a sectional view showing a modified form of the diode shown in FIG. 57;

FIG. 57 is a sectional view showing a modified form of the diode shown in FIG. 56;

FIG. 60 is a sectional view showing a modified form of the diode shown in FIG. 21.

DETAILED DESCRIPTION OF THE PREFERRED EMBODIMENTS

Figure 1:
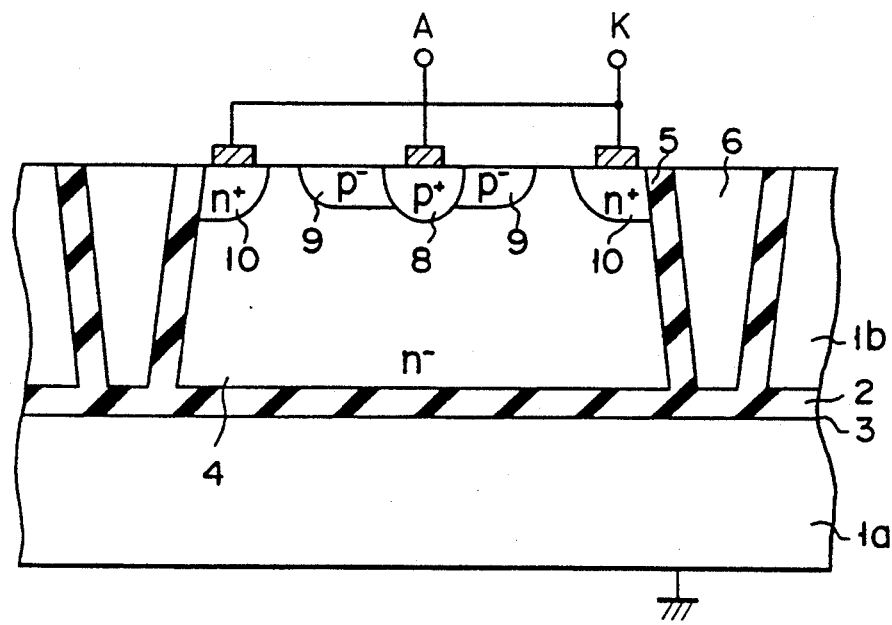
FIG. 1 is a sectional view showing a conventional diode.

In a high breakdown voltage semiconductor device, a high resistance semiconductor layer (first semiconductor region) constituting an element region has its bottom isolated by an insulating layer and its side isolated by an isolating region, respectively. A third semiconductor region constituting a cathode region or anode region of a diode is spaced a predetermined distance apart from the isolating region. The insulating layer may be about 1 $\mu$m thick and a potential in the isolating region may be fixed to a predetermined level.

If a voltage is applied across a second semiconductor region (the anode or cathode of the diode) and the third semiconductor region (the cathode or anode of the diode) in the aforementioned semiconductor device, it acts not only in a lateral direction but also in a depth direction. Then, a depletion layer extends in the depth direction from a pn junction around the cathode or anode regions. When the impressed voltage is increased the depletion layer reaches the insulating layer on the bottom of a high resistance semiconductor layer. The voltage acting in the depth direction is shared by a high resistance semiconductor layer and insulating layer. In order to prevent avalanche breakdown upon the application of high voltage, it is preferred that more portion of that application voltage be applied to the insulating layer. Since an electric flux density at an interface between the high resistance silicon layer and the insulating layer is continuous, it is preferable that an electric field in the insulating layer be weak so that the electric field may not be increased in a vertical direction in the high resistance silicon layer. In order that, even when a larger voltage is applied to the insulating layer, an electric field may not be increased, the film is preferred to have a greater thickness. If the insulating layer is made thicker, it follows that, under the identical application voltage, a smaller voltage is applied to the high resistance silicon layer and hence a weaker electric field is created. In the device of the present invention, a high breakdown voltage can be achieved by using an insulating layer of about 1 μm.

If, on the surface of the high resistance silicon layer, a high potential-side electrode is situated at an outer side than a low potential-side electrode, voltage is developed across a semiconductor area between the high potential-side electrode and an isolating region. By setting a potential in the isolating region from a zero level to a proper level, a voltage at that place can be made at a smaller level, preventing an avalanche breakdown.

According to the present invention, it is possible to achieve a high breakdown voltage in a device with a dielectric isolation structure. It is also possible to, if nearly the same breakdown voltage as that of the conventional semiconductor device is used in the present semiconductor device, decrease the thickness of the first insulating layer and to ensure a ready element isolation.

In the above description, the third semiconductor region is separated from the the second insulating layer; however, the third semiconductor region may be adjacent to the second insulating layer.

In the semiconductor device of the present invention, it is desirable that the thickness of the insulating layer be not less than 1 μm. Thereby, even in the state wherein the depletion layer is extended, the electric field in the insulating layer can be made relatively weak, and accordingly the electric field extending in the vertical direction of the high-resistance semiconductor layer can be kept weak. In addition, since most of the applied voltage is shared by the insulating layer, the voltage applied in the depth direction of the high-resistance semiconductor layer can be kept low. As a result, even where the high-resistance semiconductor layer is relatively thin, an adequately high breakdown voltage characteristic can be obtained.

In the high breakdown voltage semiconductor device according to present invention, the element isolation in the lateral direction can be effected not only by means of an insulating layer but also by means of a pn junction. In this case, too, an adequately high breakdown voltage characteristic can be obtained by a relatively thin high-resistance semiconductor layer.

The high breakdown voltage semiconductor device of the present invention can have a higher breakdown voltage, in particular, when the bottom of the high-resistance layer is provided with a buffer layer of a low impurity concentration which is determined such that the total impurity quantity per unit area is not higher than $3 \times 10^{12}/cm^2$, and preferably is 0.5 to $2.0 \times 10^{12}/cm^2$. The reason is that at the time of applying a reverse bias, if the buffer layer is completely depleted, a space-charge with a concentration higher than that in the high-resistance semiconductor layer is generated in the buffer layer. Where a semiconductor-side vertical component of the electric field at the interface between the buffer layer and the insulating layer is Es, an insulating layer-side vertical component of this electric field is Ei, the dielectric constant of the high-resistance semiconductor layer is $\epsilon e$, and the dielectric constant of the insulating layer is $\epsilon i$, $$Es = (\epsilon_i/\epsilon_s)Ei$$

Thus, in accordance with the increase in electric field in the insulating layer, the electric field in the high-resistance semiconductor layer increases. The space-charge generated in the buffer layer, however, functions to reduce the electric field in the high-resistance semiconductor layer. By providing such a buffer layer, the electric field in the insulating layer can be increased, with the electric field on the high-resistance semiconductor layer side kept weak. Thereby, the breakdown voltage can be increased.

Suppose that a low-resistance region (a fourth low-resistance region) of the first conductivity type is formed at an interface between the second insulating layer and the side portion of the high-resistance semiconductor layer in the element region. This is unavoidable when a low-resistance region of the first conductivity type is formed on the side wall of the groove of an adjacent element region, because it is difficult to selectively form the low-resistance region on only one of the walls of the groove. In this structure, the problem is that when a reverse bias is applied, breakdown may occur between this low-resistance region and a low-resistance region (a third low-resistance region) on the surface of the high-resistance semiconductor layer. When a reverse bias is applied, a depletion region is extended in the high-resistance semiconductor layer about the third low-resistance region and from the upper surface of the first insulating layer. If the high resistance semiconductor is of a first conductivity type and the fourth region and second low-resistance region at the central part of the element region are connected by a neutral region of the high resistance semiconductor region, the potential of the fourth low-resistance region is equal to that of the second low-resistance region. In the case where the breakdown voltage at the pn junction between the third low-resistance region and the second low-resistance region is $V_B$, breakdown occurs if the reverse bias voltage reaches $V_B$ while the fourth and second low-resistance regions are connected by the neutral region. It is possible that the thickness and impurity concentration of the high-resistance semiconductor layer are so determined that the applied voltage at the time when the depletion layer under the second low-resistance region reaches the first insulating layer is lower than $V_B$. Thereby, the fourth low-resistance region and the second low-resistance region are mutually separated by the depletion layer before break down occurs between the fourth and second low-resistance regions. If the second low-resistance region is separated from the fourth low-resistance region by the depletion layer in this manner, the potential difference between the second and fourth low-resistance regions is not increased further and the breakdown between these low-resistance regions can be prevented.

For example, suppose that the thickness of the high-resistance semiconductor layer is d, the impurity concentration is C, the thickness of the first insulating layer is t, the dielectric constant of the first insulating layer is $\epsilon i$, the dielectric constant of the semiconductor is $\epsilon s$, and the depth of the third low-resistance region is $x_j$. Where the area of the third low-resistance region is sufficiently large, the reverse bias $V_0$ at the time when the depletion layer extends from the bottom of the second low-resistance region to the first insulating layer can be approximated by $$V_0 = eC\{2t(\epsilon_s/\epsilon_i) + d - x_j\}^2(d-x_j)^2 / [8\epsilon_s\{t(\epsilon_s/\epsilon_i) + d - x_j\}^2]$$

where e denotes an elementary charge.

A high breakdown voltage characteristic can be obtained by determining the thickness of each part and the impurity concentration so as to meet the relation of $V_0 < V_B$ by referring to the above equation.

In the case where the width of the third low-resistance region is small and not more than several μm, the value of the width is set at "L", and, on the basis of the following simultaneous equations relating to $V_0$ and x, the value of $V_0$ is approximately obtained:

$$V_0 = (eC/2\epsilon_s)[(x + L)^2\{ln\{(t + L)/L\} - 1/2\} + L^2/2]$$
$$V_0 = (eC/2\epsilon_s)(d - L - x)^2 + (eC/\epsilon_i)t(d - L - x)$$

It should suffice if the value of $V_O$ is determined to meet $V_O < V_B$. In these equations, x represents an extension of the depletion layer about the third low-resistance region, and has a dimension of length.

Experimentally, L should be longer than d.

In the semiconductor device in which the third low-resistance region is formed to a depth reaching the first insulating layer, the fourth low-resistance region and the second low-resistance region are separated. Accordingly, the potential of the fourth low-resistance region does not rise in accordance with that of the second low-resistance region, and no breakdown occurs at the pn junction of the second and fourth low-resistance regions. Therefore, a high breakdown voltage characteristic can be obtained even if the second third low-resistance region is provided.

The preferred embodiments of the present invention will now be explained below by referring to the accompanying drawings.

Figure 2:
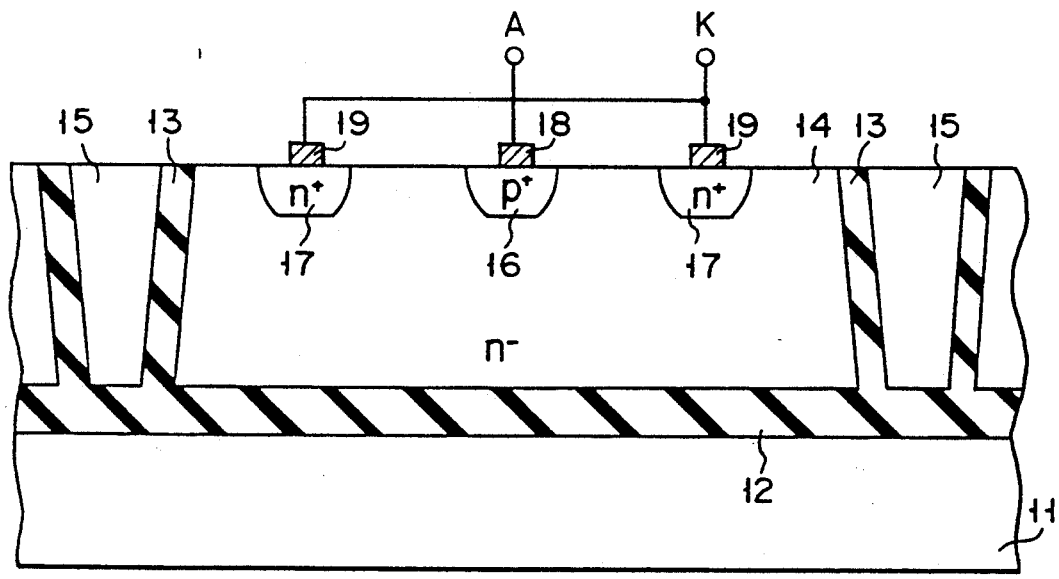
FIG. 2 is a sectional view showing a diode according to one embodiment of the present invention.

FIG. 2 is a sectional view showing a high breakdown voltage diode according to one embodiment of the present invention. An island-like high resistance silicon layer 14 (first semiconductor region) is formed which is isolated by an oxide film 12 (first insulating film) from a silicon substrate 11 and by an oxide film 13 (second insulating film) from another element area in the lateral direction. The underlying oxide film 12 has a thickness of above 1 μm. The high resistance silicon layer 14 is of an n⁻ type having a sufficiently low impurity concentration (e.g. $1 \times 10^{14}$/cm³). A polycrystalline silicon film 15 is embedded in the element isolation area. A p+ type layer 16 (second semiconductor region) of a high impurity concentration (e.g. $1 \times 10^{18}$/cm³) which constitutes an anode region is formed in the middle surface portion of the resistance silicon layer 14. An n+ type region (third semiconductor region) of a high impurity concentration (e.g. $1 \times 10^{19}$/cm³) which constitutes a cathode region is formed in a position away from the p+ type region 16. In a plan view in FIG. 2 the p+ type region 16 is surrounded with the n+ type region 17. The n+ type region 17 is spaced a predetermined distance apart from the second insulating film 13. First and second electrodes 18 and 19 are formed on the p+ and n+ type regions 16 and 17, respectively.

In the manufacture of a diode, a high resistance silicon substrate which corresponds to the high resistance silicon layer 14 is bonded to the silicon substrate 11 by a direct bonding technique. That is, two substrates are mirror-polished, brought into contact with each other in a clean atmosphere, and thermally treated. An oxide film 12 is initially formed on the bonding surface of at least one of the substrates and the high resistance silicon layer 14 is obtained which is electrically isolated from the substrate 11. An element isolation groove is formed by an etching step and the oxide film 13 is formed at the side surface of the island-like silicon layer 14. After a polycrystalline silicon film 15 is embedded in an isolation groove, p+ and n+ type regions 16 and 17 are formed by impurity diffusion in the layer 14 and the electrodes 18 and 19 are formed on the p+ and n+ type regions 16 and 17, respectively.

When a reverse bias is applied across the first and second electrodes 18 and 19 in the diode thus manufactured, a depletion layer extends outward from the peripheral portion of the p+ type region 16. Since the substrate 11 is normally grounded, the depletion layer also extends upward from an interface between the oxide film 12 and the high resistance silicon layer 14. If high voltage is applied, the depletion layer extends to the oxide film 12, the n+-type region 17 and the oxide film 13 from pn junction of the p+-type region 16, and a strong electric field is created moving downward from the n+ type region 17. Since, however, the oxide film 12 is as thick as 1 μm or more, most of the applied voltage is sustained by the oxide film and an electric field in the high resistance silicon layer 14 is suppressed to below a value at which avalanche breakdown is generated. It is thus possible to obtain a high breakdown voltage of above 350 V. When the thickness of the oxide film 12 is increased to 2 μm or more, it is possible to obtain a high voltage of about 450 V. In the manufacture of the device, a positive interface charge is naturally created at the interface between the high resistance silicon layer 14 and the oxide film 12, enhancing an electric field in the oxide film 12 to allow a weakening of an electric field in the high resistance silicon layer 14. It is again possible to enhance a breakdown voltage.

Since the interior of the polycrystalline silicon film 15 is uniform in potential and nearly zero in potential, a lateral electric field is also created from the n+ type layer 17 toward the polycrystalline silicon film 15. Since a distance is maintained between the n+ type layer 17 and the oxide film 13, the electric field is reduced and breakdown is prevented. It is preferred that, like the oxide film 12, the oxide film 13 be made thicker.

Figure 3:
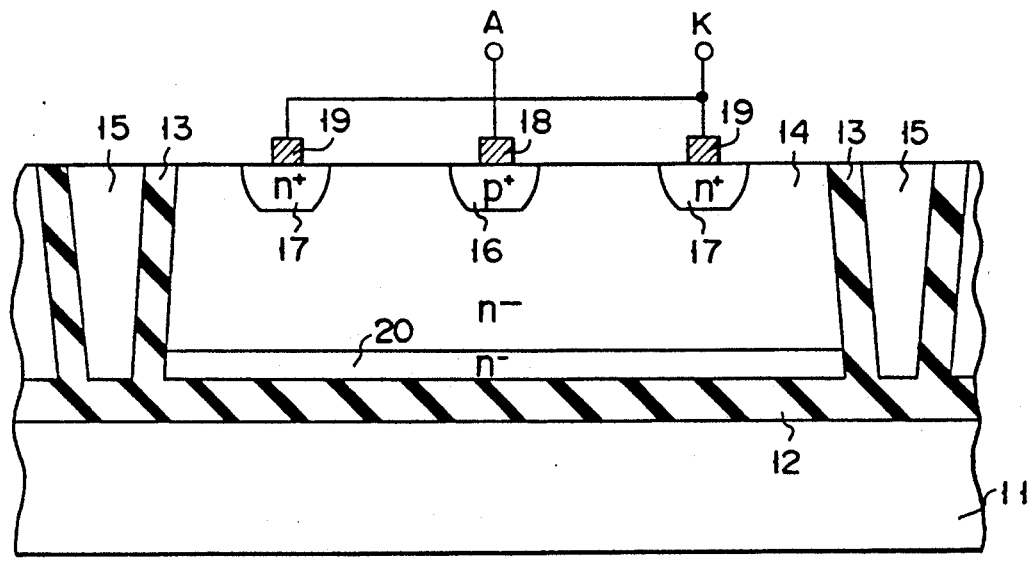
FIG. 3 is a sectional view showing a diode of the present invention which includes an $n^-$ type region at a bottom thereof.

FIG. 3 shows a semiconductor device according to a second embodiment of the present invention in which an n− buffer layer 20 of a lower impurity concentration is formed at the bottom of a high resistance silicon layer 14. The n− type layer 20 is depleted upon the application of reverse bias across the anode and cathode, creating a positive space charge. The charge causes a strong electric field which is created in the oxide film 12 to quickly be weakened in the high resistance silicon layer 14 to enhance breakdown voltage. In this connection it is to be noted that, as in the embodiment shown in FIG. 2, even if there is no n− type buffer layer 14, a positive interface charge which is created at the interface between the high resistance silicon layer 14 and the oxide film 12 has the same effect as set forth above.

Figure 4:
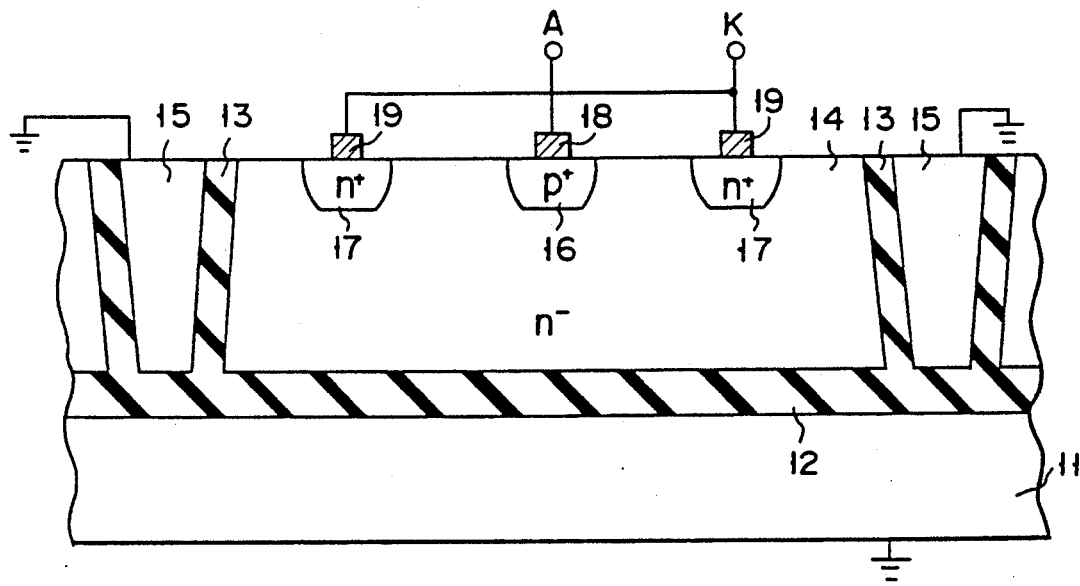
FIG. 4 is a sectional view showing a diode of the present invention which includes a grounded isolating region.

FIG. 4 shows a modified form of the embodiment (diode) of FIG. 2 in which a polycrystalline silicon film 15 at an isolation area is grounded. This variant is desirable for a breakdown voltage to be enhanced with the potential of the polycrystalline silicon film 15 fixed. Since, upon the application of reverse bias, a voltage is developed across an n+ type region 17 at a high potential and a polycrystalline silicon film 15, it is preferred that a potential of the polycrystalline film 15 be floated. Further, it is preferred that an n− type buffer layer 10 be formed at the bottom of a high resistance silicon layer 14.

Figure 5:
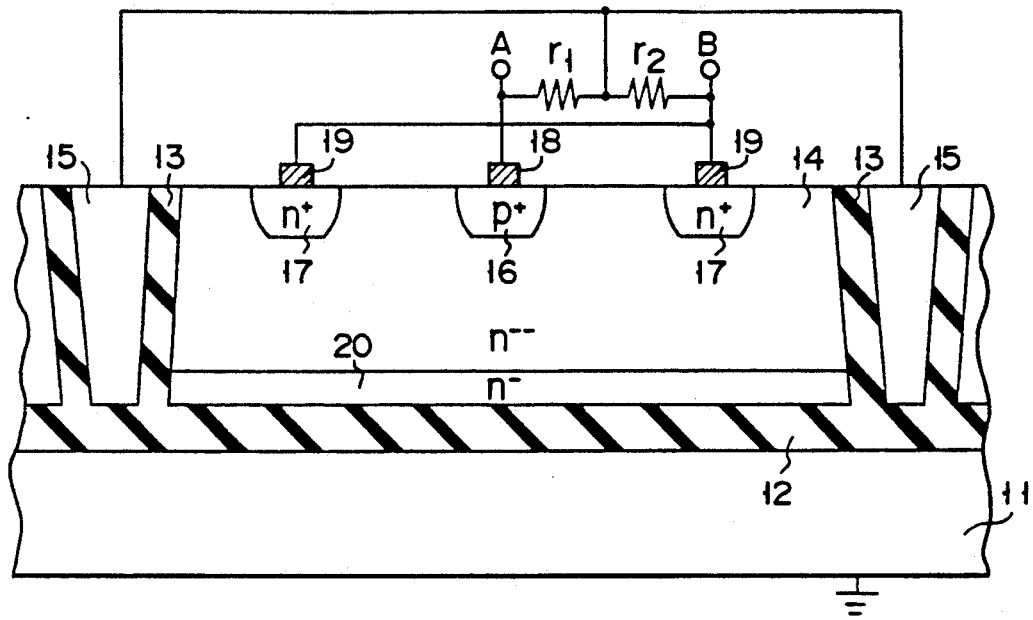
FIG. 5 is a sectional view showing an isolating region whose potential is set at a predetermined level.

FIG. 5 shows a modified form of the embodiment shown in FIG. 3 in which a potential on a polycrystalline silicon film is fixed at an intermediate potential level between an anode electrode potential and a cathode electrode potential. This embodiment is more desirable than the embodiment shown in FIG. 3 where the polycrystalline silicon film 15 is grounded, since an electric field extending from the n+ type region 17 toward the polycrystalline silicon film 15 is weakened. Further, this embodiment ensures a stabler breakdown voltage than the aforementioned embodiment where the potential on the polycrystalline silicon film 15 is floated. It is thus possible to provide a more desirable embodiment than the third embodiment. Resistance values r1 and r2 of the embodiment of FIG. 5 may be equal to, or different from, each other. A total resistance of r1 and r2 is desirable to have a larger value. This embodiment obviates the necessity of providing an n− type buffer layer, because a positive interface charge is developed at an interface between the n− type buffer layer 20 and an oxide film 12.

Figure 6:
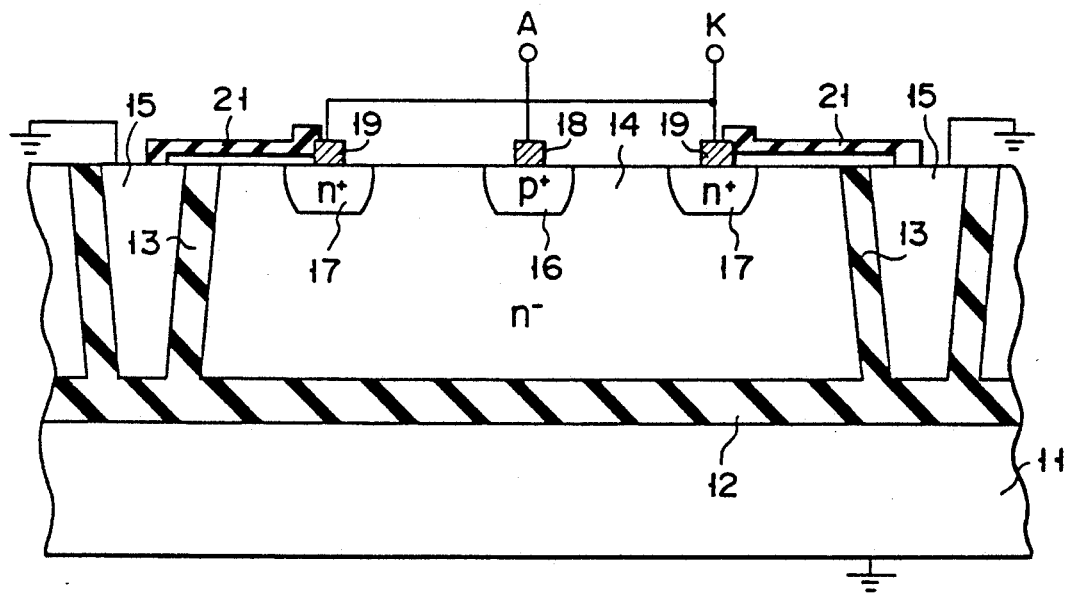
FIG. 6 is a sectional view showing a modified form of the diode shown in FIG. 4.

FIG. 6 shows a modified form of the embodiment shown in FIG. 4, in which a polycrystalline silicon film 15 is connected to a second electrode 19 via a high resistance film 21 (for example, SIPOS). A small current flows through the high resistance film, creating a uniform potential gradient. By so doing, a local concentration of an electric field is suppressed at an area from an n+ type region 17 to a polycrystalline silicon film 15, preventing a breakdown at that area. An n− type buffer layer may be provided at the bottom of a high resistance silicon layer 14 as in the case of the embodiment shown in FIG. 3.

Figure 7:
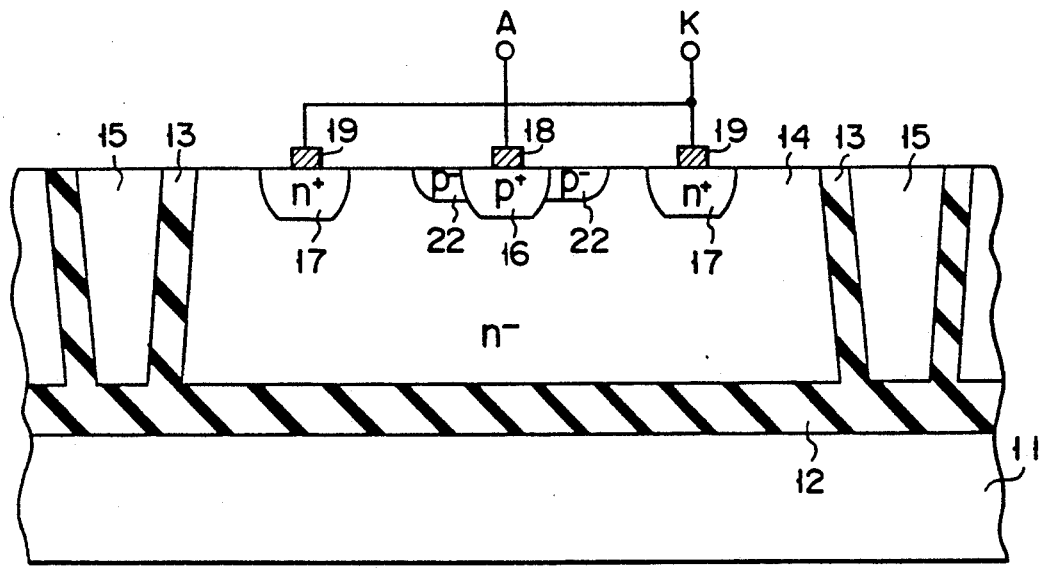
FIG. 7 is a sectional view showing a modified form of the diode of FIG. 2.

FIG. 7 shows a modified form of the embodiment shown in FIG. 2, in which a p− type region 22 is formed around a p+ type region 16 so as to suppress a local concentration of an electric field at a pin junction terminal. An n− type buffer layer may be provided at the bottom of a high resistance silicon layer 14 as in the case of the embodiment shown in FIG. 3.

Figure 8:
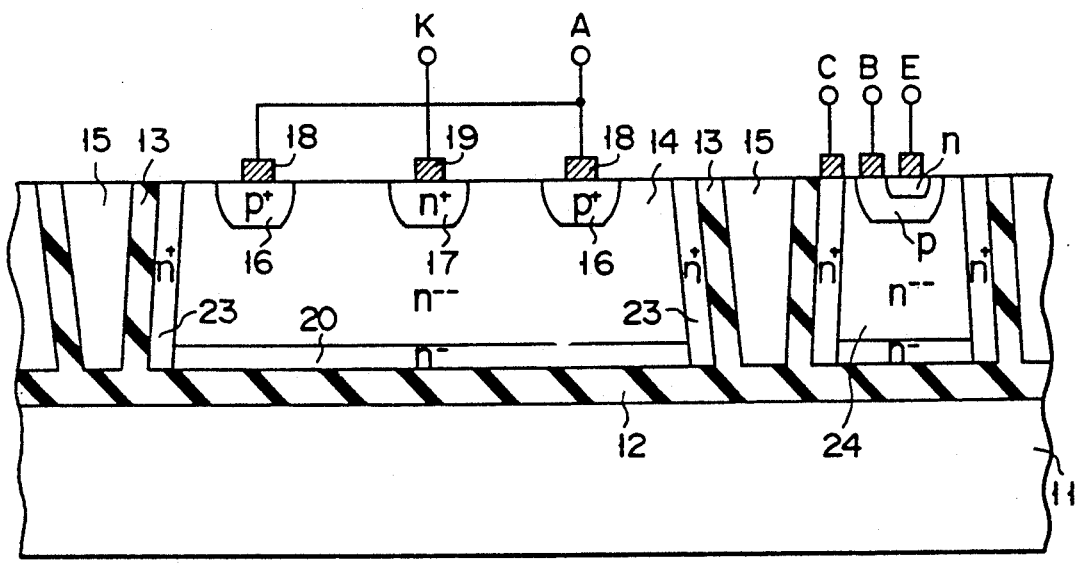
FIG. 8 is a sectional view showing a device of the present invention which includes a logic device and diode formed at the same substrate.

FIG. 8 shows an embodiment in which logic and high breakdown voltage elements are formed in a common substrate in a manner to mutually isolate them by dielectric isolation. In this embodiment, the high breakdown voltage element is of such a type that, in the arrangement shown in FIG. 3, the p+ type region 16 and n+ type region 17 are exchanged relative to each other and that an n+ type layer 23 is formed at an interface between a high resistance silicon layer 14 and an oxide film 13. In this embodiment, an npn transistor 24 is formed, as one logic element, in an island-like high resistance silicon layer which is located adjacent an element isolation region embedded with a polycrystalline silicon film 15, noting that the diode of FIG. 8 is located adjacent the element isolation area on the side opposite to that on which the npn transistor is formed. The n+ type layer 23 in the high breakdown voltage element, together with the n+ type layer on the side of the logic element, is necessarily formed at the same time.

If, upon the application of reverse bias across the cathode and the anode, the n+ type layer 23 and n+ type layer 17 are connected via a neutral region in a manner not spaced apart by a depletion layer, the n+ type layer 23 is set to the same potential as that of the cathode electrode. Thus, when the n+ type layer 23 becomes a high potential region, high voltage is impressed to the portion of an oxide film 12 beneath the n+ type layer 23. For this reason, a strong electric field is created near an interface between the n+ type layer 23 and the n− type layer 20 in the high resistance silicon layer 14, causing avalanche breakdown to be liable to be generated. In this embodiment, however, a depletion layer extends from around the p+ type region 16 and from the upper surface of the oxide film 12 upon the application of reverse bias. If, in this case, a reverse bias of below a certain level is applied to the diode, each depletion layer is connected, separating the n+ type layer 23 from the n+ type region 17. As a result, a potential in the n+ type layer 23 does not rise any further. Thus, a breakdown is prevented in the neighborhood of an interface between the n+ type layer 23 and the n− type layer 20.

FIG. 9 shows a diode similar to that of FIG. 8 except that an n− type buffer layer is omitted. In the arrangement shown in FIG. 9, a positive interface charge is present in an interface between a high resistance silicon layer 14 and an oxide film 12. It is also possible to obtain a diode of high voltage type.

FIG. 10 shows an embodiment similar to that of FIG. 8 except that a p− type region 25 is formed at an inner surface of p+ type region 16 in order to weaken an electric field at a terminal portion of a p junction. If a reverse bias voltage exceeds a certain level, a depletion layer extends from a p+ type region 16 to an oxide film 12. Since, therefore, a potential of an n type region left on the side of an oxide film 13 never elevates, it is unnecessary to form the p− type region outside the p+ type region 16. In order to weaken the concentration of an electric field at the pn junction terminal before an n+ type layer 23 is separated by a depletion layer from an n+ type region 17, a p− type region may also be provided outside the p+-type region 16. It is possible to omit an n− type layer 20 as in the embodiment shown in FIG. 9.

Figure 11:
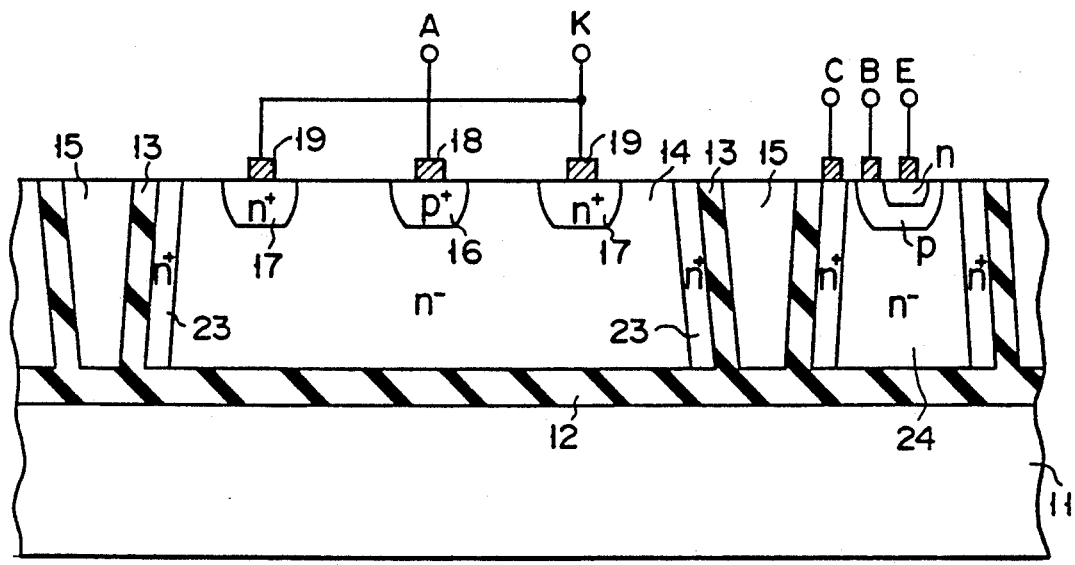
FIG. 11 is a sectional view showing anode and cathode regions exchanged with those shown in the device shown in FIG. 9.

FIG. 11 shows an embodiment of the present invention, similar to that of FIG. 9, where a high voltage diode is of such a type as shown in FIG. 2. In the arrangement shown in FIG. 11, since a logic device is also formed in the same substrate, an n+ type layer 23 is formed such that it is situated on the side of the high voltage diode. If an n+ type region 17 is connected to an n+ type layer 23 via an n type neutral region, a potential of the n+ type layer 23 as a whole becomes a level as high as that of the cathode electrode. As a result, an electric field is locally increased near that portion of an oxide film 12 which is situated at an interface between a high resistance silicon layer 14 and the n+ type layer 23, causing avalanche breakdown to be liable to occur. In this embodiment, however, a depletion layer extends from around a p+ type region 16. A depletion layer also extends from an interface between the high resistance silicon layer 14 and the oxide film 12. When a voltage exceeding a certain level is applied across the diode, the depletion layer reaches the portion around the n+ type region 17, thus isolating the n+ type layer 23 from the n+ type region 17 by the depletion layer. Since a potential of the n+ type layer 23 exceeds that level, breakdown is prevented at that location.

In this embodiment, an n− type buffer layer 20 may be provided at the bottom of the device as in the case of the diode shown in FIG. 8.

Figure 12:
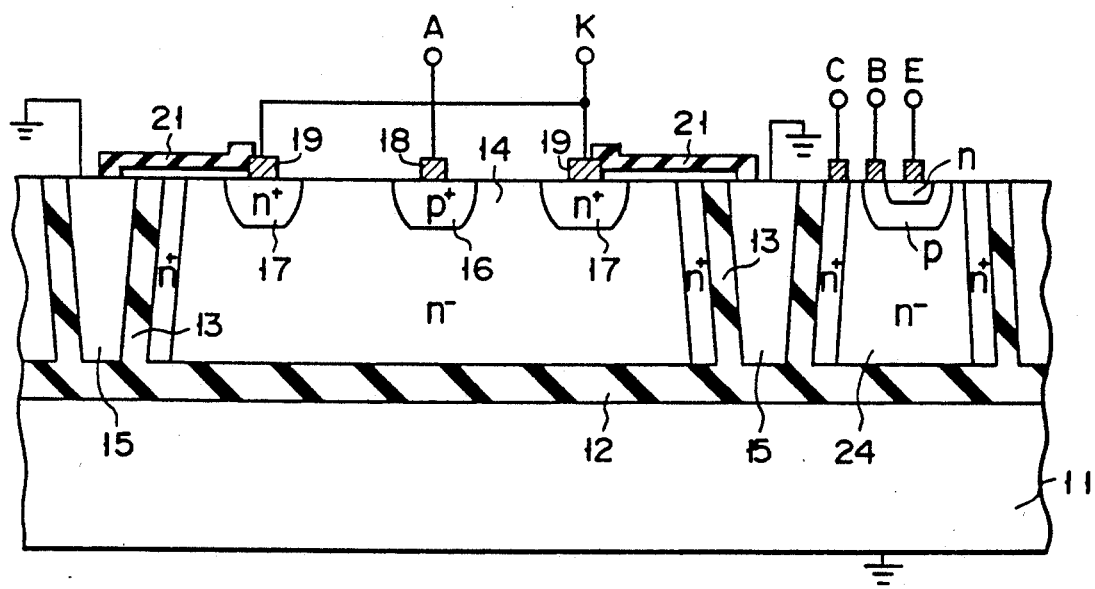
FIG. 12 is a sectional view showing a modified form of the device of FIG. 11.

FIG. 12 shows an embodiment of the present invention similar to that of FIG. 11 except that, as in the case of the embodiment shown in FIG. 6, a high resistance film 21 is provided between an n+ type region 17 and a polycrystalline silicon film 15. Since, in this case, a uniform potential gradient occurs at that film, a high breakdown voltage can be obtained according to this invention. An n− type buffer layer may be formed at the bottom of the device.

FIG. 13 shows an embodiment similar to that of FIG. 8 except that a high resistance film 26 is connected across a p+ type region 16 and an n+ type layer 23. A higher breakdown voltage can be achieved by creating a uniform potential gradient. In this embodiment, it may be possible to omit an n− type layer 20 which is located at the bottom of the device.

FIG. 14 shows an embodiment similar to that of FIG. 13 except that the p+ type region 16 and n+ type region 17 of the FIG. 13 embodiment are exchanged with an n+ type region 17 and p+ type region 16, respectively. A high breakdown voltage device can also be obtained by providing a high resistance film 26. It may be possible to omit an n− type layer 20. FIG. 15 is a variant, similar to the device of FIG. 2, having an n type region 27 formed on an inner surface of an n+ type region 27 unlike the device of FIG. 2.

FIG. 16 shows a variant, similar to the diode of FIG. 7, where an n+ type cathode region 17 and p type anode regions 16, 22 are formed in place of the counterparts of the diode of FIG. 7. When, under high bias voltage, a depletion layer reaches an oxide film 12 from the p+ type region 16, no further potential rise occurs beyond that place and hence a high breakdown voltage is obtained even in the absence of a p− type region 22 which is formed outside the p+ type region 16.

Figure 17:
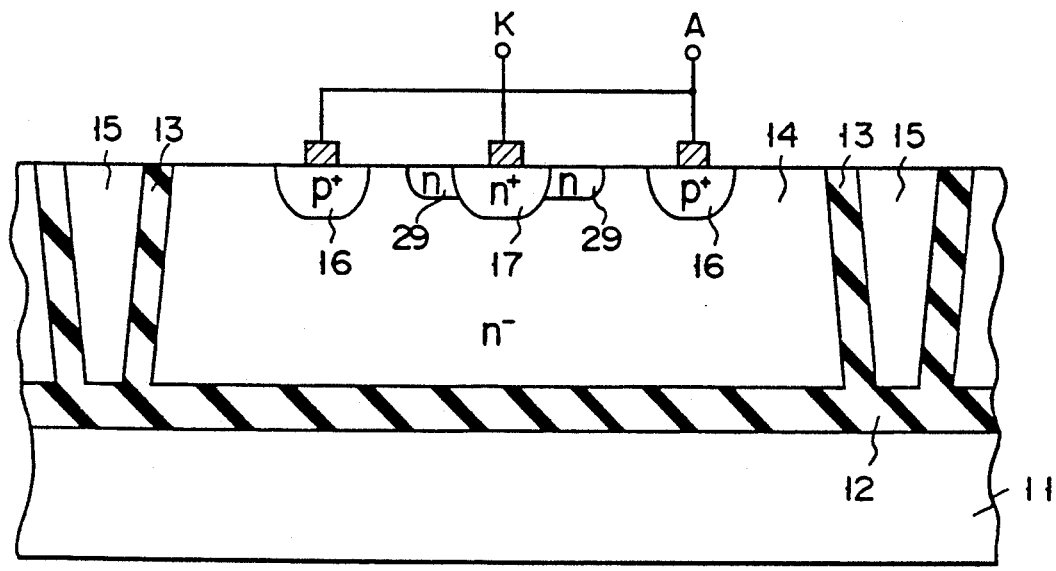
FIG. 17 is a sectional view showing a modified form of the device of FIG. 2.

FIG. 17 shows a variant, similar to the device of FIG. 2, where a p+ type region 16 and n+ type region 17 are used in place of the counterparts of FIG. 2 and an n type region 29 is formed around the n+ type region 17.

Figure 18:
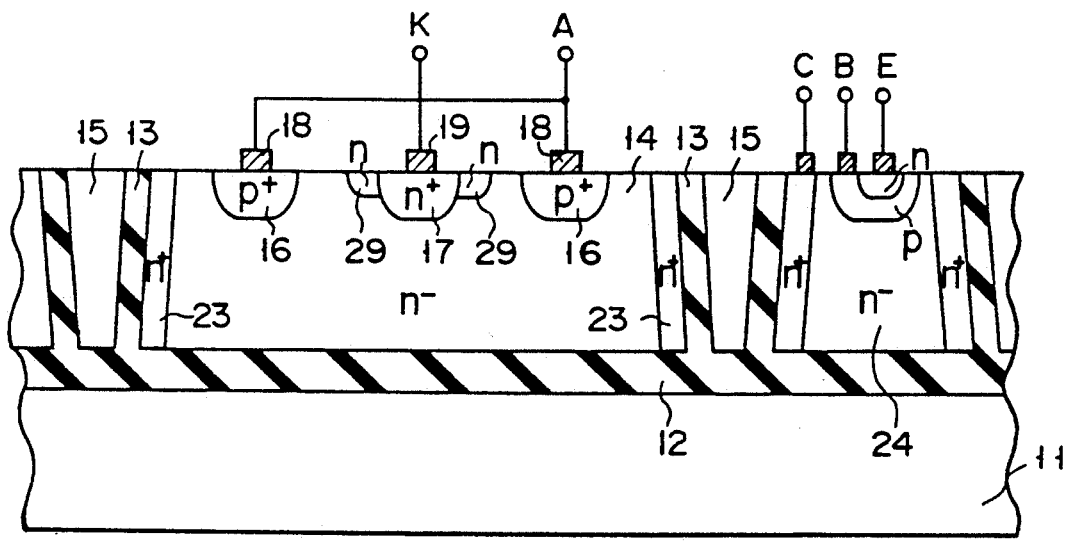
FIG. 18 is a sectional view showing a modified form of the device of FIG. 7.

FIG. 18 is a variant, similar to the device of FIG. 9, where unlike the device of FIG. 9 an n type region 29 is formed around an n+ type region 17.

FIG. 19 is a variant, similar to the device of FIG. 11, where unlike the device of FIG. 11 a p− type region 22 is formed around a p+ type region 16 so as to alleviate an electric field concentration at a pn junction.

FIG. 20 is a variant, similar to FIG. 11, where unlike the device of FIG. 11 an n type region 27 is formed on an inner surface of an n+ type region 17.

In the device of FIGS. 15 to 20, an n− type buffer layer may be formed at the bottom of the high resistance silicon layer 14.

In the aforementioned embodiment, an underlying substrate may be made of an insulating substance whose thermal expansion coefficient is near that of silicon.

According to the present invention, there is provided a semiconductor device of dielectric isolation in which a second low resistance semiconductor region of a first conductivity type is formed in the surface portion of a high resistance semiconductor layer (first semiconductor region) of which the impurity concentration is sufficiently low and which is isolated by an isolating layer and a third low resistance semiconductor region of a second conductivity type is spaced a predetermined distance apart from the second low resistance semiconductor region, whereby it is possible to, even if the high resistance semiconductor layer is thin, obtain an adequately high breakdown voltage characteristic with a portion of a reverse bias application voltage to the device burned by a thinner insulating film and the suppression of an electric field in the insulation film done to a not too greater extent.

Further, various embodiments of the present invention will now be described.

FIG. 21 is a cross-sectional view of a high breakdown voltage diode according to an embodiment of the invention. Numeral 101 denotes a single crystalline (or polycrystalline) silicon substrate. An island-like high resistance silicon layer 104 is formed above the substrate 101. The silicon layer 104 is isolated from the substrate 101 by an oxide layer 102 (first insulating layer) and isolated laterally from other element regions by an oxide layer 103 (second insulating layer). The underlying oxide layer 102 has a thickness not less than 1 μm. The high resistance silicon layer 104 is of n− type (or p− type). An element isolation region is formed by making a trench. After the oxide layer 103 is formed in the trench, a polysilicon layer 105 is buried in the trench.

A high impurity concentration n+ region 106 which becomes a cathode region is formed in a central surface portion of the high resistance silicon layer 104. A high impurity concentration p+ region 107 which becomes an anode region is formed in a peripheral surface portion of the high resistance silicon layer 104. The p+ region 107 is formed to surround the n+ layer, when viewed from above. A cathode electrode 108 is formed on the n+ region 106, and an anode electrode 109 is formed on the p+ region 107.

The process of fabricating the high breakdown voltage diode will now be described. First, the silicon substrate 101 and a high resistance silicon substrate corresponding to the high resistance silicon layer 104 are directly attached to each other by means of direct bonding technique. Specifically, the two substrates are mirror-polished and the polished surfaces are closely attached in a clean atmosphere and integrated by a predetermined heat treatment. In this case, by forming the oxide layer in advance on the contact surface of one of the substrates, the integrated substrates which are electrically isolated, as shown in FIG. 21, is obtained. The high resistance silicon substrate is then polished to obtain the high resistance silicon layer 104 having a predetermined thickness necessary for the formation of an element region. Thereafter, a trench is made in the element isolation region, and the oxide layer 103 is formed on the side surface of the high resistance silicon layer 104 which is isolated like an island. After the polysilicon layer 105 is buried in the isolation trench, the n+ region 106 and p+ region 107 are successively formed, and finally the electrodes 108 and 109 are formed.

In the high breakdown voltage diode having the above structure, the substrate 101 and electrode 109, for example, are grounded, and a positive potential is applied to the electrode 108. In this case, a pn junction is reversely biased and a depletion layer extends within the high resistance silicon layer 104. In addition, a depletion layer extends upwards from the interface of the oxide layer 102 and high resistance silicon layer 104.

When a voltage of a predetermined value is applied, the high resistance silicon layer 104 is filled with the depletion layer, and a strong electric field is generated downwards from the n+ region 106 within the high resistance silicon layer 104. In this embodiment, however, the thickness of only the oxide layer 102 is increased to 1 µm or more. Thus, most of the applied voltage is shared by the oxide layer 102 and the value of the electric field in the high resistance silicon layer 104 is reduced to a level at which an avalanche breakdown does not occur. Specifically, even if the thickness of the high resistance silicon layer 104 is, for example, only 20 µm, a high breakdown voltage of 350 V or more can be obtained. If the thickness of the oxide layer 102 is increased to 2 µm or more, a higher breakdown voltage of 450 V or more can be obtained.

In the element forming process, a positive interface charge is naturally generated at the interface of the high resistance silicon layer 104 and oxide layer 102. In the case where the high resistance silicon layer 104 is of n type, the interface charge functions to weaken the vertical electric field in the silicon layer 104. This effect contributes to the high breakdown voltage characteristic.

FIG. 22 shows an embodiment wherein in the element structure shown in FIG. 21 an n− buffer layer 110 of a low impurity concentration (which is higher than that of the high resistance silicon layer 104) is provided on the bottom of the high resistance silicon layer 104. The total impurity quantity per unit area of the buffer layer 110 is not greater than $3 \times 10^{12}/cm^2$, and is preferably 0.5 to $2.0 \times 10^{12}/cm^2$.

In this embodiment, when a reverse bias is applied across the anode and cathode to deplete the buffer layer 110, a positive space-charge is generated in the buffer layer 110. Since the space-charge functions to weaken the electric field within the high resistance silicon layer 104, a high breakdown voltage is obtained.

Figure 23:
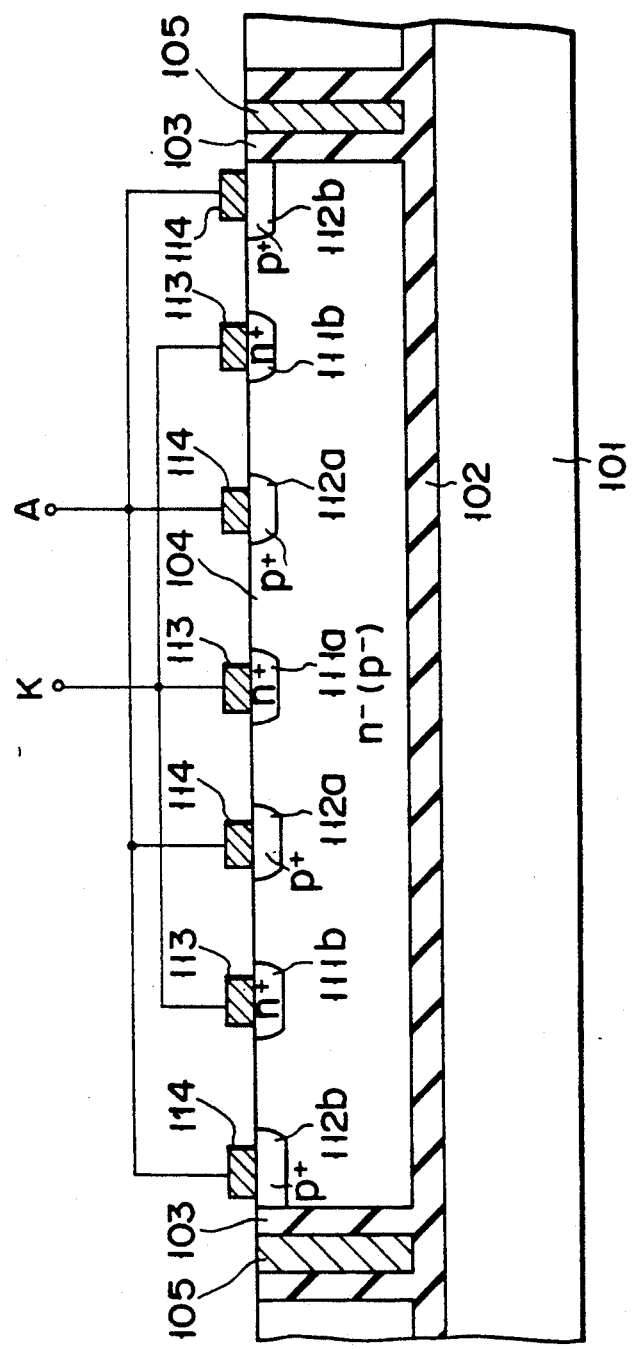
FIG. 23 is a sectional view showing a modified form of the diode shown in FIG. 21.

The structure shown in FIG. 23 is based on that of FIG. 21. In the structure of FIG. 23, n+ regions 111 serving as cathode regions and p+ region 112 serving as anode regions are formed alternately. For example, an n+ region 111a is formed at a central area of the high resistance silicon layer 104 and a ring-like p+ region 112a is formed to surround the n+ region 111a with a predetermined distance therebetween. A ring-like n+ region 111b is formed outside the p+ region 112a with a predetermined distance therebetween. Further, a ring-like p+ region 112b is formed outside the n+ region 111b at the peripheral part of the high resistance silicon layer. The n+ regions 111 are provided with cathode electrodes 113, and the p+ regions 112 are provided with anode electrodes 114. This concentric ring-like pattern may be replaced with a stripe-like pattern.

The use of the structure of this embodiment is effective when the element area is large and it is necessary to divide and uniform the cathode current. When a reverse bias is applied across the cathode electrodes 113 and anode electrodes 114, electric fields extending downwards from the n+ regions 111, as in the embodiment of FIG. 21. In this embodiment, too, a high breakdown voltage can be obtained since the thickness of the oxide layer 102 is large and not less than 1 µm.

In the following embodiments, too, it is effective to alternately arrange a number of n+ regions and p+ regions, in order to reduce the ON-resistance of the element.

Figure 24:
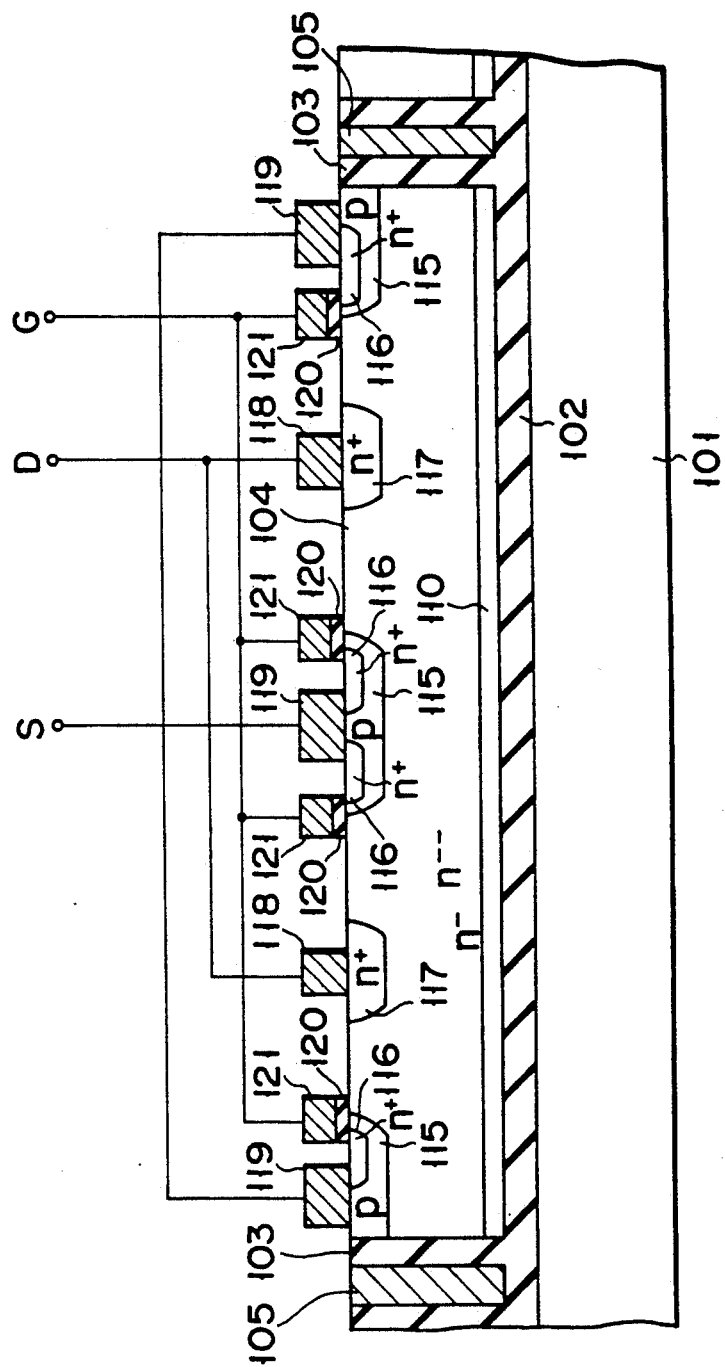
FIG. 24 is a sectional view showing a modified form of the diode shown in FIG. 22.

The structure shown in FIG. 24 is based on that of FIG. 22. In the structure of FIG. 24, a MOSFET is constituted. A p type base region 115 is formed in a surface portion of the high resistance silicon layer 104, and a n+ source region 116 is formed within the p type base region 115. An n+ drain region 117 is formed at a distance from the p type base region 115. A region between the n+ source region 116 of the p type base region 115 and the n− high resistance silicon layer 104 functions as a channel region. A gate electrode 121 is formed above the channel region with a gate oxide layer 120 interposed therebetween. A drain electrode 118 is connected to the n+ drain region 117, and a source electrode 119 is connected to the n+ source region 116. The source electrode 119 is also connected to the p type base region 115. Like in the embodiment shown in FIG. 23, the sources and drains are alternately arranged. The alternate arrangement may be of the stripe type or concentric type.

The MOS FET of this embodiment is driven by applying a voltage to the drain electrode 118, the polarity of which is positive with respect to the source electrode 119. In the off-state in which the gate voltage is zero or negative and no channel is formed in the p type base region 115, the high resistance silicon layer 104 and buffer layer 110 are depleted when a drain-source voltage exceeds a predetermined value. Thereby, a strong electric field extending downwards from the n+ drain region 117 is generated. In this embodiment, like the embodiment shown in FIG. 22, the oxide layer 102 is 1 µm or more thick and the buffer layer 110 is depleted to generate a positive space-charge; therefore, most of the applied voltage is shared by the oxide layer 102 and the electric field in the high resistance silicon layer 104 is weakened. Thus, a high breakdown voltage is obtained.

In a diode structure of the following embodiment, like this embodiment, it is possible to fabricate a MOS FET by forming an n+ source region in a surface portion of a p+ source region and by providing a gate electrode on the source region. In addition, an IGBT can be formed by forming a p+ region in the n+ drain region.

Figure 25:
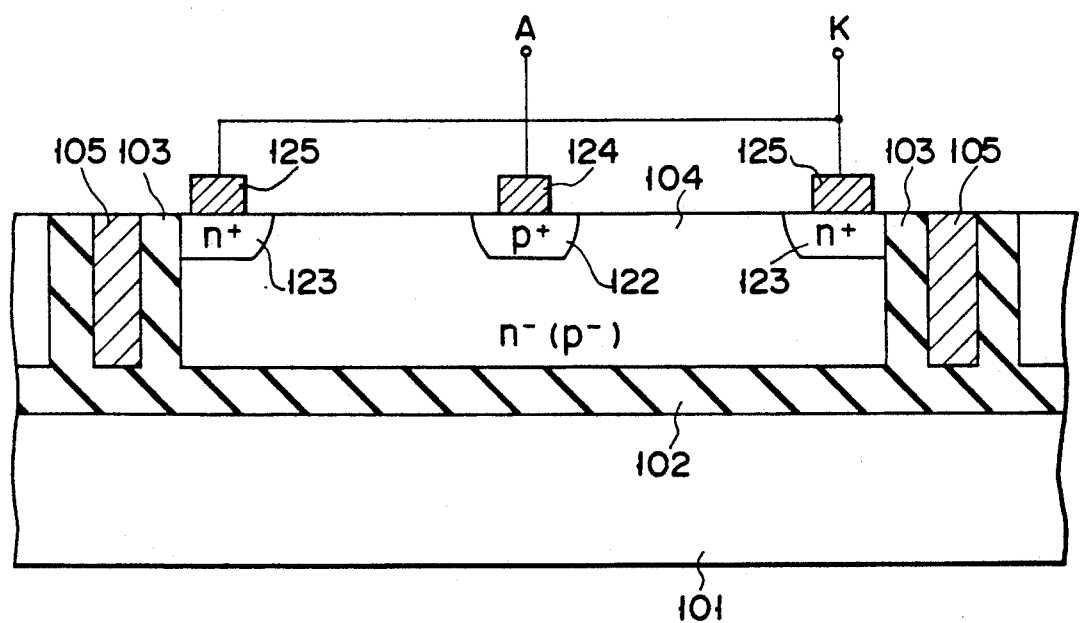
FIG. 25 is a sectional view showing a modified form of the diode shown in FIG. 21.

FIG. 25 shows a high breakdown voltage diode according to an embodiment wherein the conductivity types of the first and second low resistance regions are reversed. Contrary to the embodiment of FIG. 21, a p+ region 122 serving as an anode region is formed in a central surface portion of the high resistance silicon layer 104, and an n+ region 123 serving as a cathode layer is formed in a peripheral surface portion of the silicon layer 104. An anode electrode 124 is formed on the p+ region 122 and a cathode electrode 125 is formed on the n+ region 123. The other structural features are common to those of the embodiment of FIG. 21.

In this embodiment, like the embodiment shown in FIG. 21, the oxide layer 102 is 1 µm or more thick; therefore, most of the applied reverse bias voltage is shared by the oxide layer 102 and a high breakdown voltage is obtained.

Figure 26:
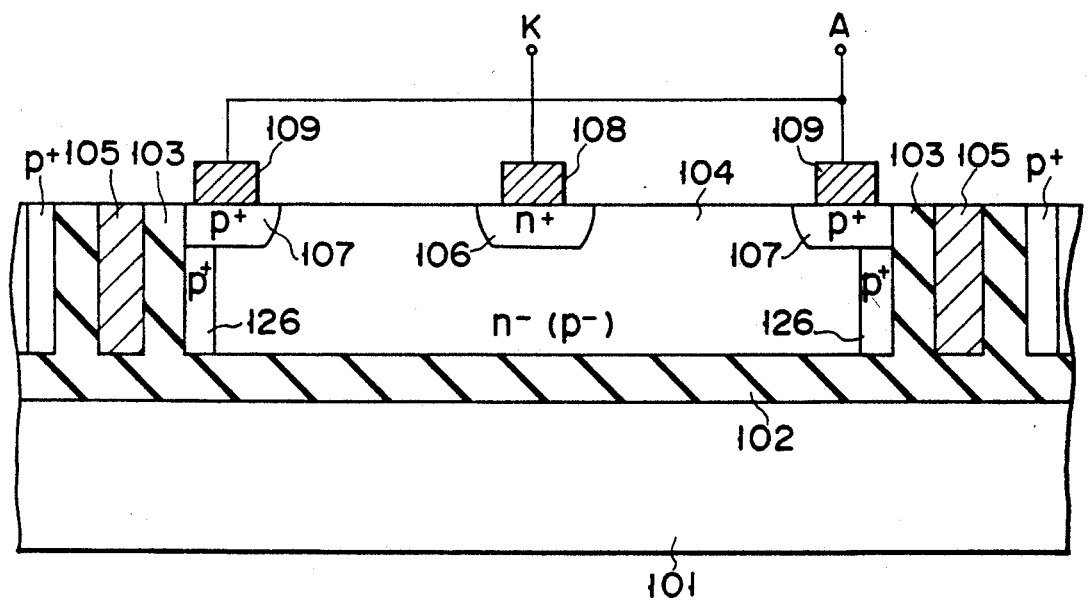
FIG. 26 is a sectional view showing a modified form of the diode shown in FIG. 21.

The structure shown in FIG. 26 is based on that of FIG. 21. In the structure of FIG. 26, a p+ region 126 of a high impurity concentration is formed on the side wall of the high resistance silicon layer 104, i.e. that portion of the silicon layer 104 which is in contact with the oxide layer 103. This diode can be fabricated by diffusing an impurity in the trench-side portion, before the oxide layer 103 is formed following the formation of the element isolation trench, which was described in connection with the process of fabricating the diode shown in FIG. 21.

In this embodiment, too, the oxide layer 102 is 1 μm or more thick, and a high breakdown voltage characteristic is obtained. When the reverse bias is applied, the p+ region 126 on the side of the high resistance silicon layer 104 is kept at a potential equal to that of the p+ region 107 on the surface of the silicon layer 104. Thereby, an unnecessary electric field is not applied across the interface of the oxide layer 103, which is often defective, and the silicon layer 104. This contributes to the enhancement of a high breakdown voltage characteristic.

Figure 27:
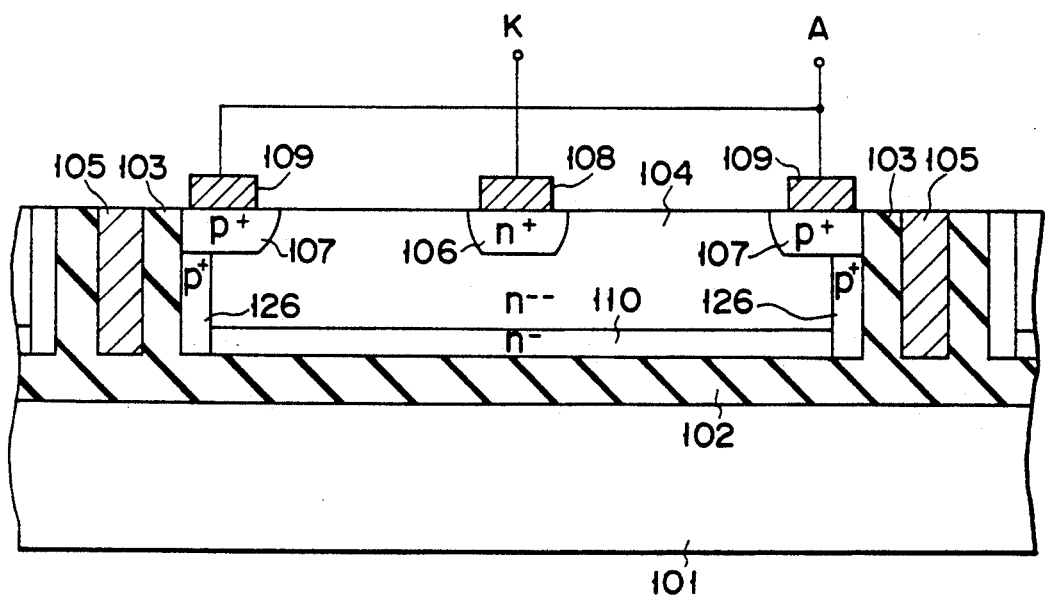
FIG. 27 is a sectional view showing a modified form of the diode shown in FIG. 26.

The structure of FIG. 27 is based on that of FIG. 26, and like the embodiment of FIG. 22 an n− buffer layer 110 is provided on the bottom of the high resistance silicon layer 104. Thereby, a higher breakdown voltage can be obtained.

Figure 28:
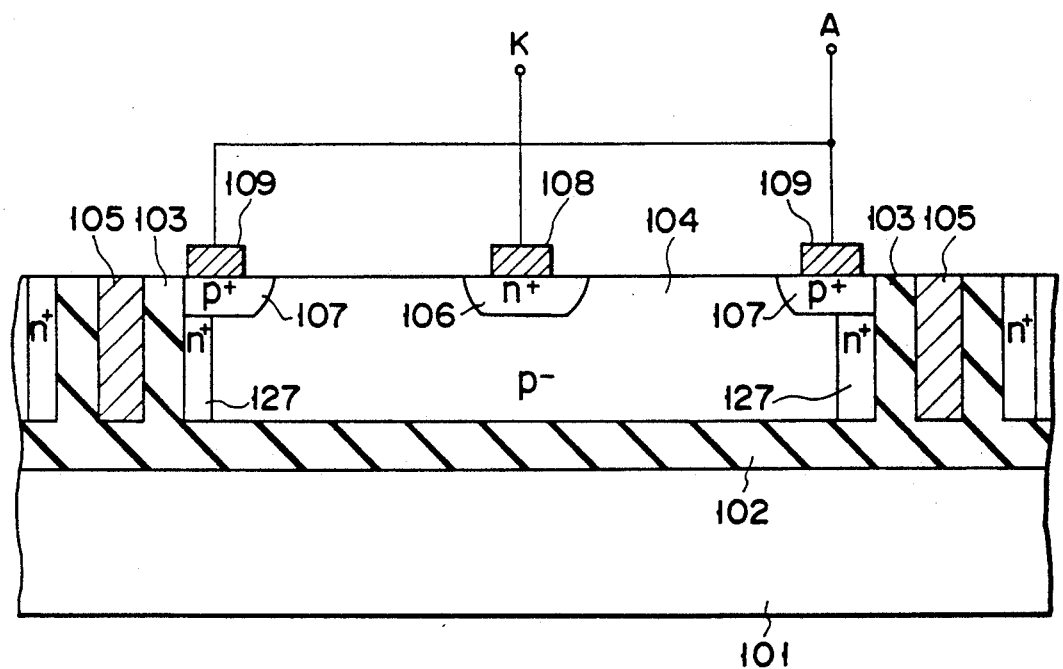
FIG. 28 is a sectional view showing a modified form of the diode shown in FIG. 26.

The structure shown in FIG. 28 is substantially identical to that of FIG. 26, except that the high resistance silicon layer 104 is of p− type, and the side portion of the silicon layer 104 is of n+ region 127, which is opposite to the polarity in the embodiment of FIG. 26.

In this embodiment, the peripheral p+ region 107 is contacted with the n+ region 127; however, the n+ region 127 is not electrically connected to the central n+ region 106. Accordingly, when a reverse bias is applied to this diode, no voltage is applied to the pn junction of the p+ region 107 and n+ region 127, and no breakdown occurs in the pn junction. As a result, the same high breakdown voltage characteristic as in the embodiment of FIG. 21 can be obtained.

Figure 29:
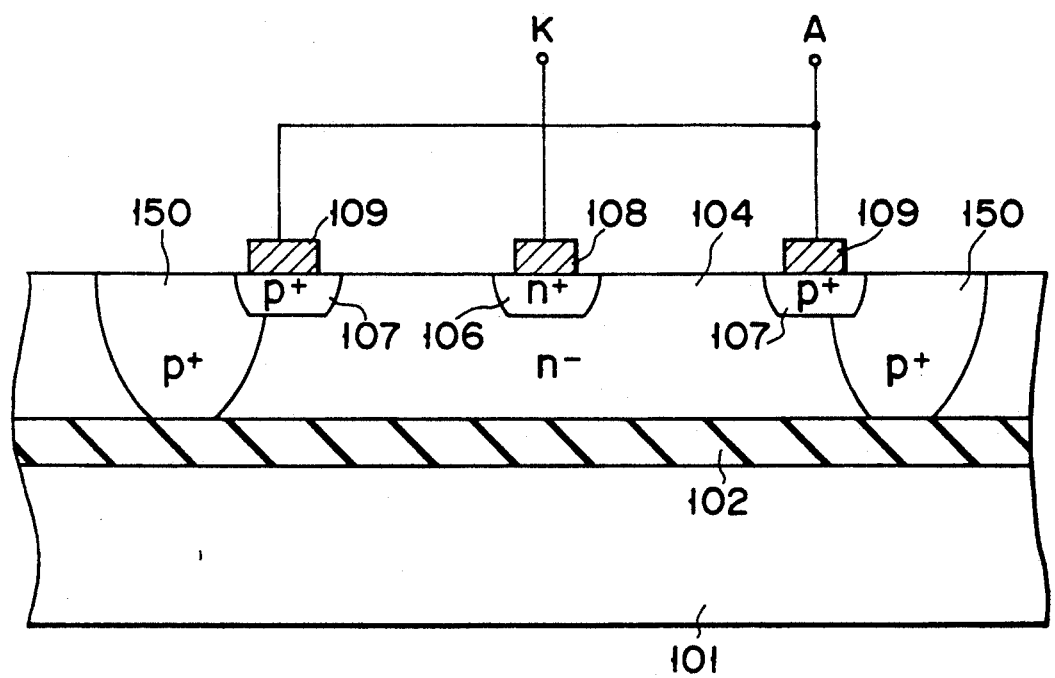
FIG. 29 is a sectional view showing a modified form of the diode shown in FIG. 21.

FIG. 29 shows a high breakdown voltage diode according to an embodiment wherein the lateral element isolation is effected by a pn junction. The high resistance silicon layer 104 is of n− type, and the element isolation is effected by diffusing a p+ region 150 with such a depth as to reach the oxide layer 102, so as to surround the element region. The structural features of this embodiment, other than those relating to the lateral element isolation, are the same as those of the embodiment of FIG. 21. The n+ region 106 serving as the cathode region is formed in the central surface portion of the element region, and the p+ region 107 serving as the anode region is formed in the peripheral surface.

When the reverse bias is applied, the potential of the n+ region 106 rises, and a large potential difference occurs between the n+ region 106 and the substrate 101. However, since the oxide layer 101 is 1 μm or more thick, the electric field in the high resistance silicon layer 104 is kept weak. Therefore, according to this embodiment, too, a high breakdown voltage characteristic can be obtained.

Figure 30:
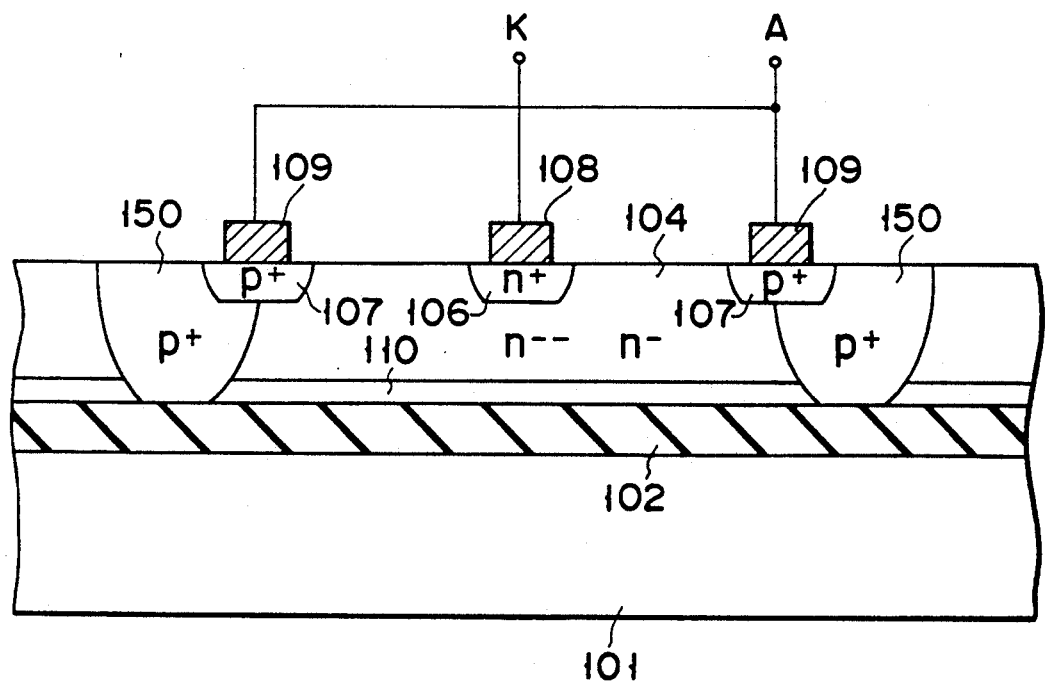
FIG. 30 is a sectional view showing a modified form of the diode shown in FIG. 29.

FIG. 30 shows an embodiment wherein in the structure shown in FIG. 29, a low impurity concentration n− buffer layer 110 is provided on the bottom of the high resistance silicon layer 104. Like the embodiment of FIG. 22, by setting the impurity concentration of the n− buffer layer 110 at an appropriate value, the space-charge in the n− buffer layer 110 weakens the electric field in the high resistance silicon layer 104, when the the buffer layer 110 is depleted by the application of the reverse bias. Thus, a higher breakdown voltage characteristic can be obtained.

The element isolation structure shown in FIG. 31 is based on that of the embodiment of FIG. 30. In the structure of FIG. 31, the positions of the first and second low resistance regions which become the cathode and anode regions of the diode are reversed. A p+ region 122 which becomes the anode region is formed in a central surface portion of the high resistance silicon layer 104 surrounded by a p+ region 129 serving as a lateral element isolation region. An n+ region 123 which becomes the cathode region is formed in that surface portion of the silicon layer 104 which surrounds the p+ region 122 and is separated by a predetermined distance from the p+ region 129 of the element isolation region. An n+ region 128 is formed to such a depth as to reach the oxide layer 102, so as to partially overlap the n+ region 123. An anode electrode 124 is formed on the p+ region 122, and a cathode electrode 125 is formed on the n+ region 123.

In this embodiment, there is a problem of breakdown between the n+ regions 123 and 128, which are set at a positive high potential when a reverse bias is applied, and the p+ region 129 of the element isolation region which is normally grounded. It is therefore necessary to provide some distance therebetween, as shown in FIG. 31. This embodiment is thus disadvantageous in terms of area; however, it is advantageous in terms of vertical dimension, since a high breakdown voltage can be obtained, like the embodiment of FIG. 30, by virtue of the function of the oxide layer 102 1 μm thick and the buffer layer 110.

FIG. 32 shows an embodiment wherein in the embodiment of FIG. 28, the conductivity type of the high resistance silicon layer 104 is changed from the p− type to the n− type.

In the case of this embodiment, unlike the embodiment shown in FIG. 28, the n+ layer 106 at the central surface portion of the silicon layer 104 is not isolated from the n+ region 127 at the side portion of the silicon layer 104. Thus, when the reverse bias is applied, there is a problem regarding the breakdown voltage at the pn junction 130 between the peripheral p+ region 107 and n+ region 127. However, if the thickness of the oxide layer 102, and the impurity concentration and thickness of the high resistance silicon layer 104, are designed to optimal values, an adequately high breakdown voltage can be obtained. The reason will now be stated with reference to FIGS. 33 and 34.

As is shown in FIG. 33, when the reverse bias is applied, a depletion layer 151 extends downwards from the p+ layer 107, and at the same time a depletion layer 152 extends upwards from the oxide layer 102. If the reverse bias is increased, the depletion layers 151 and 152 blend into one, as shown in FIG. 34. Once the depletion layers 151 and 152 are integrated, the peripheral n+ region 127 is electrically isolated from the central n+ region 106. Even if the reverse bias is increased further, the potential of the n+ region 127 does not vary in accordance with the n+ region 106. Thus, if the relation, $V_0 < V_B$ ($V_0$=reverse bias voltage at the time depletion layers 151 and 152 are integrated, $V_B$=breakdown voltage $V_B$ at pn junction 130), is established, the voltage $V_B$ is not applied to the pn junction 130 and breakdown of pn junction 130 can be prevented.

More specifically, suppose that the depth of the p+ region 107 is 5 μm, and the breakdown voltage $V_B$ of the pn junction 130 is 10 V. In addition, suppose that the width w of the p+ region 107 shown in FIG. 32 is about 10 μm or more. In this case, if the impurity concentration of the high resistance silicon layer 104 is not higher than $1.3 \times 10^{14}/cm^3$, the thickness of layer 104 is 20 μm, and the thickness of the oxide layer 102 is 2 μm, $$V_0 = eC\{2t(\epsilon_x/\epsilon_i)+d-x_j\}^2(d-x_j)^2/[8\epsilon_s\{t(\epsilon_s/\epsilon_i)+d-x_j\}^2]$$

From this equation, it is found that the reverse bias voltage $V_0$ at which the depletion layers extending upwards and downwards are integrated, as shown in FIG. 34, is 10 V or less, and no breakdown voltage $V_B$ is applied to the pn junction 130.

When the value of W is small, the length l shown in FIG. 32 is set at, e.g. 5 μm, the impurity concentration of the high resistance silicon layer 104 is not higher than $1.1 \times 10^{14}/cm^3$, the thickness of the layer 104 is 30 μm, and the thickness of the oxide layer 102 is 2 μm, according to the above-stated simultaneous equations of $V_0$ and x, the value of $V_0$ is 10 V or less. Therefore, breakdown of the pn junction 130 does not occur. Preferably, the thickness of the layer 104 is less than the length l.

As has been described above, according to this embodiment, despite the fact that the breakdown voltage of the pn junction 130 is low, the breakdown of the pn junction 130 can be prevented. Specifically, if the thickness of the oxide layer 102 is 1 μm or more, the high breakdown voltage characteristic is obtained, as in the embodiment of FIG. 21 or FIG. 26.

The structure shown in FIG. 35 is based on that of FIG. 32. In the structure of FIG. 35, an n⁻ buffer layer 110 is provided on the bottom surface of the high resistance silicon layer 104, thereby obtaining a high breakdown voltage.

The embodiment shown in FIG. 36 is a modification of the embodiment of FIG. 32. In FIG. 36, the n⁺ layer 131 adjoining the side wall of the high resistance silicon layer 104 and the oxide layer 103 is exposed to the surface face of the element region, and a lateral pn junction 132 is formed between the region 131 and p⁺ region 107. This structure is obtained by employing the same diffusion layer layout as is shown in FIG. 32. In other words, the structure of FIG. 32 is obtained by making the impurity concentration of the p⁺ region 107 higher than that of the n⁺ region 127, while the structure of FIG. 36 is obtained by making the impurity concentration of the n⁺ region 131 higher than that of the p⁺ region 107. In this embodiment, too, the same high breakdown voltage as in the embodiment of FIG. 32 is obtained.

Figure 37:
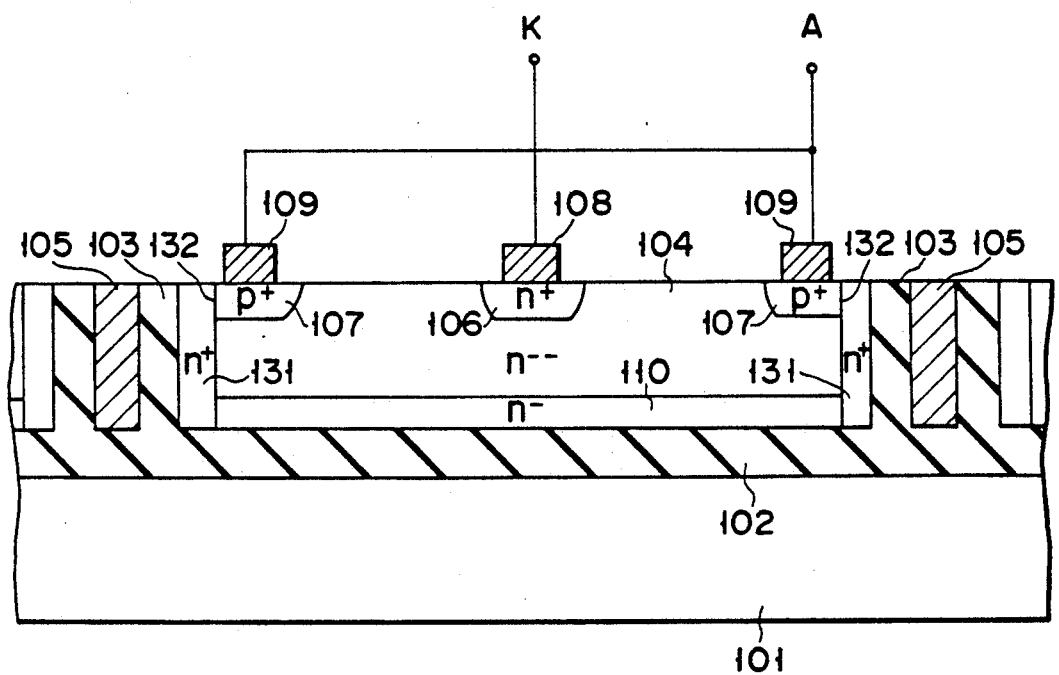
FIG. 37 is a sectional view showing a modified form of the diode shown in FIG. 36.

FIG. 37 shows an embodiment wherein in the structure of FIG. 36 an n⁻ buffer layer 110 is provided on the bottom surface of the high resistance silicon layer 104, thereby obtaining a higher breakdown voltage.

Figure 38:
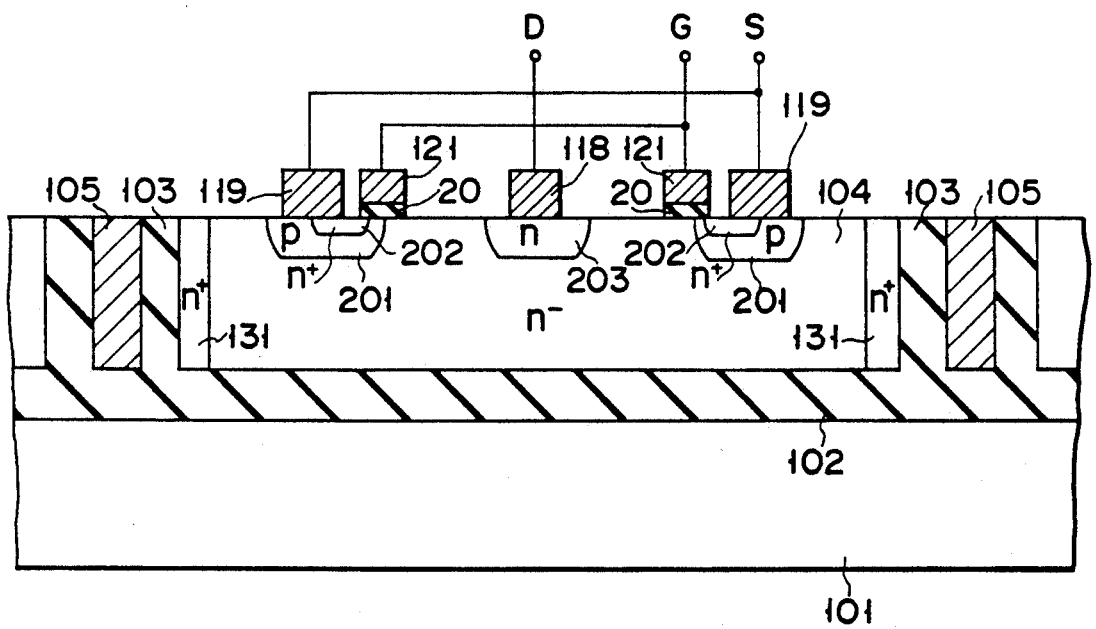
FIG. 38 is a sectional view showing a modified form of the diode shown in FIG. 36.

FIG. 38 shows a MOS FET obtained by modifying the structure of FIG. 36. A p-type region 201 is formed at a distance from the n⁺ region 131 on the side of the high resistance silicon layer 104. An n⁺ region 202 serving as a source is formed in the p-type region 201, and an n-type region 203 serves as a drain. A source electrode 118 is formed on the n-type region 203, and a source electrode 119 is formed to span the p-type region 201 and n⁺ region 202. A gate electrode 121 is formed over the surface of the p-type region 201, which is located between the n⁺ region 202 and the n⁻ high resistance silicon layer 104, with a gate insulating layer 120 interposed between the electrode 121 and the surface of the p-type region 201.

Figure 39:
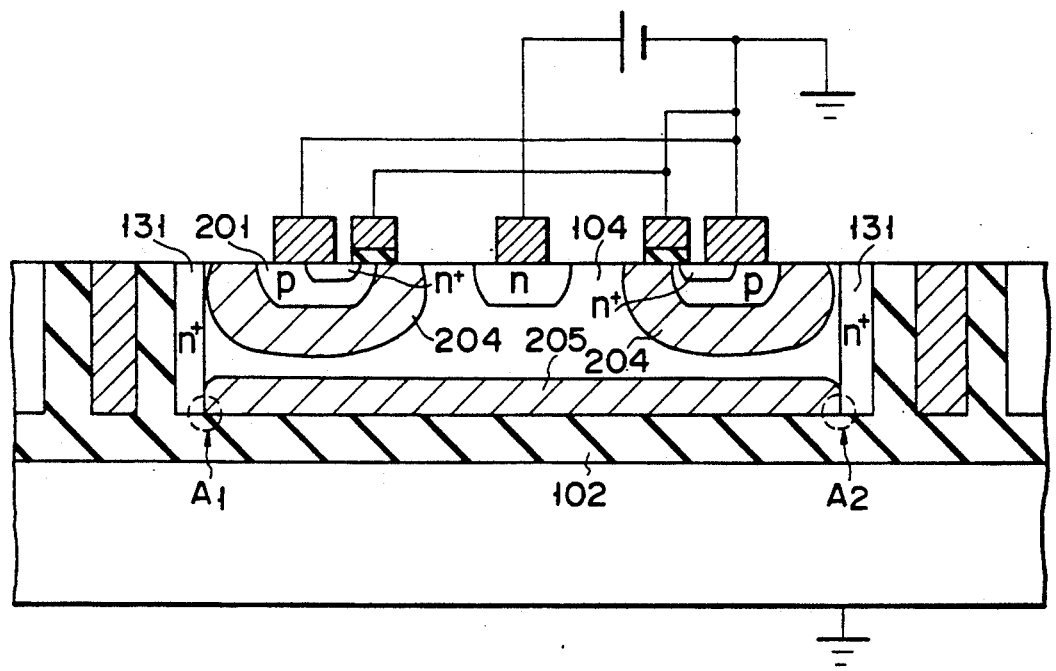
Figure 40:
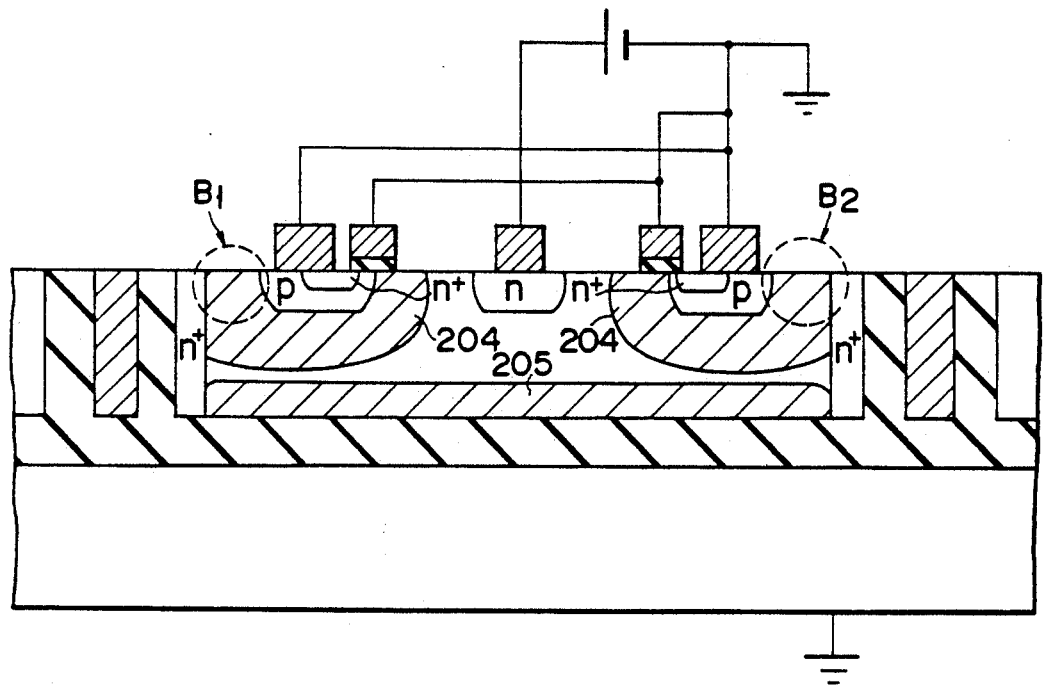

In the MOS FET according to this embodiment, a voltage is applied across the source and drain with the gate held in the OFF state, whereby depletion layers 204 and 205 extend in the high resistance silicon layer 104 from the p-type region 201 and the upper surface of the oxide layer 102, as shown in FIG. 39. At this time, the potential of the n⁺ region 131 is equal to that of the drain, and an electric field is intensified in portions A1 and A2 (enclosed by broken lines) under the region 131. When the applied voltage is increased, the depletion layer 204 about the p-type region 201 reaches the n⁺ side region 131, as shown in FIG. 40. The depletion layers do not extend into the n⁺ region 131. If the applied voltage is further increased, the electric field is intensified in portions B1 and B2 enclosed by broken lines. When the applied voltage is further increased, however, the depletion layers 204 and 205 blend into one, as shown in FIG. 41, before breakdown occurs in the portions B1 and B2. Thus, the potential of the n⁺ region 131 is separated from the drain potential. Thus, no breakdown occurs near the n⁺ region 131.

For example, as in the embodiment shown in FIG. 32, suppose that the thickness of the high resistance silicon layer 104 is 20 μm, the thickness of the oxide layer 102 is 2 μm, the depth of the p-type region 201 is 5 μm, and the impurity concentration of the high resistance silicon layer 104 is $1.3 \times 10^{14}/cm^3$. In this case the depletion layers 204 and 205 are integrated with the applied voltage of about 10 V and the potential difference between the n⁺ region 131 and the source does not increase further. When the depletion layer has extended in the high resistance silicon layer 104 to a limit by the application of high voltage, a strong electric field is generated in the depth direction under the n-type region 203. However, since the oxide layer 102 is thick, a high breakdown voltage characteristic is obtained.

Figure 42:
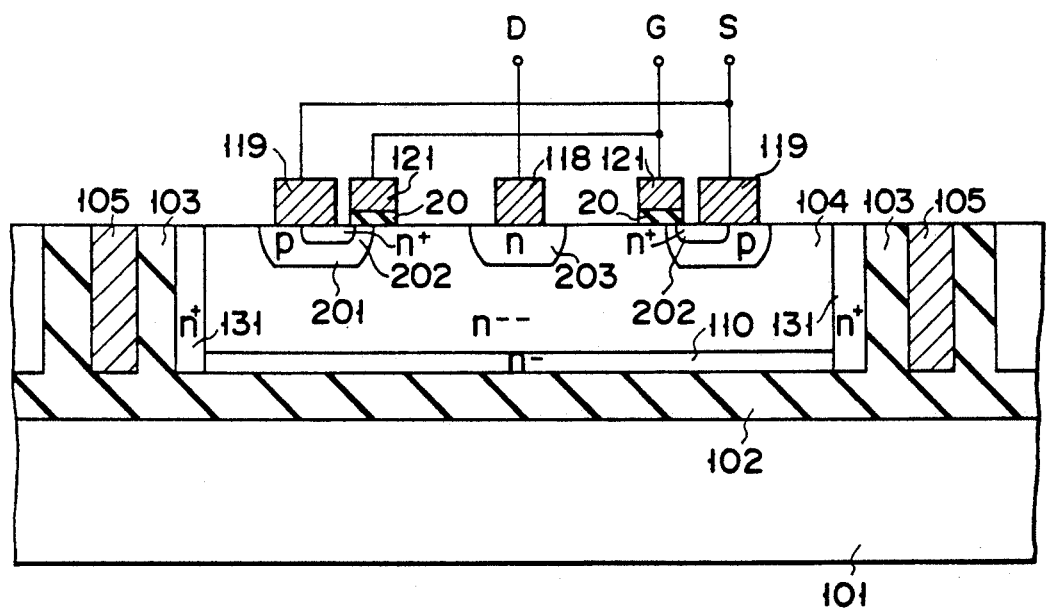
FIG. 42 is a sectional view showing a modified form of the diode shown in FIG. 38.

FIG. 42 shows an embodiment wherein in the structure of FIG. 38 an n⁻ buffer layer 110 is provided on the bottom of the high resistance silicon layer 104, thereby obtaining a higher breakdown voltage.

FIG. 43 shows an embodiment of an IGBT fabricated on the basis of the MOS FET of the embodiment shown in FIG. 38. A p⁺ region 206 serving as a drain region is provided in the n-type region 203. The same high breakdown voltage characteristic as is obtained in the embodiment of FIG. 38 can be obtained.

FIG. 44 shows an embodiment of an MCT fabricated by partially modifying the embodiment of FIG. 43. A p⁺ region 207 is formed in the n⁺ region 202. A cathode electrode 208 is provided to span the p⁺ region 207 and n⁺ region 202. An anode electrode 209 is formed on the p⁺ region 206. A gate electrode 211 is formed above surface portions of the p-type region 201 and n⁺ region 202, which are situated between the p⁺ region 207 and n⁻ high resistance silicon layer 104, with a gate electrode 211 interposed between the gate electrode 211 and the surface portions of the regions 201 and 202.

The MCT of this embodiment is operated by applying a voltage across the anode and cathode such that the potential of the anode is the higher. A gate voltage, which is positive with respect to the cathode potential, is applied to form an n-channel in the surface portion of the p-type region 201, thereby turning on the device. On the other hand, a negative gate voltage is applied to form a p-channel in the surface portion of the n⁺ region 202, thereby turning off the device. In this embodiment, too, the same high breakdown voltage characteristic as is obtained in the embodiment of FIG. 18 is obtained.

Figure 45:
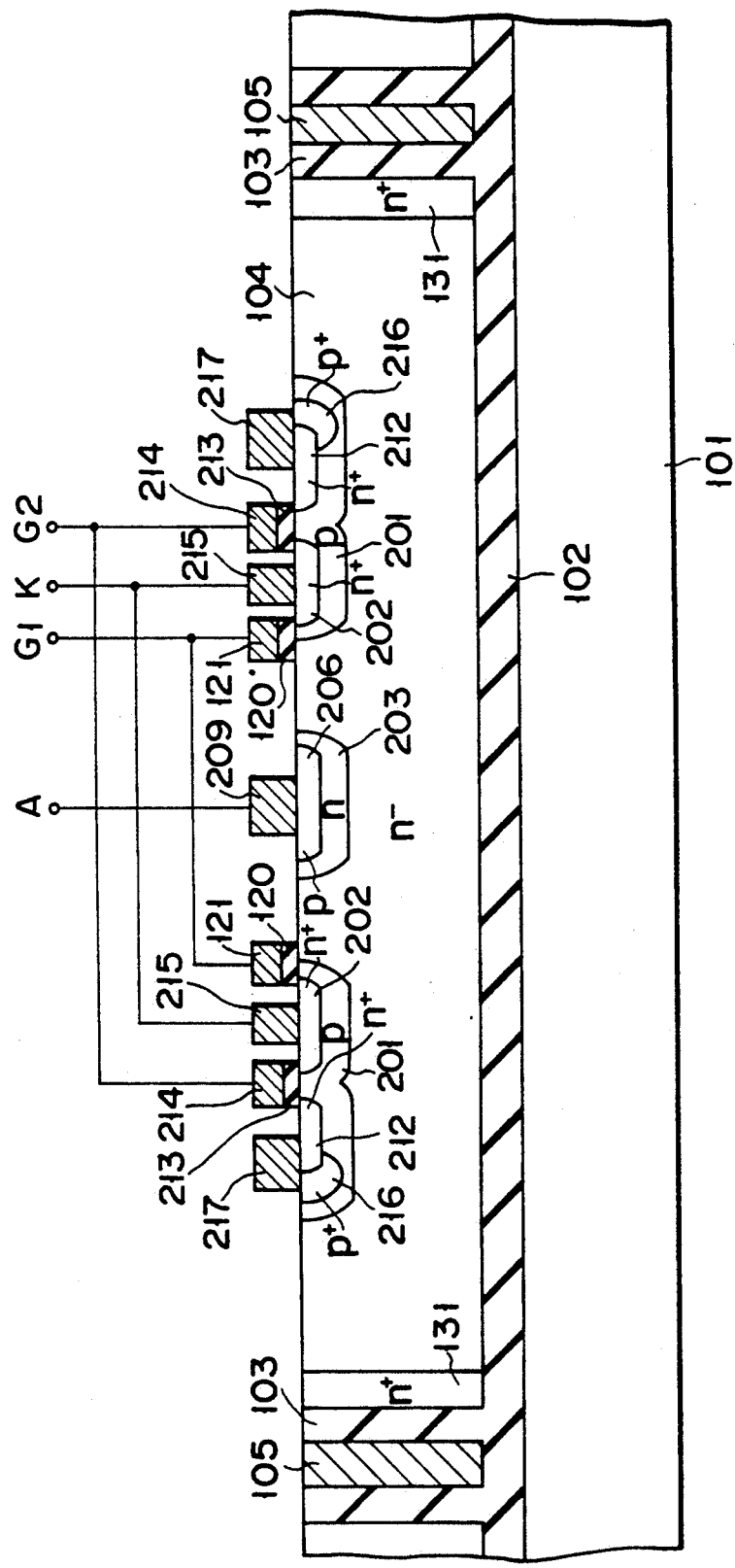
FIG. 45 is a sectional view showing a modified form of the diode shown in FIG. 43.

FIG. 45 shows an embodiment of another MCT which is made by partially modifying the embodiment of FIG. 43. An n⁺ region 212, along with the n⁺ region 202, is formed within the p-type region 202. A second gate electrode 214 is formed above that surface portion of the p+ region 201 which is situated between the n+ region 202 and the n+ region 212, with a gate insulating layer 213 interposed between the gate electrode 124 and this surface portion. A cathode electrode 215 is formed on the n+ region 202, and an anode electrode 209 is formed on the p+ region 206.

A p+ region 216 for battering contact is provided near a boundary of a surface portion of the p-type region 201 and the n+ region 212. An electrode 217 is formed to span the n+ region 212 and the p+ region 216. The electrode 217, however, may be dispensed with.

The device of this embodiment is turned on by the first gate electrode 121, and is turned off by the second gate electrode 214. In this embodiment, too, the same high breakdown voltage characteristic as is obtained in the embodiment of FIG. 38 can be obtained.

Figure 46:
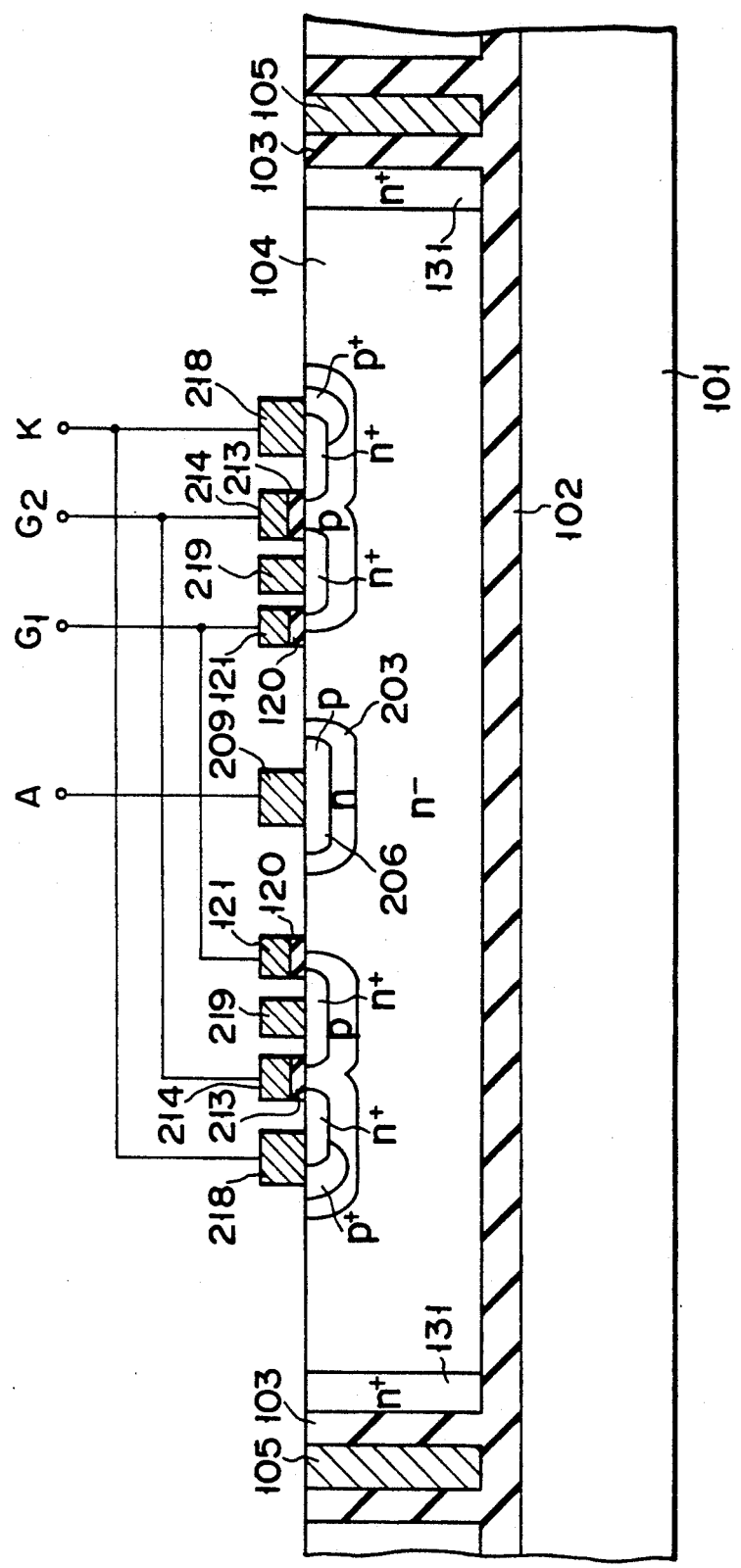
FIG. 46 is a sectional view showing a modified form of the diode shown in FIG. 45.

FIG. 46 shows an EST fabricated by partially modifying the embodiment of FIG. 45. A cathode electrode 218 is formed to span the n+ region 212 and the p+ region 216, and an electrode 219 is formed on the n+ region 202. The electrode 219, however, may be dispensed with.

The device of this embodiment is turned on by both first gate electrode 121 and second gate electrode 214, and is turned off by the second gate electrode 214. In this embodiment, too, the same high breakdown voltage characteristic as is obtained in the embodiment of FIG. 38 can be obtained.

Figure 47:
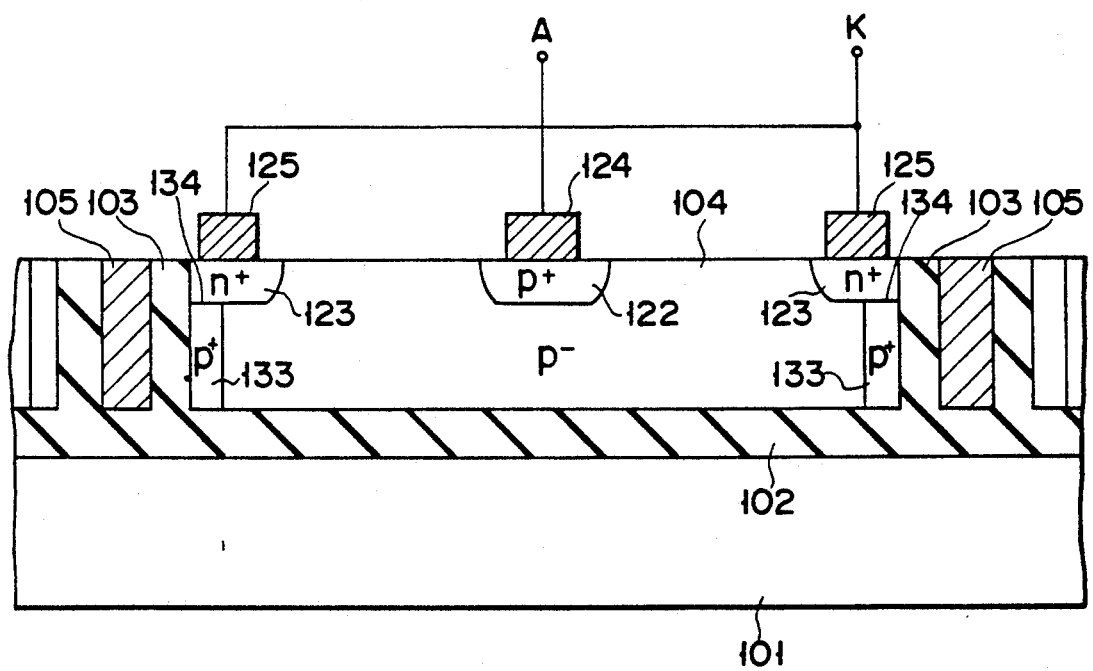
FIG. 47 is a sectional view showing a modified form of the diode shown in FIG. 32.

FIG. 47 shows an embodiment wherein the conductivity types of the respective parts of the embodiment of FIG. 32 are reversed. Specifically, the high resistance silicon layer 104 is of p⁻ type. A p+ region 122 serving as an anode layer is formed in a central surface portion, and an n+ region 123 serving as a cathode layer is formed in a peripheral surface portion. A peripheral p+ region 133 is formed to adjoin the oxide layer 103. A pn junction 134 is formed between the peripheral n+ region 123 and p+ region 133.

In this embodiment, too, the breakdown voltage of the pn junction 134 is low; however, as in the embodiment of FIG. 32, by setting the thickness and impurity concentration of the high resistance silicon layer 104 to optimum values, breakdown of the pn junction 134 can be prevented and the high breakdown voltage characteristic can be obtained.

FIG. 48 shows an embodiment wherein the conductivity types of the respective parts of the embodiment of FIG. 36 are reversed.

Figure 49:
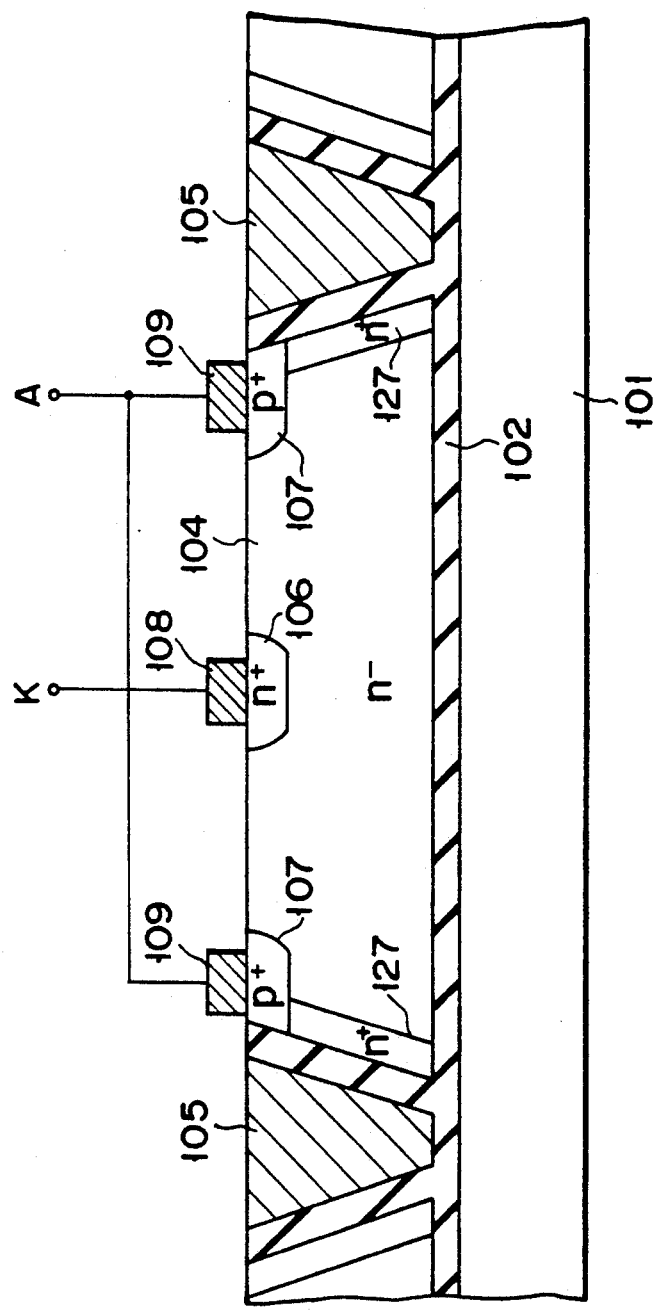
FIG. 49 is a sectional view showing a diode having a V-shaped isolation.

FIG. 49 shows an embodiment wherein the lateral element isolation region has a V-groove, instead of a U-trench. The structure of the diffusion layer is similar to that shown in FIG. 32. This type of V-groove can be made in all preceding embodiments. The V-groove can be made by means of anisotropic etching.

FIG. 50 shows an embodiment which is based on the structure of FIG. 36. In FIG. 50, the p+ region 107 serving as a peripheral anode region is formed to such a depth as to reach the underlying oxide layer 102, and n+ source region 190 is formed in the surface of the p+ region 107, thus constituting a MOSFET. In this MOSFET, a gate electrode 192 is formed on a gate oxide layer 191. The gate oxide layer 191 is formed on a channel region sandwiched between a n+ source region 190 and n⁻ high resistance silicon layer 104. A drain electrode 108 is connected to the n+ region 106, and a source electrode 109 is connected to the n+ source region 190. The source electrode 190 is connected to the p+ region 107 too.

In this embodiment, the central n+ layer 106 is electrically isolated from the peripheral n+ region 131, and, unlike the embodiment of FIG. 36, the regions 106 and 131 are not connected by a neutral region. Accordingly, the breakdown voltage of the pn junction of the peripheral p+ region 107 and n+ region 131 is not influenced by the element breakdown voltage, and a high breakdown voltage characteristic can be obtained.

Figure 51:
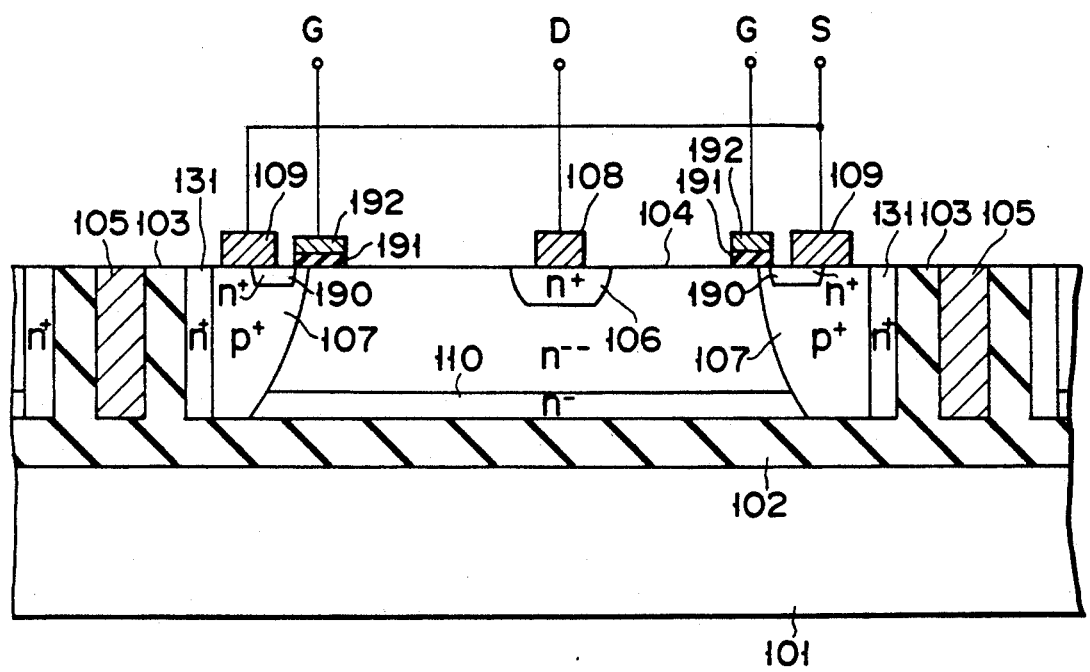
FIG. 51 is a sectional view showing a modified form of the diode shown in FIG. 49.

FIG. 51 shows an embodiment wherein a higher breakdown voltage is obtained by providing an n⁻ buffer layer 110 on the bottom of the high resistance silicon layer 104 in the embodiment of FIG. 49.

Figure 52:
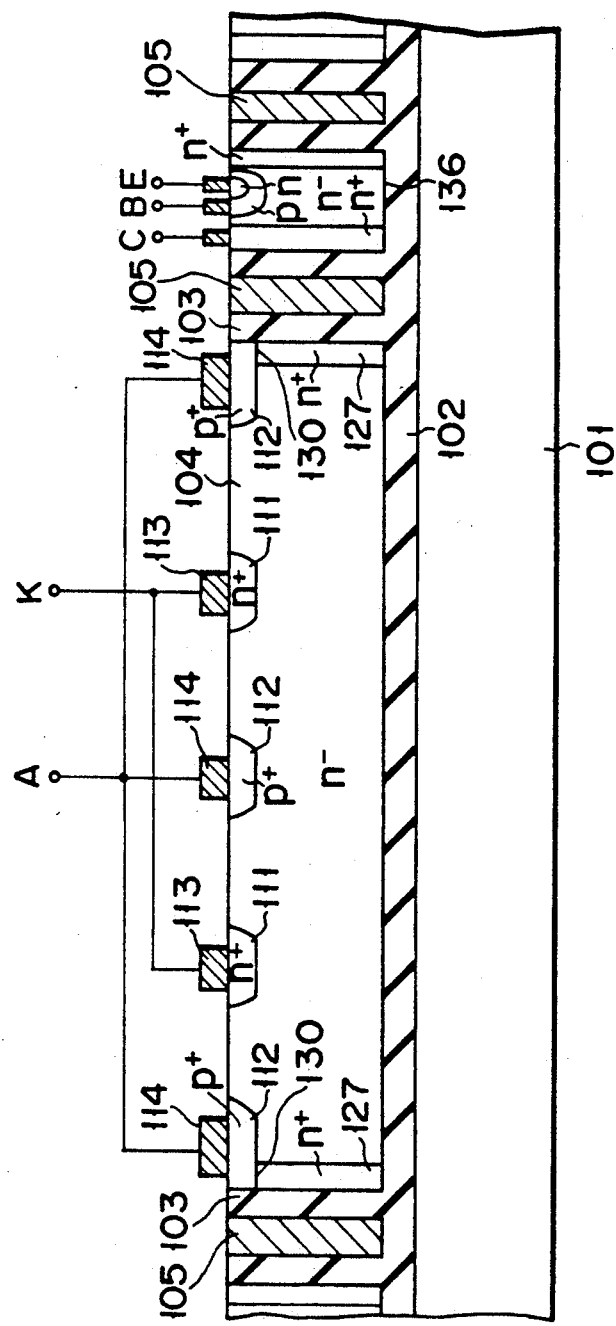
FIG. 52 is a sectional view showing a semiconductor device in which a high breakdown voltage diode and npn transistor are integrated in the same substrate.

FIG. 52 shows an embodiment wherein a high breakdown voltage diode and an npn transistor 136 are integrated on a single substrate. The high breakdown voltage diode is substantially identical to that shown in FIG. 23. The two devices are dielectrically isolated by a trench groove. An n+ region is formed by diffusion on the trench side portion of the npn transistor 136, thereby to reduce the collector resistance. The n+ diffused region is formed after the trench is formed and before the oxide layer 103 is formed on the side wall of the trench. At the same time, an n+ region 127 is formed on the side wall of the trench on the side of the high breakdown voltage diode region. For example, the n+ side region 127 in the embodiments of FIGS. 28 and 32 is formed under the same situation.

On the high breakdown voltage diode side, a pn junction 130 having a low breakdown voltage is formed between the peripheral p+ region 112 and n+ region 127. Like the embodiment of FIG. 32, by setting the impurity concentration and thickness of the high resistance silicon layer 104, the breakdown of the pn junction 130 can be prevented.

Figure 53:
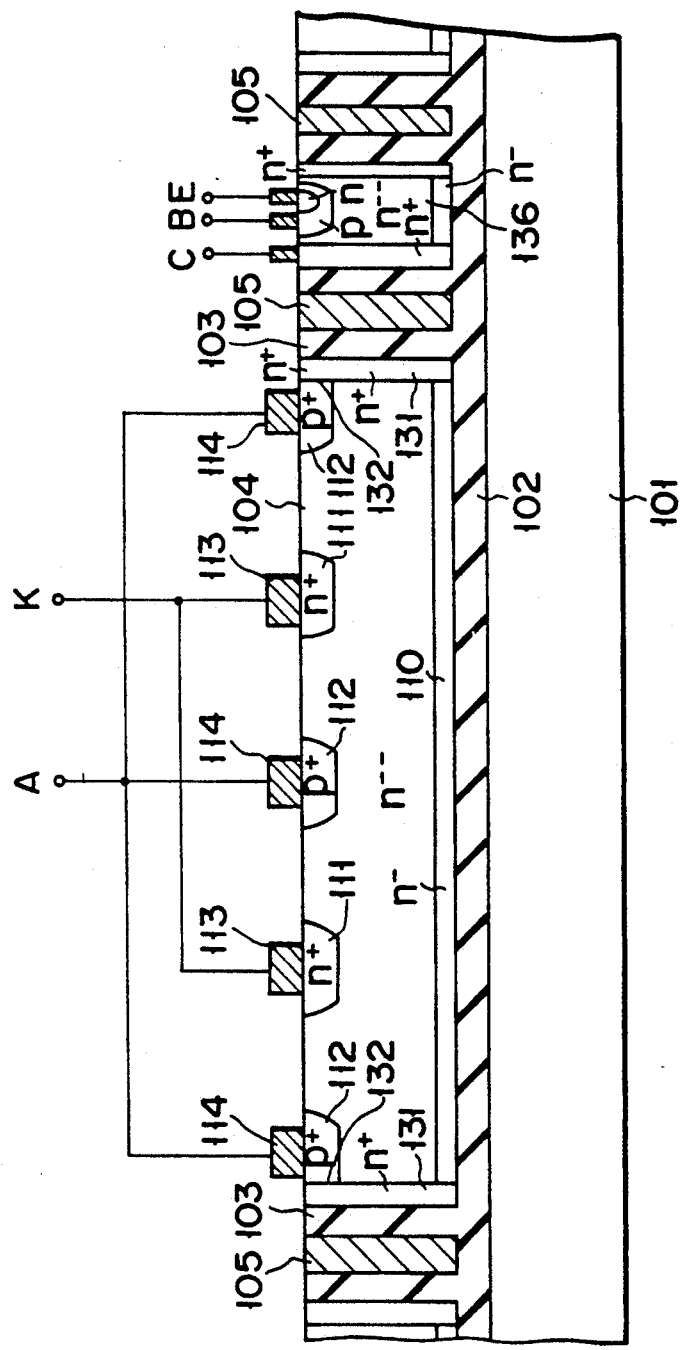
FIG. 53 is a sectional view showing a modified form of the diode shown in FIG. 52.

FIG. 53 shows a modification wherein the embodiment of FIG. 52 is partially modified. The n+ side region 131 of the high breakdown voltage diode is exposed to the surface of the device, and in this state a lateral pn junction 132 is formed between the region 131 and the p+ region 113. This structure is the same as that of FIG. 36. In this embodiment, too, the n+ region 131 is isolated from the cathode electrode by the depletion layer upon application of the reverse bias, and a high breakdown voltage is obtained. In addition, a higher breakdown voltage is obtained by providing an n⁻ buffer layer 110 on the bottom of the high resistance silicon layer 104.

Figure 54:
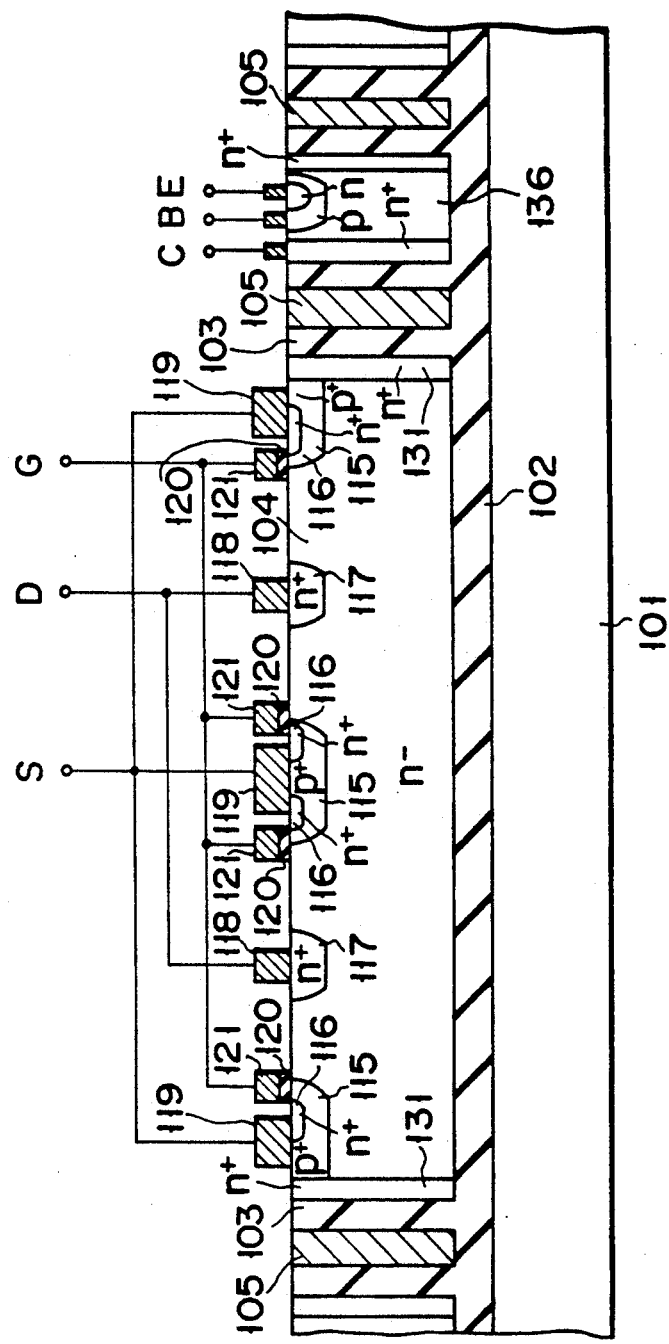
FIG. 54 is a sectional view showing a semiconductor device in which a high breakdown voltage MOSFET and npn transistor are integrated in the same substrate.

FIG. 54 shows an embodiment wherein a high breakdown voltage MOS FET and an npn transistor 136 are integrated on a single substrate. The structure of the high breakdown voltage MOS FET is the same as is shown in FIG. 24. Because of the same situation as described in connection with the embodiment of FIG. 52, an n+ region 131 is formed on the side wall of the high breakdown voltage MOS FET.

A reverse bias is applied across the source and drain of the MOS FET of this embodiment, with the gate voltage kept at zero or a negative value. At this time, once a depletion layer extending downwards from the p⁻ type base region 115 and a depletion layer extending upwards from the oxide layer 102 have been linked together, the peripheral n+ region 131 is isolated from the drain region or n+ region 117 and is floated. If the reverse bias voltage in this condition is lower than the breakdown voltage of the pn junction between the p⁻ type base region 115 and n+ region 131, the breakdown of the pn junction can be prevented. Accordingly, a high breakdown voltage characteristic of the MOS FET can be obtained.

Figure 55:
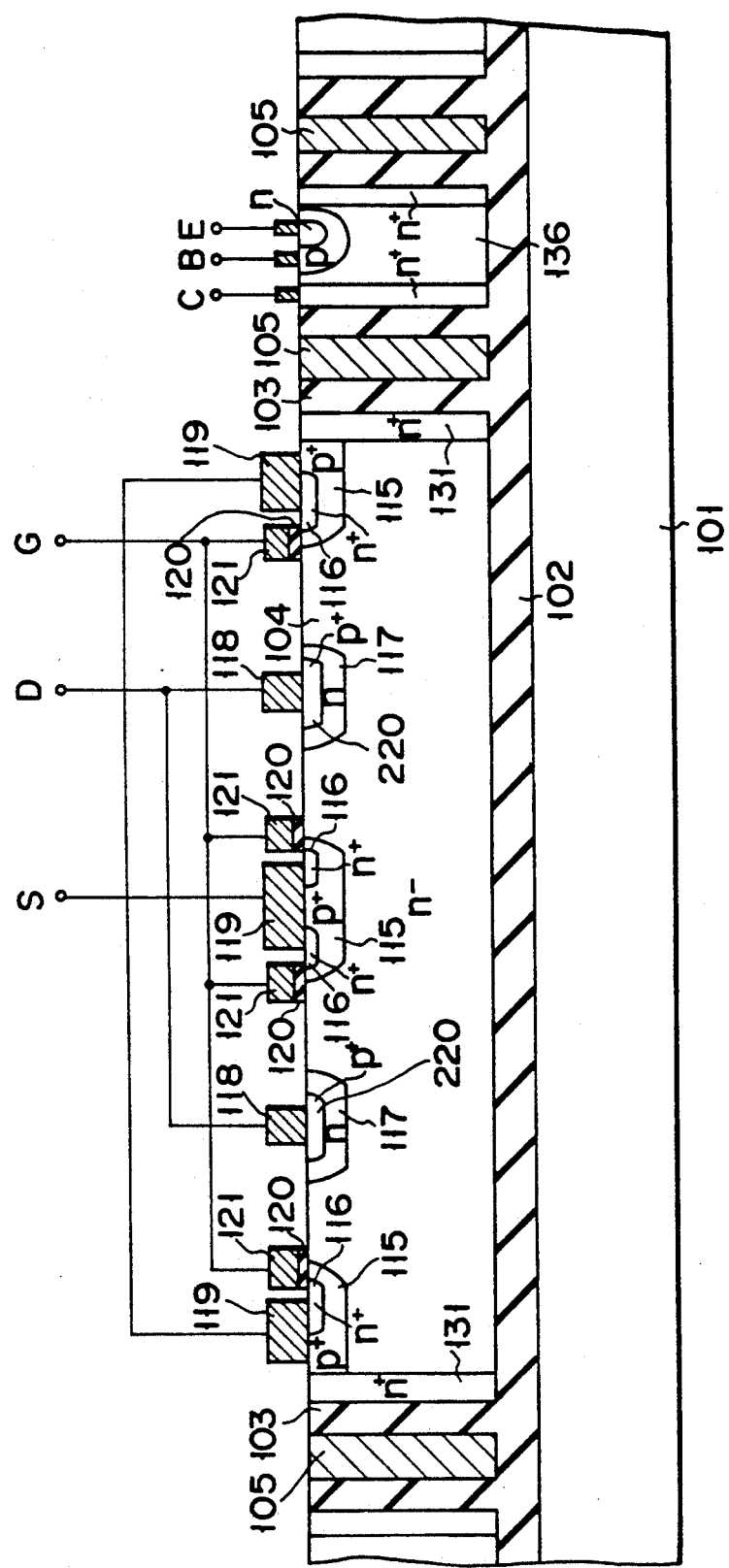
FIG. 55 is a sectional view showing a modified form of the diode shown in FIG. 54.

FIG. 55 shows an IGBT which is obtained by partially modifying the MOS FET of FIG. 54. A p+ drain region 220 is formed in the n-type region 117. The high breakdown voltage characteristic of this IGBT is the same as that of FIG. 54. The source region of the IGBT may be modified, as shown in FIGS. 44, 45 and 46, thereby constituting an MCT or an EST.

FIG. 56 is a cross-sectional view showing part of an embodiment wherein a high resistance layer 221 such as SIPOS is formed between the source and drain of the IGBT shown in FIG. 55. An insulating layer 222 is formed on that surface portion of the high resistance silicon layer 4, which is located between the p-type base region 115 and p+ drain region 220. On the insulating layer 222, the high resistance layer 221 serving as a resistant region plate can be provided. One end of the high resistance layer 221 is connected to the surface of the n+ source region 116, and the other end thereof is connected to the surface of the p+ drain layer 220 and drain electrode 118.

In this embodiment, by virtue of the effect of the resistive field plate of the high resistance layer 221, the high breakdown voltage characteristic of the IGBT in the embodiment of FIG. 55 is enhanced. Since one end of the high resistance region 221 is connected to the surface of the p+ drain region 220, it may be isolated from the drain electrode 118. In addition, the other end of the region 221 may be connected to the source electrode 119.

In the preceding embodiments, too, the high breakdown voltage characteristic ca be enhanced by providing the high resistance layer such as SIPOS between the source and drain or between the anode and cathode.

FIG. 57 shows an embodiment wherein the drain-side connection of the high resistance layer 221 in the IGBT of FIG. 56 is modified. A polysilicon electrode 228 is formed on the drain-side insulating layer 222, and the electrode 228 is connected to one end of the high resistance layer 221 and the drain electrode 118. The polysilicon electrode 228 is provided in order to better the connection between the high resistance layer 221 and the drain electrode 118, and it can function as a field plate. The source-side end portion of the high resistance layer 221 may be connected to the source electrode 119.

Figure 58:
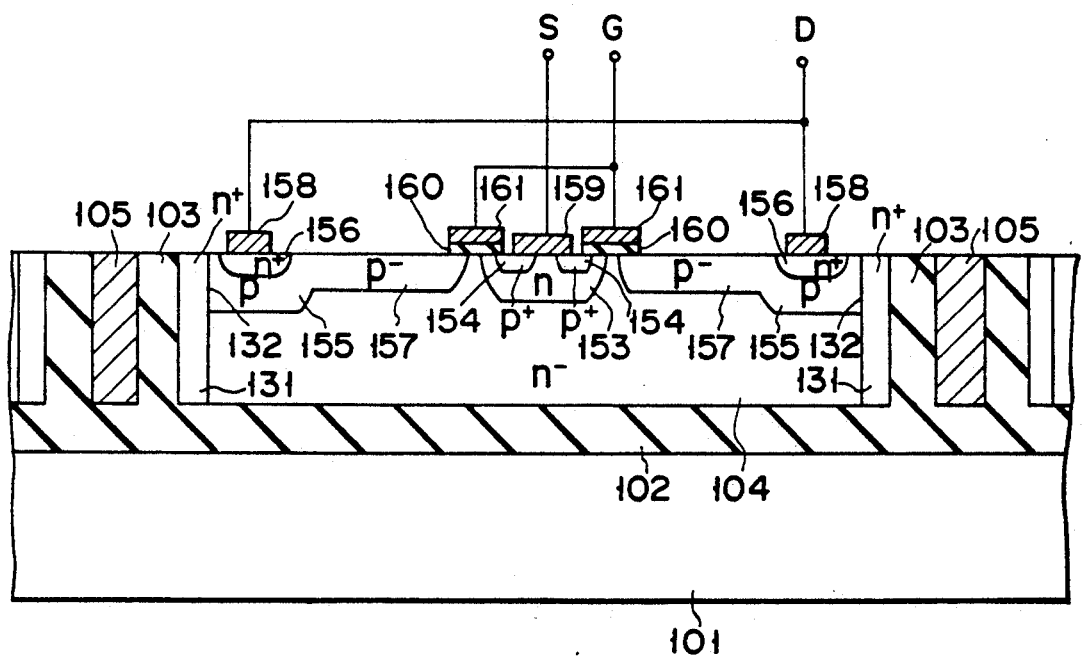
FIG. 58 is a sectional view showing a p-channel IGBT according to another embodiment of the present invention.

FIG. 58 shows an embodiment of a p-channel IGBT. Like the above embodiments, an n-type base region 153 is formed in a central surface portion of the dielectrically isolated high resistance silicon layer 104. A p+ source region 154 is formed within the n-type base region 153. A source electrode 159 is put in contact with both p+ source region 154 and the n-type base region 153. A p-type base region 155 is formed in a peripheral portion of the high resistance silicon layer 104. A n+ drain region 156 is formed in the surface of the p base region 155. The n+ drain region is connected to a drain electrode 158. A p− resurf region for reducing the concentration of electric field on the surface 157 is formed inside the p-type base region 155. A gate electrode 161 is formed over that surface portion existing between the p+ source region 154 and p− resurf region 157, with a gate insulating layer 160 interposed. Like the embodiment of FIG. 54, an n+ region 131 is formed on the peripheral side wall of the element region.

The IGBT of this embodiment is operated by applying a voltage, which is positive with respect to the drain electrode 158, to the source electrode 159. When the gate voltage is zero or positive (i.e. the OFF state), a depletion layer extends in the high-resistance silicon layer 104 and p− re-surf region 157. When the peripheral n+ region 131 is isolated from the n-type base region 153 by the depletion layer under the condition of a drain-source voltage not higher than the breakdown voltage of the pn junction of the region 131 and p-type base region 155, the breakdown of the pn junction is prevented. Accordingly, like the preceding embodiments, the high breakdown voltage characteristic can be obtained.

Figure 59:
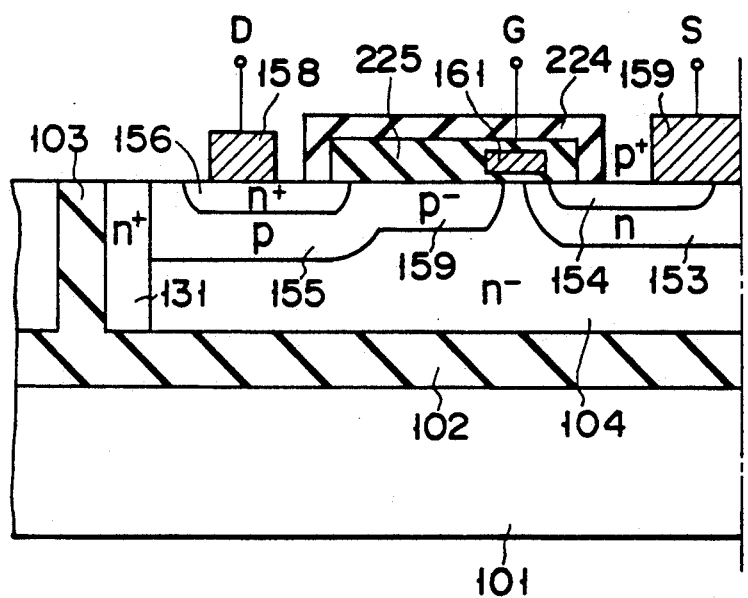
FIG. 59 is a sectional view showing a modified form of the diode shown in FIG. 58.

FIG. 59 shows an embodiment wherein a high resistance layer 224 such as SIPOS is provided in the p-channel IGBT of FIG. 58, thereby enhancing the high breakdown voltage characteristic. Like the embodiment of FIG. 56, an insulating layer 225 is formed on the surface of the high resistance silicon layer 104, and the high resistance layer 224 serving as a resistant field plate is formed on the insulating layer 225. One end of the high resistance layer 224 is connected to the surface of the p+ source region 154, and the other end thereof. is connected to the n+ drain region 156. Both ends of the high resistance layer 224 may be connected to the drain electrode 158 and source electrode 159, respectively.

FIG. 60 shows an embodiment wherein in the embodiment of FIG. 21 a high resistance layer 171 such as SIPOS is formed at an interface between the bottom portion of the high resistance silicon layer 104 and the oxide layer 102. A process of fabricating this high breakdown voltage diode will now be described. The high resistance layer 171, e.g. SIPOS, is deposited on a high resistance silicon substrate corresponding to the high resistance silicon layer 104. An oxide layer 102 is formed on the high resistance layer 171 by means of CVD, etc. The resultant structure is directly attached to a silicon (or polysilicon) substrate 101. The substrate 101 may not be attached, but it may be formed by depositing polysilicon to a certain thickness. Subsequently, the high resistance silicon substrate side is polished to a predetermined thickness, thereby obtaining the high resistance silicon layer 104. Then, a trench is made in the element isolation region so as to reach the high resistance layer 171. By oxidizing the trench, the oxide layer 103 is formed and the polysilicon 105 is buried in the trench. After flattening the surface of the resultant structure, the n+ region 106 and p+ region 107 are formed by diffusion. Thus, the fabrication of the high breakdown voltage diode is completed.

In this diode, the substrate 101 is grounded and the cathode 108 is set at a high potential. If the high resistance layer 171 is not provided, the n− substrate is depleted from the oxide layer (102) side. If the high resistance layer 171 is provided, the layer 171 shields the electric field of the substrate 101 and the influence of the potential of substrate 101 can be eliminated. Consequently, the breakdown voltage across the cathode 108 and anode 109 is increased. The reason is that if the electric field is applied to the high resistance layer 171 such as SIPOS, a charge is induced on the surface by a deep level of band gap and electric lines of force are stopped. Further, since a small current flows in the high resistance layer 171 and this current determines the potential gradient, the shielding against the external potential is enhanced. Accordingly, the thickness of the oxide film 102 may be reduced to 1 μm or less.

According to this embodiment, the influence of the potential of underlying substrate 101 on the high resistance silicon layer 104 is shielded in this way, and a high breakdown voltage characteristic can be effectively obtained.

Figure 61:
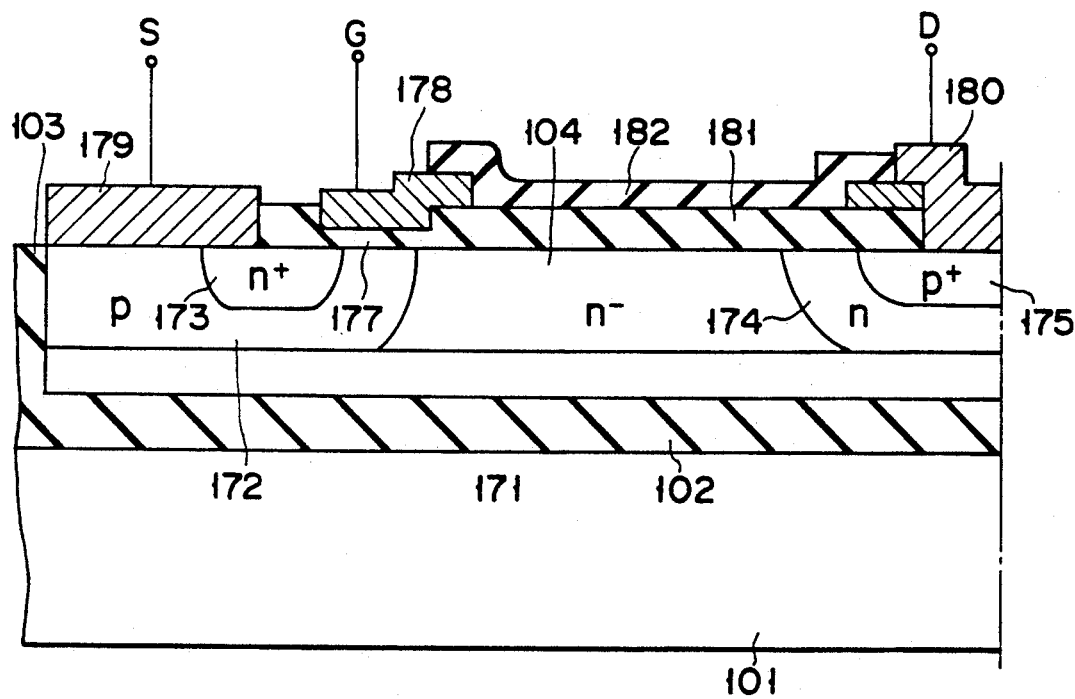
FIG. 61 is a sectional view showing a modified form of the diode shown in FIG. 60.

FIG. 61 shows an embodiment of an n-channel IGBT using the same structure as that shown in FIG. 60. Like the structure of FIG. 60, the high resistance layer 171 (e.g. SIPOS) is formed on the bottom of the high resistance silicon layer 104. The thickness of the high resistance silicon layer 104 is controlled to about 1 μm to 5 μm. An n-type base region 174 reaching the high resistance layer 171 is formed in the center portion of the element-isolated high resistance silicon layer 104, and the base region 174 adjoins the high resistance layer 171. A p+ drain region 175 is formed in the n-type base region 174. A drain electrode 180 is formed on the drain region 175. A p-type base region 172 reaching the high resistance layer 171 is formed in the peripheral portion of the high resistance silicon layer 104. The p-type base region 172 is electrically connected to the high resistance layer 171. An n+ source region 173 is formed in the p-type base region 172.

A source electrode 179 is formed in contact with both source region 173 and p-type base region 172. A gate electrode 178 is formed above that surface portion of the p-type base region 172, which is located between the n+ source region 173 and the high resistance silicon layer 104, with a gate insulating layer 177 interposed between the electrode 178 and this surface portion. An insulating layer 181, which is thicker than the gate insulating layer 177, is formed on that surface portion of the high resistance silicon layer 104 which is located between the n-type base region 174 and the p-type base region 172. A high resistance layer 182 which becomes a resistant field plate is formed on the insulating layer 181. One end of the high resistance layer 182 is connected to the gate electrode 178, and the other end thereof is connected to the drain electrode 180.

This IGBT is operated by applying a voltage, which is positive with respect to the source electrode 179, to the drain electrode 180. When the gate voltage is zero or negative, the device is in the OFF state. If the above-mentioned drain-source voltage is applied in the OFF state, the depletion layer extends in the high resistance silicon layer 104. At this time, the high breakdown voltage characteristic can be obtained by virtue of the voltage sharing and reduction in electric field by the thick oxide layer 102 (1 μm or more), the shielding effect against the substrate potential by the high resistance layer 171, and the field plate effect of the upper high resistance layer 182.

Since the high resistance layer 171 has the shielding effect, it is possible to reduce the thickness of the oxide layer 102 to less than 1 μm.

What is claimed is:

1. A high breakdown voltage semiconductor device comprising:
   a first semiconductor substrate;
   a first insulating layer formed on the first semiconductor substrate;
   a second semiconductor substrate bonded to the first semiconductor substrate with the first insulating layer therebetween;
   a first semiconductor region formed in the second semiconductor substrate and isolated at its side by a second insulating layer;
   a second semiconductor region of an n-type formed in a surface portion of the first semiconductor region and having a higher impurity concentration than that of the first semiconductor region; and
   a third semiconductor region of a p-type formed in the surface region of the first semiconductor region such that it is located between the second semiconductor region and the second insulating layer in a manner to be spaced apart from the second semiconductor region, the third semiconductor region having a higher impurity concentration than that of the first semiconductor region, wherein when a predetermined voltage is applied to the second semiconductor region, a region between the third semiconductor region and the first insulating layer is filled with a depletion region.

2. The high breakdown voltage semiconductor device according to claim 1, wherein a fourth semiconductor region of the same conductivity type as that of said first semiconductor region is formed at a side of the first semiconductor region in a manner to be located adjacent to said isolating region, and when a predetermined voltage is applied to the second semiconductor region, a region between the second semiconductor region and the first insulating layer is filled with a depletion region.

3. The high breakdown voltage semiconductor device according to claim 2, wherein when said region between the second semiconductor region and the first insulating layer is filed with a depletion region, an electric potential of said second semiconductor region is isolated from that of said fourth semiconductor region.

4. The high breakdown voltage semiconductor device according to claim 2, wherein said first semiconductor region has a first conductivity type.

5. The high breakdown voltage semiconductor device according to claim 1, wherein said second semiconductor region is surrounded with said third semiconductor region.

6. The high breakdown voltage semiconductor device according to claim 1, wherein said first semiconductor region is of an n type.

7. The high breakdown voltage semiconductor device according to claim 1, wherein a fourth semiconductor region is formed at a bottom of said first semiconductor region and has the same conductivity type as that of said first semiconductor region, and said fourth semiconductor region having an impurity concentration which is higher than that of said first semiconductor region.

8. A high breakdown voltage semiconductor device comprising:
   a first semiconductor substrate;
   first insulating layer formed on the first semiconductor substrate;
   a second semiconductor substrate bonded to the first semiconductor substrate with the first insulating layer therebetween;
   a first semiconductor region formed in the second semiconductor substrate and isolated at its side by a second insulating layer;
   a second semiconductor region of an n-type formed in a surface portion of the first semiconductor region and having a higher impurity concentration than that of the first semiconductor region;
   a third semiconductor region of a p-type formed in the surface region of the first semiconductor region such that it is located between the second semiconductor region and the second insulating layer in a manner to be spaced apart from the second semiconductor region, the third semiconductor region having a higher impurity concentration than that of the first semiconductor region; and a fourth semiconductor region of the same conductivity type as that of said first semiconductor region, said fourth semiconductor region being formed at a side of the first semiconductor region in a manner to be located adjacent to said second insulating layer, said first semiconductor region having a doping concentration such that upon application of a predetermined voltage to the second semiconductor region a region between the third semiconductor region and the first insulating layer is filled with a depletion region.

9. The high breakdown voltage semiconductor device according to claim 8, wherein said second semiconductor region is surrounded with said third semiconductor region.

10. The high breakdown voltage semiconductor device according to claim 8, wherein said first semiconductor region is of an n type.

11. The high breakdown voltage semiconductor device according to claim 8, wherein a fifth semiconductor region is formed at a bottom of said first semiconductor region and has the same conductivity type as that of said first semiconductor region, and said fifth semiconductor region having an impurity concentration which is higher than that of said first semiconductor region.

12. The high breakdown voltage semiconductor device according to claim 11, wherein said fourth semiconductor region has a lower portion which is continuous with said fifth semiconductor region.

13. The high breakdown voltage semiconductor device according to claim 8, wherein said fourth semiconductor region is connected via a high resistance layer to said second electrode.

14. The high breakdown voltage semiconductor device according to claim 8, wherein said first semiconductor region has a doping concentration such that upon application of a predetermined voltage to the second semiconductor region a depletion region is formed and reaches the first insulating layer.

15. The high breakdown voltage semiconductor device according to claim 14, wherein said first insulating layer is above 1 $\mu$m thick.

16. The high breakdown voltage semiconductor device according to claim 14, wherein a fifth semiconductor region is formed at a bottom of said first semiconductor region and has the same conductivity type as that of said first semiconductor region, said fifth semiconductor region having an impurity concentration which is higher than that of said first semiconductor region but lower than that of said second semiconductor region.

17. The high breakdown voltage semiconductor device according to claim 14, wherein said fourth semiconductor region has a lower portion which is continuous with said fifth semiconductor region.

18. The high breakdown voltage semiconductor device according to claim 14, wherein said fourth semiconductor region is connected via a high resistance layer to said second electrode.

19. The high breakdown voltage semiconductor device according to claim 14, further comprising an isolating region composed of said second insulating layer formed on an inner surface of a groove which is formed in said second semiconductor substrate, and a semiconductor layer filled in the groove, wherein a potential in said semi-conductor layer filled in the groove is set to a predetermined level.

20. The high breakdown voltage semiconductor device according to claim 19, wherein said semiconductor layer filled in the groove is grounded.

21. The high breakdown voltage semiconductor device according to claim 20, wherein said semiconductor layer filled in the groove is set at an intermediate level between a potential on said second semiconductor region and that on said third semiconductor region.

22. The high breakdown voltage semiconductor device according to claim 19, wherein said semiconductor layer in said isolating region is connected via a high resistance layer to said third semiconductor region.

23. A high breakdown voltage semiconductor device comprising:

a semiconductor substrate:

an insulating layer formed on the semiconductor substrate;

a first semiconductor region formed on the insulating layer and isolated at its side by an isolating region;

a second semiconductor region of a first conductivity type formed in a surface portion of the first semiconductor region and having a higher impurity concentration than that of the first semiconductor region;

a third semiconductor region of a second conductivity type formed in the surface region of the first semiconductor region such that it is located between the second semiconductor region and the isolating region in a manner to be spaced apart from the second semiconductor region and isolating region, the third semiconductor region having a higher impurity concentration than that of the first semiconductor region;

a fourth semiconductor region of the same conductivity type as that of said first semiconductor region, said fourth semiconductor region being formed at a side of the first semiconductor region in a manner to be located adjacent to said isolating region;

a fifth semiconductor region formed at a bottom of said first semiconductor region and having the same conductivity type as that of said first semiconductor region, said fifth semiconductor region having an impurity concentration which is higher than that of said first semiconductor region; and a sixth semiconductor region formed at a side of the first semiconductor region in a manner to be located adjacent to said isolating region, said sixth semiconductor region having a lower portion which is continuous with said fifth semiconductor region.

24. A high breakdown voltage semiconductor device comprising:

a semiconductor substrate;

an insulating layer formed on the semiconductor substrate;

a first semiconductor region formed on the insulating layer and isolated at its side by an isolating region;

a second semiconductor region of a first conductivity type formed in a surface portion of the first semiconductor region and having a higher impurity concentration than that of the first semiconductor region;

a third semiconductor region of a second conductivity type formed in the surface region of the first semiconductor region such that it is located between the second semiconductor region and the isolating region in a manner to be spaced apart from the second semiconductor region and the isolating region, the third semiconductor region having a higher impurity concentration than that of the first semiconductor region;

a fourth semiconductor region of the same conductivity type as that of said first semiconductor region, said fourth semiconductor region being formed at a side of the first semiconductor region in a manner to be located adjacent to said isolating region; and a fifth semiconductor region of a first conductivity type formed at a side of the first semiconductor region in a manner to be located adjacent to said isolating region.

25. The high breakdown voltage semiconductor device according to claim 24, wherein a sixth semiconductor region of a second conductivity type is formed in a surface portion of the second semiconductor region and a seventh semiconductor region of a second conductivity type is formed in a surface portion of the fifth semiconductor region.

26. An insulating gate bipolar transistor comprising:
a first semiconductor substrate;
a first insulating layer formed on the first semiconductor substrate;
a second semiconductor substrate bonded to the first semiconductor substrate with the first insulating layer therebetween;
a first semiconductor region formed in the second semiconductor substrate and isolated at its side by a second insulating layer;
a second semiconductor region of an n-type serving as a drain region, formed in a surface portion of the first semiconductor region and having a higher impurity concentration than that of the first semiconductor region;
a third semiconductor region of a p-type formed in the surface region of the first semiconductor region such that it is located between the second semiconductor region and the second insulating layer in a manner to be spaced apart from the second semiconductor region; and,
a fourth semiconductor region of an n-type serving as a source region, formed in the surface region of the third semiconductor region, and having a higher impurity concentration than that of the first semiconductor region, wherein when a predetermined voltage is applied to the third semiconductor region, a region between the third semiconductor region and the first insulating layer is filled with a depletion region.

27. The high breakdown voltage semiconductor device according to claim 26, wherein said first semiconductor region is of an n type.

28. The insulating gate transistor according to claim 26, wherein a fifth semiconductor region of a p type is formed in the surface region of the second semiconductor region.

29. An insulated gate transistor comprising:
a semiconductor substrate;
a first semiconductor region formed in the semiconductor substrate and isolated at its side by an insulating layer;
a second semiconductor region of an n-type serving as a drain region, formed in a surface portion of the first semiconductor region and having a higher impurity concentration than that of the first semiconductor region;

a third semiconductor region of a p-type formed in the surface region of the first semiconductor region such that it is located between the second semiconductor region and the insulating layer in a manner to be spaced apart from the second semiconductor region; and a fourth semiconductor region of an n-type serving as a source region, formed in the surface region of the third semiconductor region, and having a higher impurity concentration than that of the first semiconductor region, wherein when a predetermined voltage is applied to the third semiconductor region, a region between the third semiconductor region and the first insulating layer is filled with a depletion region.

30. An insulated gate bipolar transistor comprising:
a semiconductor substrate;
a first semiconductor region formed in the semiconductor substrate and isolated at its side by an insulating layer;
a second semiconductor region of an n-type serving as a drain region, formed in a surface portion of the first semiconductor region and having a higher impurity concentration than that of the first semiconductor region;
a third semiconductor region of a p-type formed in the surface region of the first semiconductor region such that it is located between the second semiconductor region and the insulating layer in a manner to be spaced apart from the second semiconductor region;
a fourth semiconductor region of an n-type serving as a source region, formed in the surface region of the third semiconductor region, and having a higher impurity concentration than that of the first semiconductor region; and
a firth semiconductor region of a p-type formed in the surface region of the second semiconductor region.

31. An insulated gate bipolar transistor according to claim 30, wherein a sixth semiconductor region of the same conductivity type as that of said first semiconductor region is formed at a side of the first semiconductor region in a manner to be located adjacent to said insulating layer.

32. An insulated gate bipolar transistor according to claim 30, wherein a seventh semiconductor region is formed at a bottom of said first semiconductor region and has the same conductivity type as that of said first semiconductor region, and said seventh semiconductor region having an impurity concentration which is higher than that of said first semiconductor region.

33. A high breakdown voltage semiconductor device comprising:
a first semiconductor substrate;
a first insulating layer formed on the first semiconductor substrate;
a second semiconductor substrate bonded to the first semiconductor substrate with the first insulating layer therebetween;
a first semiconductor region formed in the second semiconductor substrate and isolated at its side by a second insulating layer;
a second semiconductor region of an n-type formed in a surface portion of the first semiconductor region and having a higher impurity concentration than that of the first semiconductor region; and a third semiconductor region of a p-type formed in the surface region of the first semiconductor region such that it is located between the second semiconductor region and the second insulating layer in a manner to be spaced apart form the second semiconductor region, the third semiconductor region having a higher impurity concentration than that of the first semiconductor region, wherein when a predetermined voltage is applied to the second semiconductor region, a region between the third semiconductor region and the first insulating layer is filled with a depletion region, whereby an electric potential of said second semiconductor region is isolated from that of said second insulating layer.

34. An insulated gate bipolar transistor comprising:
a first semiconductor substrate;
a first insulating layer formed on the first semiconductor substrate;
a second semiconductor substrate bonded to the first semiconductor substrate with the first insulating layer therebetween;
a first semiconductor region formed in the second semiconductor substrate and isolated at its side by a second insulating layer;
a second semiconductor region of an n-type serving as a drain region, formed in a surface portion of the first semiconductor region and having a higher impurity concentration than that of the first semiconductor region;
a third semiconductor region of a p-type formed in the surface region of the first semiconductor region such that it is located between the second semiconductor region and the second insulating layer in a manner to be spaced apart from the second semiconductor region;
a fourth semiconductor region of an n-type serving as a source region, formed in the surface region of the third semiconductor region, and having a higher impurity concentration than that of the first semiconductor region, wherein when a predetermined voltage is applied to the third semiconductor region, a region between the third semiconductor region and the first insulating layer is filled with a depletion region, whereby an electric potential of said second semiconductor region is isolated from that of the second insulating layer; and a fifth semiconductor region of a p-type formed in the surface region of the second semiconductor region.

35. A high breakdown voltage semiconductor device comprising:
a semiconductor substrate;
a first insulating layer formed on the semiconductor substrate;
a semiconductor layer formed on the first insulating layer and isolated at its side by a second insulating layer;
a first semiconductor region of an n-type formed in a surface portion of the semiconductor layer and having a higher impurity concentration than that of the semiconductor layer; and
a second semiconductor region of a p-type formed in the surface region of the semiconductor layer such that is located between the first semiconductor region and the second insulating layer in a manner to be spaced apart form the first semiconductor region, the second semiconductor region having a higher impurity concentration than that of the first semiconductor layer, wherein when a predetermined voltage is applied to the first semiconductor region, a region between the second semiconductor region and the first insulating layer is filled with a depletion region.

* * * * *

UNITED STATES PATENT AND TRADEMARK OFFICE
CERTIFICATE OF CORRECTION

PATENT NO.   : 5,294,825
DATED        : March 15, 1994
INVENTOR(S)  : Akio NAKAGAWA, ET AL It is certified that error appears in the above-indentified patent and that said Letters Patent is hereby corrected as shown below:

Title page, at [*] Notice, change "Dec. 10, 1991" to --Dec. 10, 2008--.

Signed and Sealed this

Sixth Day of September, 1994

Attest:

BRUCE LEHMAN

Attesting Officer

Commissioner of Patents and Trademarks